US007244964B2

(12) United States Patent
Hata

(10) Patent No.: US 7,244,964 B2
(45) Date of Patent: *Jul. 17, 2007

(54) LIGHT EMITTING DEVICE

(75) Inventor: Masayuki Hata, Kadoma (JP)

(73) Assignee: Sanyo Electric Company, Ltd, Moriguchi-shi (JP)

( * ) Notice: Subject to any disclaimer, the term of this patent is extended or adjusted under 35 U.S.C. 154(b) by 156 days.

This patent is subject to a terminal disclaimer.

(21) Appl. No.: 10/923,830

(22) Filed: Aug. 24, 2004

(65) Prior Publication Data

US 2005/0230690 A1 Oct. 20, 2005

Related U.S. Application Data

(62) Division of application No. 09/745,998, filed on Dec. 26, 2000, now Pat. No. 6,803,596.

(30) Foreign Application Priority Data

Dec. 27, 1999 (JP) ................... 11-371745

(51) Int. Cl.
*H01L 27/15* (2006.01)
(52) U.S. Cl. ............................ 257/87; 257/86; 257/94; 257/101; 257/103
(58) Field of Classification Search ................ None
See application file for complete search history.

(56) References Cited

U.S. PATENT DOCUMENTS 6,110,756 A    8/2000  Otsuka et al. ............... 438/41

6,285,697 B1   9/2001  Landwehr et al. ............ 372/45
6,411,637 B1   6/2002  Hashimoto .................... 372/45
6,803,596 B2 * 10/2004  Hata ............................ 257/13

FOREIGN PATENT DOCUMENTS

| JP | 6-268257    | 9/1994  |
|----|-------------|---------|
| JP | 10-200214   | 7/1998  |
| JP | 11-251687   | 9/1999  |
| JP | 11-340559   | 12/1999 |
| JP | 2000-332364 | 11/2000 |

OTHER PUBLICATIONS

Piezoelectricity—"An Introduction to the Theory and Application of Electromechanical Phenomena in Crystals" by Walter Guyton Cady, Ph.D., Sc.D.; Professor of Physics Emeritus, Wesleyan University; Dover Publications, Inc. New York 1964.
Landolt-Bornstein—"Numerical Data and Functional Relationships in Science and Technology" by K. - H. Hellwege, (Subvolume a) pp. 174, 241, 270, 302 and 322. vol. 17 Semiconductors; Physics of Group IV Elements and III-V Compounds; Springer-Verlag Berlin—Heidelberg—New York 1982.

(Continued)

*Primary Examiner*—Wai-Sing Louie
(74) *Attorney, Agent, or Firm*—Armstrong, Kratz, Quintos, Hanson & Brooks, LLP

(57) ABSTRACT

An n-type layer of the opposite conduction type composed of n-GaN is formed between a light emitting layer and a p-type cladding layer composed of p-AlGaN. The bandgap of the n-type layer of the opposite conduction type is larger than the bandgap of the light emitting layer and is smaller than the bandgap of the p-type cladding layer.

10 Claims, 32 Drawing Sheets

OTHER PUBLICATIONS

Landolt-Bornstein—"Numerical Data and Functional Relationships in Science and Technology" by K.-H. Hellwege, (Subvolume b) pp. 49, 102, 103, 145 ,160, 186, 215, 228, 268, 272 and 301. vol. 17 Semiconductors; Physics of Group III: Crystals and Solid State Physics and Physics of II-VI and I-VII Compounds; Semimagnetic Semiconductors; Springer-Verlag Berlin—Heidelberg—New York 1982.

Andenet Alemu et al., "Optical properties of wurtzite GaN epilayers grown on A-plane sapphire", Physical Review B, vol. 57, No. 7, dated Feb. 15, 1998, pp. 3761-3764.

* cited by examiner

[0001] ←                    → [0001]

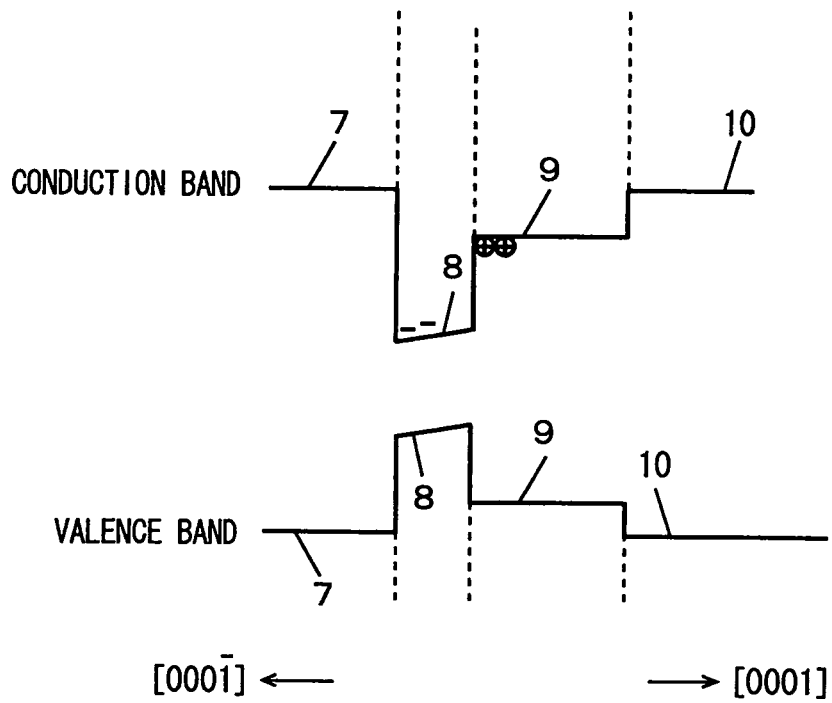
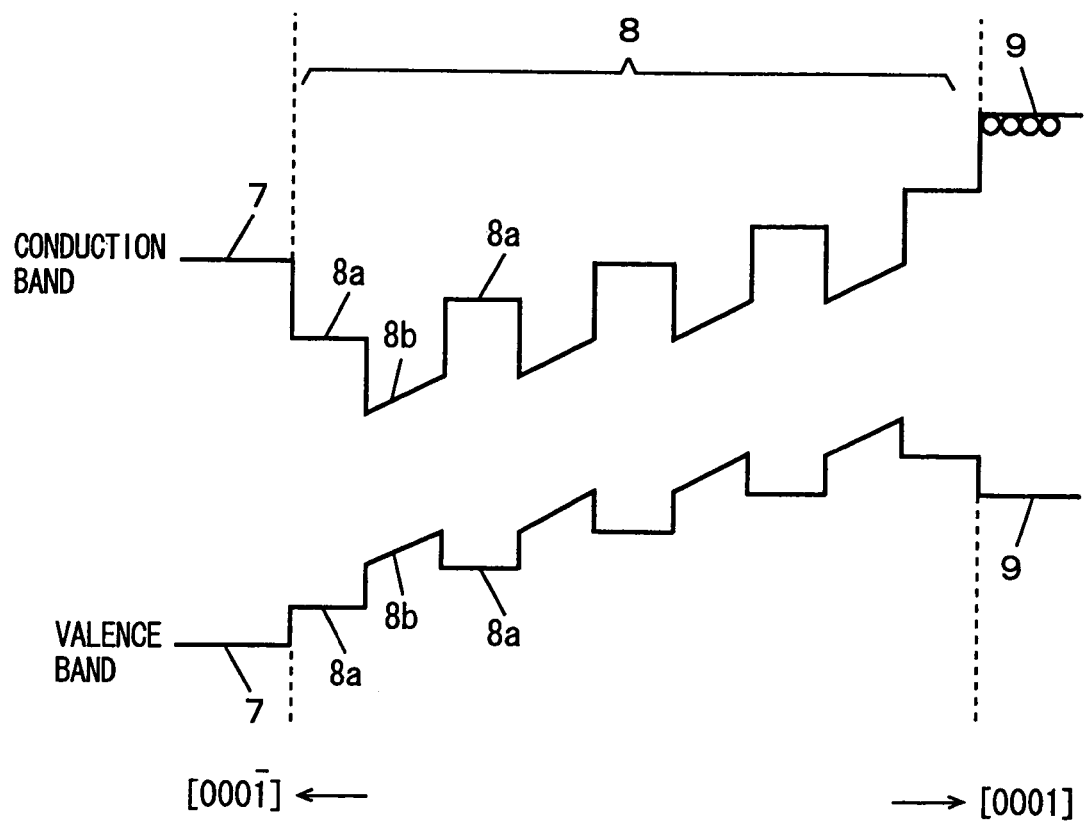

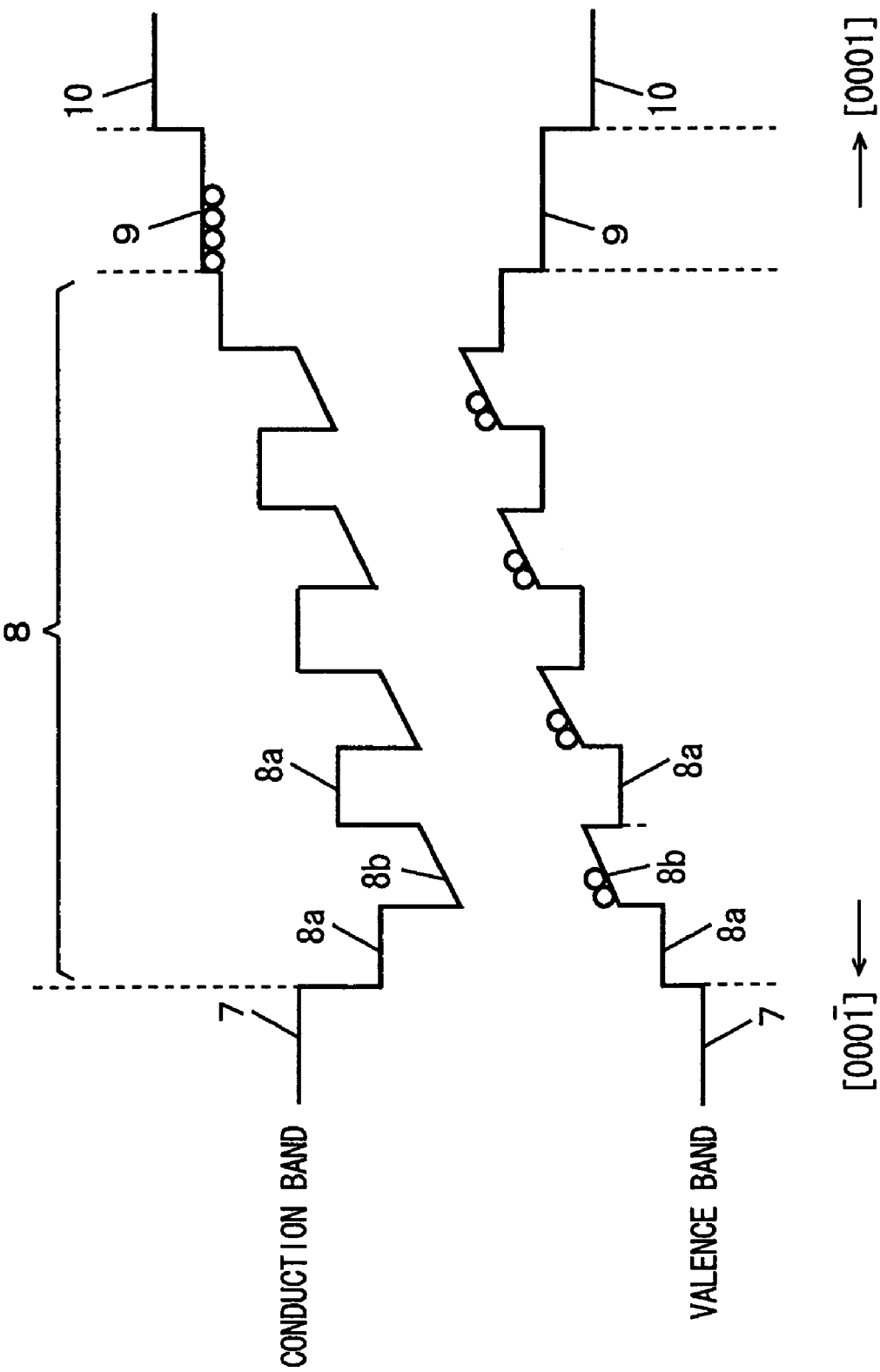

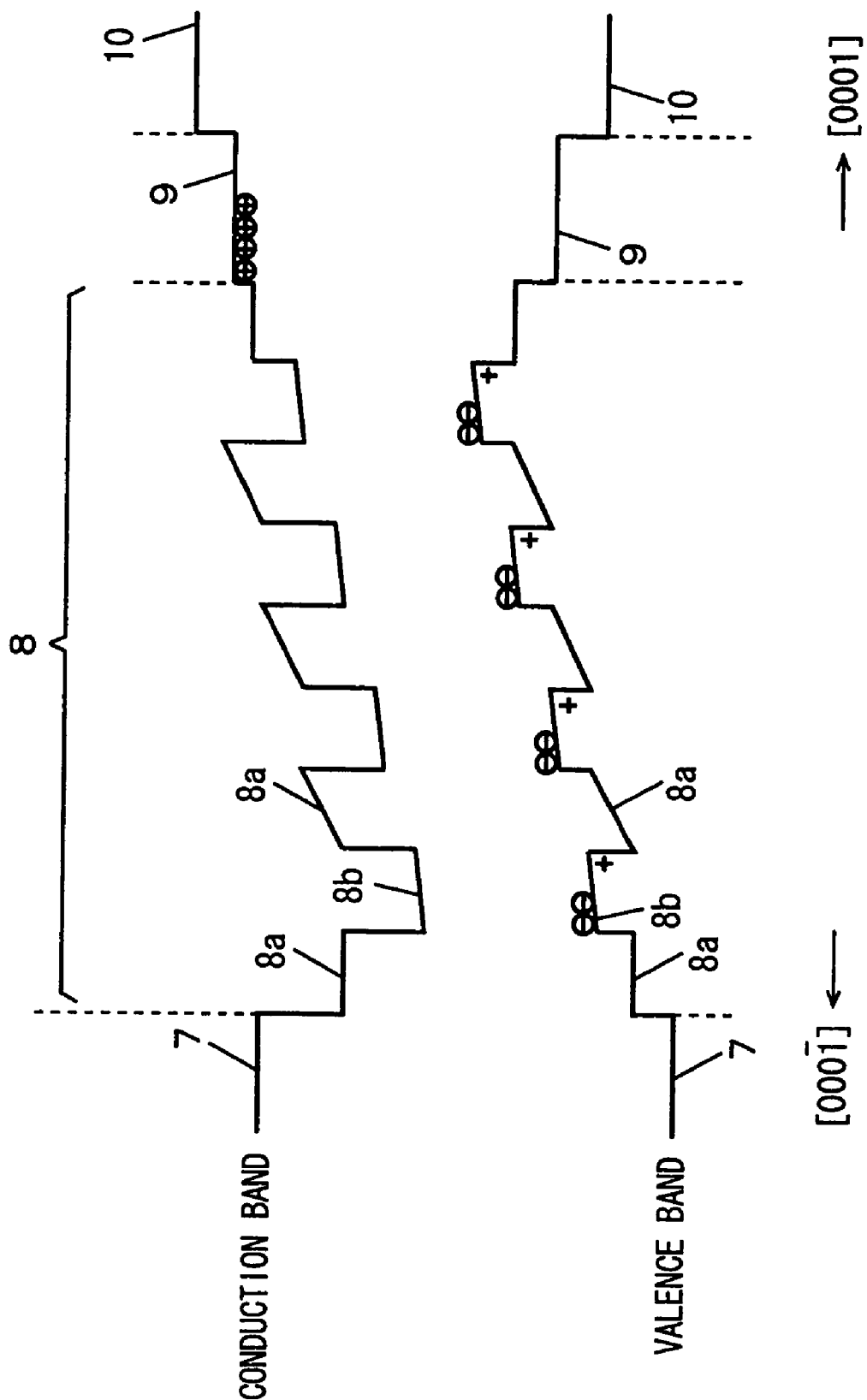

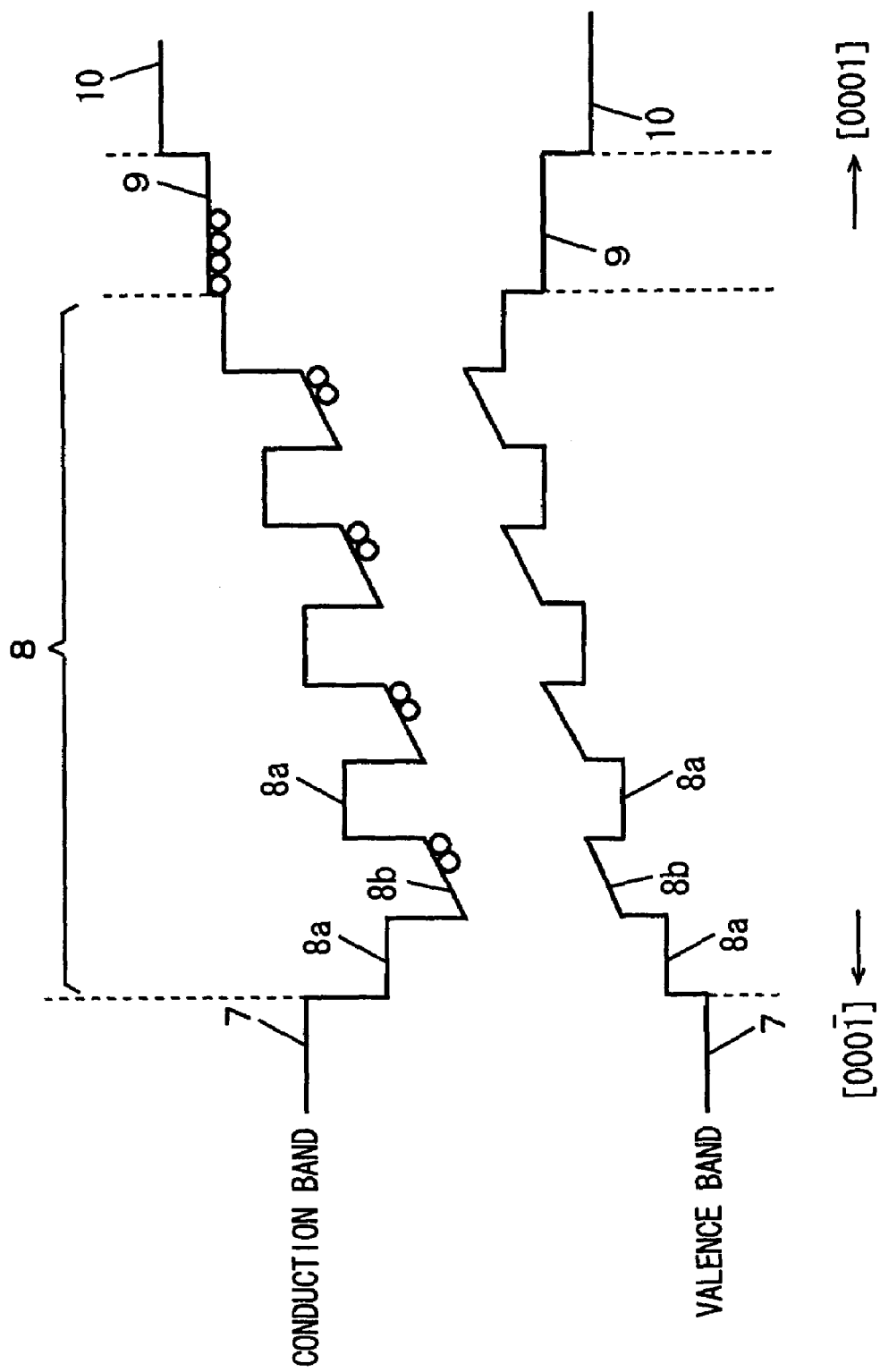

FIG. 38
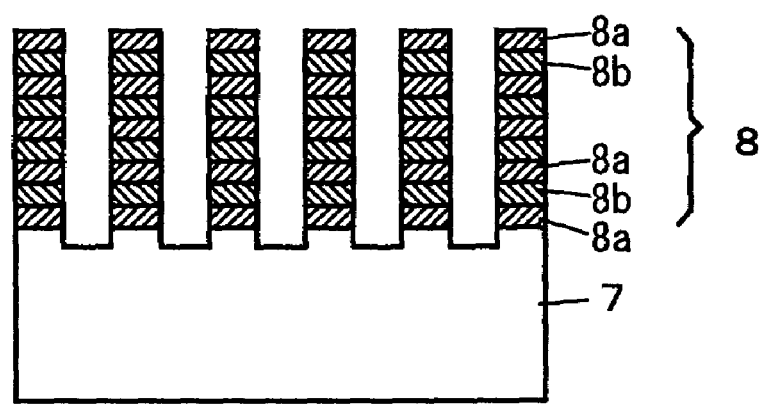
(a)
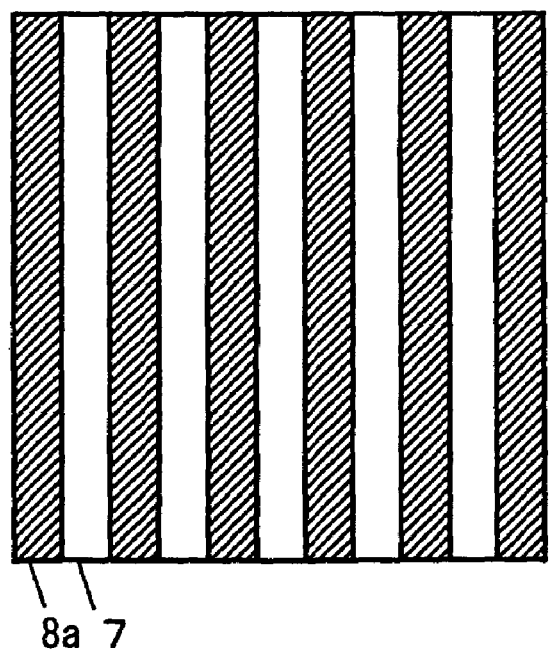
(b)

LIGHT EMITTING DEVICE

This application is a divisional of U.S. Ser. No. 09/745,998, filed on Dec. 26, 2000, now U.S. Pat. No. 6,803,596 which is hereby incorporated by reference.

BACKGROUND OF THE INVENTION

1. Field of the Invention

The present invention relates to a light emitting device formed of a material having a piezoelectric effect.

2. Description of the Background Art

Semiconductor light emitting devices such as semiconductor laser devices and light emitting diodes using III group nitride semiconductors such as GaN, GaInN, AlGaN, and AlGaInN (hereinafter referred to as nitride based semiconductors) have been expected to be applied as light emitting devices for emitting light in a visible-ultraviolet region.

Out of the applications, extensive development has been proceeding toward practical applications of the semiconductor light emitting devices having a GaInN quantum well layer as a light emitting layer. Such semiconductor light emitting devices have been fabricated on a (0001) surface of a substrate composed of sapphire or silicon carbide (SiC) by MOVPE (Metal Organic Vapor Phase Epitaxy) or MBE (Molecular Beam Epitaxy).

FIG. 42 is a schematic sectional view showing the structure of a conventional GaN based semiconductor light emitting device. The semiconductor light emitting device shown in FIG. 42 is disclosed in JP-A-6-268257.

In FIG. 42, a buffer layer 62 composed of GaN, an n-type contact layer 63 composed of n-GaN, a light emitting layer 64 having a multiple quantum well (MQW) structure, and a p-type cap layer 65 composed of p-GaN are formed in this order on a sapphire substrate 61. The light emitting layer 64 is constructed by alternately stacking a plurality of barrier layers 64a composed of GaInN and a plurality of quantum well layers 64b which differ in composition.

In a method of fabricating such a conventional semiconductor light emitting device, generally used as the sapphire substrate 61 is one having an approximate (0001) surface as its principal plane, to successively form the respective layers from the buffer layer 62 to the p-type cap layer 65 on the sapphire substrate 61. In this case, the respective layers from the n-type contact layer 63 to the p-type cap layer 65 are grown as crystals in a [0001] direction of a nitride based semiconductor.

In a crystal, having no center of symmetry, having a zinc-blende structure, a wurtzite structure, or the like, however, a piezoelectric effect may be generally generated by a strain. In the zinc-blende structure, for example, a piezoelectric effect is the greatest in a strain compressing or extending with respect to a [111] axis. In the wurtzite structure, the piezoelectric effect is the greatest in a strain compressing or extending with respect to a [0001] axis.

In the conventional semiconductor light emitting device, the light emitting layer 64 composed of GaInN has a quantum well structure having a (0001) plane as its principal plane. The lattice constant of a quantum well layer 64b composed of GaInN is larger than the lattice constant of the n-type contact layer 63 composed of n-GaN. Accordingly, a compressive strain is exerted on the quantum well layer 64b in an in-plane direction (a direction parallel to an interface) of a quantum well, and a tensile strain is exerted in a direction of confinement in the quantum well (a direction perpendicular to the interface). As a result, the piezoelectric effect generates a potential gradient in the quantum well layer 64b, so that a potential is low in the [0001] direction, while being high in a [000$\bar{1}$] direction. An energy band in the light emitting layer 64 having a quantum well structure in this case is illustrated in FIG. 43. FIG. 43 illustrates five barrier layers 64a and four quantum well layers 64b.

As shown in FIG. 43, the potential gradient exists in the quantum well layer 64b in the light emitting layer 64. Accordingly, electrons and holes which are injected as current are spatially separated from each other, as shown in FIG. 44. As a result, in the semiconductor light emitting device, luminous efficiency is reduced. Particularly in the semiconductor laser device, threshold current is raised.

When impurities are added to the quantum well layer 64b in the light emitting layer 64, the effect of decreasing the potential gradient by the movement of carriers is produced. When both p-type impurities and n-type impurities are added to the quantum well layer 64b, however, the carriers are compensated for, so that the carrier concentration is lowered. Consequently, the effect of decreasing the potential gradient by the movement of the carriers is reduced. Particularly when the respective concentrations of the p-type impurities and the n-type impurities which are added to the quantum well layer 64b are approximately equal to each other, the effect of decreasing the potential gradient by the movement of the carriers is further lowered.

Such a phenomenon also occurs in a III–V group compound semiconductor (for example, a GaInP based semiconductor, a GaAs based semiconductor, or an InP based semiconductor) other than the zinc-blende structure and the wurtzite structure, a II–VI group semiconductor, and an I–VII group semiconductor. Particularly in the nitride based semiconductor, the piezoelectric effect is great. Accordingly, the potential gradient generated by the piezoelectric effect is increased, so that the drop in luminous efficiency and the rises in threshold current and operating current become significant.

SUMMARY OF THE INVENTION

An object of the present invention is to provide a light emitting device which is high in luminous efficiency and is low in operating current or threshold current.

A light emitting device according to an aspect of the present invention comprises a first n-type layer; a first p-type layer; a light emitting layer arranged so as to be interposed between the first n-type layer and the first p-type layer and having a strain generating a piezoelectric effect; and a second n-type layer provided between at least the light emitting layer and the first p-type layer and having a wider bandgap than that of the light emitting layer, the potential in the light emitting layer whose gradient is generated by the piezoelectric effect being higher on the side of the first n-type layer than that on the side of the first p-type layer.

In the light emitting device, the second n-type layer is formed between the light emitting layer and the first p-type layer, so that electrons are moved in a direction perpendicular to an interface of the light emitting layer, the electrons and ionized donor levels are spatially separated from each other, and the potential gradient generated by the piezoelectric effect in the direction perpendicular to the interface is decreased. Consequently, the electrons and holes which are injected as current are prevented from being separated from each other. Accordingly, gain is easily obtained, thereby preventing luminous efficiency from being reduced and preventing operating current or threshold current from being raised.

The first p-type layer may comprise a first cladding layer, and the bandgap of the second n-type layer may be narrower than that of the first cladding layer. In this case, the refractive index of the second n-type layer is larger than that of the first cladding layer, so that the second n-type layer functions as an optical guide layer.

A light emitting device according to another aspect of the present invention comprises a first n-type layer; a first p-type layer; a light emitting layer arranged so as to be interposed between the first n-type layer and the first p-type layer and having a strain generating a piezoelectric effect; and a second p-type layer provided between at least the light emitting layer and the first n-type layer and having a wider bandgap than that of the light emitting layer, the potential in the light emitting layer whose gradient is generated by the piezoelectric effect being higher on the side of the first n-type layer than that on the side of the first p-type layer.

In the light emitting device, the second p-type layer is formed between the light emitting layer and the first n-type layer, so that holes are moved in the direction perpendicular to the interface of the light emitting layer, the hole and ionized acceptor levels are spatially separated from each other, and the potential gradient generated by the piezoelectric effect in the direction perpendicular to the interface is decreased. Consequently, the electrons and the holes which are injected as current are prevented from being separated from each other. Accordingly, gain is easily obtained, thereby preventing luminous efficiency from being lowered and preventing operating current or threshold current from being raised.

The first n-type layer may comprise a second cladding layer, and the bandgap of the second p-type layer may be narrower than that of the second cladding layer. In this case, the refractive index of the second p-type layer is larger than that of the second cladding layer, so that the second p-type layer functions as an optical guide layer.

A material composing the light emitting layer may have a wurtzite structure. In a crystal having the wurtzite structure, the piezoelectric effect exists by the strain. Consequently, the second n-type layer is provided between the light emitting layer and the first p-type layer, or the second p-type layer is provided between the light emitting layer and the first n-type layer, so that the potential gradient in the light emitting layer generated by the piezoelectric effect is decreased.

A principal plane of the light emitting layer may be approximately perpendicular to a <0001> direction. In the crystal having the wurtzite structure, the piezoelectric effect produced by the strain compressing or extending with respect to a <0001> axis is the greatest. Accordingly, the effect of decreasing the potential gradient by forming the second n-type layer or the second p-type layer is significantly produced.

A material composing the light emitting layer may have a zinc-blende structure. In a crystal having the zinc-blende structure, the piezoelectric effect exists by the strain. Consequently, the second n-type layer is provided between the light emitting layer and the first p-type layer, or the second p-type layer is provided between the light emitting layer and the first n-type layer, so that the potential gradient in the light emitting layer generated by the piezoelectric effect is decreased.

A principal plane of the light emitting layer may be approximately perpendicular to a <111> direction. In the crystal having the zinc-blende structure, the piezoelectric effect by the strain compressing or extending with respect to a <111> axis is the greatest. Accordingly, the effect of decreasing the potential gradient by forming the second n-type layer or the second p-type layer is significantly produced.

The strain generating a piezoelectric effect may include a strain for compressing the light emitting layer in an in-plane direction of the light emitting layer. In this case, the piezoelectric effect exists by the strain for compressing the light emitting layer in the in-plane direction of the light emitting layer. Consequently, the second n-type layer is formed between the light emitting layer and the first p-type layer or the second p-type layer is formed between the light emitting layer and the first n-type layer, so that the potential gradient generated by the piezoelectric effect is decreased.

The strain generating a piezoelectric effect may include a strain for extending the light emitting layer in an in-plane direction of the light emitting layer. In this case, the piezoelectric effect exists by the strain for extending the light emitting layer in the in-plane direction of the light emitting layer. Consequently, the second n-type layer is formed between the light emitting layer and the first p-type layer or the second p-type layer is formed between the light emitting layer and the first n-type layer, so that the potential gradient generated by the piezoelectric effect is decreased.

A material composing the light emitting layer may be a III–V group compound semiconductor. The III–V group compound semiconductor may be a nitride based semiconductor including at least one of boron, gallium, aluminum, and indium. Particularly in the nitride based semiconductor, the piezoelectric effect is great, so that the potential gradient generated by the piezoelectric effect is increased. Consequently, the effect of decreasing the potential gradient by forming the second n-type layer between the light emitting layer and the first p-type layer or forming the second p-type layer between the light emitting layer and the first n-type layer is significantly produced.

A material composing the light emitting layer may be a II–VI group compound semiconductor or a I–VII group compound semiconductor. Also in this case, the potential gradient generated by the piezoelectric effect can be decreased by forming the second n-type layer between the light emitting layer and the first p-type layer or forming the second p-type layer between the light emitting layer and the first n-type layer.

In the light emitting device, the light emitting layer may have a quantum well structure comprising one or more well layers having a strain generating a piezoelectric effect and two or more barrier layers arranged so as to interpose the well layer therebetween, and the potential in the well layer whose gradient is generated by the piezoelectric effect may be higher on the side of the first n-type layer than that on the side of the first p-type layer. In this case, the potential gradient generated by the piezoelectric effect in the direction of confinement in the quantum well structure is decreased by forming the second n-type layer between the light emitting layer and the first p-type layer or forming the second p-type layer between the light emitting layer and the first n-type layer.

Acceptor levels and/or donor levels may be nonuniformly formed in the light emitting layer having the quantum well structure in order to decrease the potential gradient generated by the piezoelectric effect in the direction of confinement in the quantum well structure.

In this case, acceptor levels and/or donor levels are nonuniformly formed in the light emitting layer having the quantum well structure, so that the potential gradient generated by the piezoelectric effect in the direction of confinement in the quantum well structure is further decreased.

Consequently, the electrons and the holes which are injected as current are further prevented from being separated from each other. Accordingly, gain is easily obtained, thereby preventing luminous efficiency from being reduced and preventing operating current or threshold current from being further raised.

The light emitting layer may have a MQW structure comprising two or more well layers and three or more barrier layers with the well layer interposed therebetween. Further, the light emitting layer may have a single quantum well (SQW) structure comprising one well layer and two barrier layers with the well layer interposed therebetween.

In the well layer, more acceptor levels may be formed in its portion on the side of a higher potential generated by the piezoelectric effect than those in its portion on the side of a lower potential.

In this case, the holes are moved in the direction of confinement in the quantum well structure, and the holes and the ionized acceptor levels are spatially separated from each other. Consequently, the potential gradient in the well layer generated by the piezoelectric effect is decreased.

In the well layer, more donor levels may be formed in its portion on the side of a lower potential generated as a result of the piezoelectric effect than those in its portion on the side of a higher potential.

In this case, the electrons are moved in the direction of confinement in the quantum well structure, and the electron and the ionized donor levels are spatially separated from each other. Consequently, the potential gradient in the well layer generated by the piezoelectric effect is further decreased.

In the barrier layer, more acceptor levels may be formed in its portion in contact with an interface of the well layer on the side of a higher potential generated as a result of the piezoelectric effect than those in its portion in contact with an interface of the well layer on the side of a lower potential.

In this case, the holes are moved in the direction of confinement in the quantum well structure, so that the holes and the ionized acceptor levels are spatially separated from each other. Consequently, the potential gradient in the well layer generated by the piezoelectric effect is further decreased.

In the barrier layer, more donor levels may be formed in its portion in contact with an interface of the well layer on the side of a lower potential generated as a result of the piezoelectric effect than those in its portion in contact with an interface of the well layer on the side of a higher potential.

In this case, the electrons are moved in the direction of confinement in the quantum well structure, so that the electrons and the ionized donor levels are spatially separated from each other. Consequently, the potential gradient in the well layer generated by the piezoelectric effect is further decreased.

Both the acceptor levels and the donor levels may be formed in the light emitting layer having the quantum well structure. In this case, the electrons and the holes are compensated for, so that few carriers are generated by forming the acceptor levels and the donor levels. However, the potential gradient generated by the piezoelectric effect is decreased by the ionized acceptor levels and the ionized donor levels.

The concentration of the acceptor levels and the concentration of the donor levels may be approximately equal to each other. In this case, the carriers are easily compensated for. However, the effect of decreasing the potential gradient is high.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram showing an energy band in the light emitting layer in the semiconductor laser device in the first example;

FIG. 4 is a diagram showing an energy band in an MQW light emitting layer in each of the semiconductor laser devices in the second to eighth examples;

FIG. 5 is a diagram showing an energy band in the MQW light emitting layer in the semiconductor laser device in the second example;

FIG. 6 is a diagram showing an energy band in the MQW light emitting layer in the semiconductor laser device in the second example;

FIG. 7 is a diagram showing an energy band in the MQW light emitting layer in the semiconductor laser device in the third example;

FIG. 38 is an enlarged sectional view and a schematic plan view of an MQW light emitting layer having a quantum wire structure in the semiconductor laser device in the fourteenth example;

DESCRIPTION OF THE PREFERRED EMBODIMENTS

(A) First Embodiment

Figure 1:
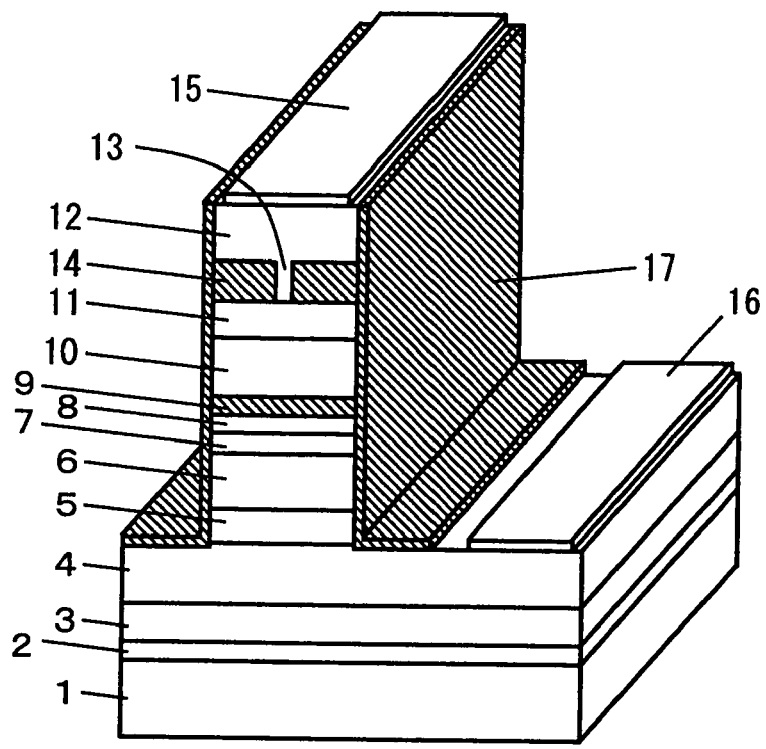
FIG. 1 is a schematic perspective view showing the structure of each of semiconductor laser devices in first to eighth examples of the present invention.

A light emitting device according to a first embodiment has a light emitting layer having a wurtzite structure having a (0001) plane as its principal plane. The light emitting layer has a strain in a direction perpendicular to its plane (a direction perpendicular to its interface). A potential gradient is generated by a piezoelectric effect in the light emitting layer.

The light emitting layer having the strain may have a single layer structure. Alternatively, it may have an SQW structure with one quantum well layer interposed between two barrier layers, or may have an MQW structure obtained by alternately stacking two or more well layers and three or more barrier layers. In the light emitting layer having the quantum well structure such as the SQW structure or the MQW structure, the well layer has a strain, and a potential gradient is generated in the well layer by the piezoelectric effect.

The light emitting layer is arranged so as to be interposed between a p-type layer and an n-type layer. A p-electrode is formed in the p-type layer, and holes are injected into the p-type layer from the p-electrode. An n-electrode is formed in the n-type layer, and electrons are injected into the n-type layer from the n-electrode.

In a III–V group compound semiconductor, when a light emitting layer has a compressive strain in its in-plane direction (a direction parallel to its interface) and has a strain extending in a direction perpendicular to the interface of the light emitting layer, a potential is high on the side of a [000$\bar{1}$] direction, while being low on the side of a [0001] direction in a potential gradient in the light emitting layer generated by a piezoelectric effect. In a light emitting device having such strains in its light emitting layer, and having a p-type layer on the side of the [0001] direction and an n-type layer on the side of the [000$\bar{1}$] direction, a potential in the light emitting layer is higher on the side of the n-type layer than that on the side of the p-type layer. When the light emitting layer has the quantum well structure, the potential in the quantum well layer is higher on the side of the n-type layer than that on the side of the p-type layer. In order to decrease the potential gradient generated by the piezoelectric effect, an n-type layer of the opposite conduction type having a wider bandgap than that of the light emitting layer is formed between the p-type layer and the light emitting layer. Alternatively, a p-type layer of the opposite conduction type having a wider bandgap than that of the light emitting layer is formed between the n-type layer and the light emitting layer. In both a case where the light emitting layer has the single layer structure and a case where it has the quantum well structure, the same effect is also obtained by such a method.

Furthermore, when the light emitting layer has the quantum well structure, acceptor levels or donor levels are nonuniformly formed in the quantum well layer, thereby making it possible to further decrease the potential gradient in the light emitting layer generated by the piezoelectric effect. In this case, a lot of acceptor levels are formed in a portion, on the side of the [000$\bar{1}$] direction, of the quantum well layer, or are formed in a portion, in contact with an interface of the quantum well layer on the side of the [000$\bar{1}$] direction, of the barrier layer. Alternatively, a lot of donor levels are formed in a portion, on the side of the [0001] direction, of the quantum well layer, or are formed in a portion, in contact with an interface of the quantum well layer on the side of the [0001] direction, of the barrier layer.

Conversely, in the III–V group compound semiconductor, when the light emitting layer has a strain extending in its in-plane direction (a direction parallel to its interface) and has a compressive strain in a direction perpendicular to the interface of the light emitting layer, a potential is high on the side of the [0001] direction, while being low on the side of the [000$\bar{1}$] direction in the potential gradient in the light emitting layer generated by the piezoelectric effect. In a light emitting device having such strains in its light emitting layer, and having an n-type layer on the side of the [0001] direction and a p-type layer on the side of the [000$\bar{1}$] direction, the potential in the light emitting layer is higher on the side of the n-type layer than that on the side of the p-type layer. When the light emitting layer has the quantum well structure, the potential in the quantum well layer is higher on the side of the n-type layer than that on the side of the p-type layer. In order to decrease the potential gradient generated by the piezoelectric effect, an n-type layer of the opposite conduction type having a wider bandgap than that of the light emitting layer is formed between the p-type layer and the light emitting layer. Alternatively, a p-type layer of the opposite conduction type having a wider bandgap than that of the light emitting layer is formed between the n-type layer and the light emitting layer. In both a case where the light emitting layer has the single layer structure and a case where it has the quantum well structure, the same effect is also obtained by such a method.

Furthermore, when the light emitting layer has the quantum well structure, acceptor levels or donor levels are nonuniformly formed in the quantum well layer, thereby making it possible to further decrease the potential gradient in the light emitting layer generated by the piezoelectric effect. In this case, a lot of acceptor levels are formed in a portion, on the side of the [0001] direction, of the quantum well layer, or are formed in a portion, in contact with an interface of the quantum well layer on the side of the [0001] direction, of the barrier layer. Alternatively, a lot of donor levels are formed in a portion, on the side of the [000$\bar{1}$] direction, of the quantum well layer, or are formed in a portion, in contact with an interface of the quantum well layer on the side of the [000$\bar{1}$] direction, of the barrier layer.

FIG. 1 is a schematic perspective view showing the structure of each of semiconductor laser devices in first to eighth examples of the present invention.

In FIG. 1, a buffer layer 2 composed of AlGaN having a thickness of approximately 15 nm is formed on a (0001) surface of a sapphire substrate 1. An undoped GaN layer 3 having a thickness of approximately 0.5 μm, an n-type contact layer 4 composed of n-GaN having a thickness of approximately 4 μm, an n-type crack-preventing layer 5 composed of n-GaInN having a thickness of approximately 0.1 μm, an n-type cladding layer 6 composed of n-AlGaN having a thickness of approximately 0.45 μm, an n-type cladding layer 7 composed of n-GaN having a thickness of approximately 50 nm, and a light emitting layer 8 composed of GaInN having a thickness of approximately 50 nm are formed in this order on the buffer layer 2. In this case, the n-type cladding layer 7 also functions as an optical guide layer.

The light emitting layer 8 in the semiconductor laser device in the first example has a single layer structure, as described later. On the other hand, the light emitting layer in each of the semiconductor laser devices in the second to eighth examples has an MQW layer.

An n-type layer of the opposite conduction type 9 composed of n-GaN having a thickness of approximately 40 nm, a p-type cladding layer 10 composed of p-AlGaN having a thickness of approximately 0.45 μm, and a p-type cap layer 11 composed of p-GaN having a thickness of approximately 50 nm are formed in this order on the light emitting layer 8.

A current-blocking layer 14 composed of silicon nitride having a thickness of approximately 0.2 μm is formed on the p-type cap layer 11. The current-blocking layer 14 has a striped opening having a width of approximately 2 μm. The striped opening becomes a current path 13.

A p-type contact layer 12 composed of p-GaN having a thickness of 3 to 5 μm is formed in the striped opening of the current-blocking layer 14 and on the p-type cap layer 11 and the current-blocking layer 14. Each of layers from the undoped GaN layer 3 to the p-type contact layer 12 has a wurtzite structure, and is grown in a [0001] direction of the nitride based semiconductor.

A partial region from the p-type contact layer 12 to the n-type contact layer 4 is removed, so that a surface of the n-type contact layer 4 is exposed. Consequently, a mesa shape having a width of approximately 10 μm is formed. A p-electrode 15 is formed on the p-type contact layer 12, and an n-electrode 16 is formed on the exposed surface of the n-type contact layer 4.

The above-mentioned semiconductor laser device has the light emitting layer 8 composed of InGaN and having a (0001) plane as its principal plane, and has the p-type cladding layer 10 in a [0001] direction of the light emitting layer 8 and the n-type cladding layer 7 in a [000$\bar{1}$] direction of the light emitting layer 8. In this case, a compressive strain occurs in an in-plane direction (a direction parallel to an interface) of the light emitting layer 8, and a strain extending in a direction perpendicular to the interface of the light emitting layer 8 occurs. As a result, a potential gradient generated by a piezoelectric effect is formed in the light emitting layer 8. In the potential gradient, a potential is high in a portion, on the side of the [000$\bar{1}$] direction, where the n-type cladding layer 7 is formed, while being low in a portion, on the side of the [0001] direction, where the p-type cladding layer 10 is formed.

In the following first to eighth examples, an n-type layer of the opposite conduction type 9 composed of n-GaN having a wider bandgap than that of the light emitting layer 8 is formed between the p-type cladding layer 10 and the light emitting layer 8 in order to decrease the potential gradient generated in the light emitting layer 8. The thickness of the n-type layer of the opposite conduction type 9 is preferably 1 to 100 nm, for example, approximately 40 nm in this case. The concentration of donor levels in the n-type layer of the opposite conduction type 9 is preferably $1 \times 10^{17}$ to $3 \times 10^{18}$ cm$^{-3}$. Further, then-type layer of the opposite conduction type 9 also functions as an optical guide layer because the refractive index thereof is higher than that of the p-type cladding layer 10, as described later.

(1) FIRST EXAMPLE

Figure 2:
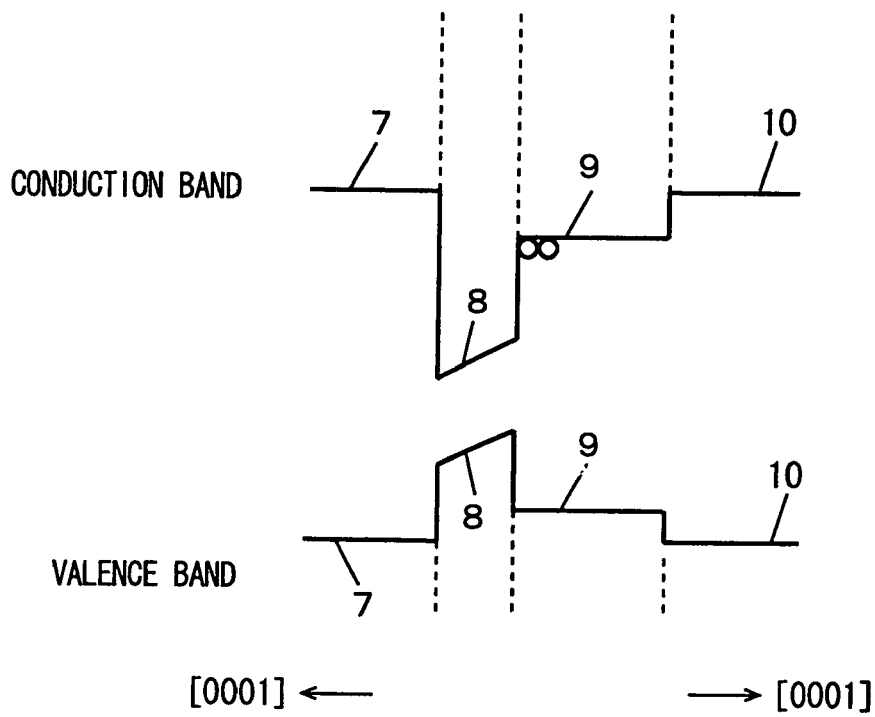
FIG. 2 is a diagram showing an energy band in a light emitting layer in the semiconductor laser device in the first example.

FIGS. 2 and 3 are diagrams each showing respective energy bands in the n-type cladding layer 7, the light emitting layer 8, the n-type layer of the opposite conduction type 9, and the p-type cladding layer 10 in the semiconductor laser device in the first example. In the semiconductor laser device in the example 1, the light emitting layer 8 has a single layer structure.

The lattice constant of the light emitting layer 8 composed of InGaN is larger than the lattice constant of the undoped GaN layer 3 having a thickness of approximately 0.5 μm and the n-type contact layer 4 composed of n-GaN having a thickness of approximately 4 μm. Accordingly, a compressive strain is produced in an in-plane direction (a direction parallel to an interface) of the light emitting layer 8, and a strain extending in a direction perpendicular to the interface of the light emitting layer 8 is produced.

As shown in FIG. 2, a potential gradient caused by a piezoelectric effect is formed in the light emitting layer 8. Accordingly, an energy band in the light emitting layer 8 has a gradient. The energy band in the light emitting layer 8 is higher on the side of a [0001] direction, that is, on the side of the p-type cladding layer 10 than that on the side of a [000$\bar{1}$] direction, that is, on the side of the n-type cladding layer 7.

An n-type layer of the opposite conduction type 9 composed of n-GaN having donor levels formed therein and having a wider energy bandgap than that of the light emitting layer 8 is formed on the side of the [0001] direction, that is, on the higher-energy side of the energy band of the light emitting layer 8. The bandgap of the n-type layer of the opposite conductin type 9 is narrower than that of the p-type cladding layer 10 composed of p-AlGaN. Accordingly, the refractive index of the n-type layer of the opposite conduction type 9 is higher than that of the p-type cladding layer 10. Consequently, the n-type layer of the opposite conduction type 9 also functions as an optical guide layer.

In this example, the n-type layer of the opposite conduction type 9 having a wider bandgap than that of the light emitting layer 8 is formed on the side of the [0001] direction, that is, on the higher-energy side of the energy band of the light emitting layer 8, as shown in FIG. 2. Accordingly, electrons are moved in the [000$\bar{1}$] direction, as shown in FIG. 3, so that the electrons and the ionized donor levels are spatially separated from each other. Consequently, the potential gradient in the light emitting layer 8 generated by the piezoelectric effect is decreased, and the energy band gradient is also decreased. As a result, the electrons and holes which are injected as current are prevented from being separated from each other, thereby preventing luminous efficiency from being reduced and preventing threshold current from being raised.

Although in the above-mentioned example 1, description was made of a case where the light emitting layer 8 has the single layer structure, a case where the light emitting layer 8 has an MQW structure will be described in the following examples 2 to 8.

FIG. 4 is a diagram showing an energy band in the light emitting layer 8 having the MQW structure (hereinafter referred to as MQW light emitting layer 8).

As shown in FIG. 4, the MQW light emitting layer 8 has the MQW structure constructed by alternately stacking barrier layers 8a composed of GaN having a thickness of approximately 4 nm and quantum well layers 8b composed of GaInN having a thickness of approximately 4 nm. For example, the number of barrier layers 8a composed of GaN is five, and the number of quantum well layers 8b composed of GaInN is four.

The lattice constant of the quantum well layer 8b composed of GaInN is larger than the lattice constants of the undoped GaN layer 3 having a thickness of approximately 0.5 μm and the n-type contact layer 4 composed of n-GaN having a thickness of approximately 4 μm. Accordingly, a compressive strain is produced in an in-plane direction (a direction parallel to an interface) of a quantum well, and a strain extending in the direction of confinement in the quantum well (a direction perpendicular to the interface) is produced. As a result, a piezoelectric effect generates a potential gradient in the quantum well layer 8b in the MQW light emitting layer 8. Therefore, the energy band in the MQW light emitting layer 8 has the structure shown in FIG. 4.

As shown in FIG. 4, the energy band in the MQW light emitting layer 8 is higher on the side of the [0001] direction, that is, on the side of the p-type cladding layer 10 than that on the side of the [000$\bar{1}$] direction, that is, on the side of the n-type cladding layer 7.

In the following second to eighth examples, in order to decrease the potential gradient generated in the quantum well layer 8b, the n-type layer of the opposite conduction type 9 composed of n-GaN is formed between the MQW light emitting layer 8 and the p-type cladding layer 10, and p-type impurities and/or n-type impurities are nonuniformly added to the MQW light emitting layer 8.

(2) SECOND EXAMPLE

FIGS. 5 and 6 are diagrams each showing an energy band in the MQW light emitting layer 8 in the semiconductor laser device in the second example.

As shown in FIG. 5, an n-type layer of the opposite conduction type 9 composed of GaN having a wider bandgap than that of the MQW light emitting layer 8 and having donor levels formed therein is formed on the side of a [0001] direction, that is, on the higher-energy side of the energy band of the MQW light emitting layer 8. The bandgap of the n-type layer of the opposite conductin type 9 is narrower than the bandgap of the p-type cladding layer 10 composed of p-AlGaN, so that the refractive index of the n-type layer of the opposite conduction type 9 is higher than the refractive index of the p-type cladding layer 10. Consequently, the n-type layer of the opposite conduction type 9 also functions as an optical guide layer.

The layer of the opposite conduction type having a wider bandgap than that of the MQW light emitting layer is composed of a semiconductor having energy at a bottom of its conduction band which is higher than energy in a ground state of electrons in the MQW light emitting layer and having energy at an top of its valence band which is lower than energy in a ground state of holes in the MQW light emitting layer.

Furthermore, a lot of Mg, for example, is doped as p-type impurities into a portion, on the side of a [000$\bar{1}$] direction, that is, on the side of the n-type cladding layer 7, of the quantum well layer 8. Specifically, Mg is doped into only a portion having a thickness of approximately 2 nm, on the side of the n-type cladding layer 7, of the quantum well layer 8b, and Mg is not doped into a portion having a thickness of approximately 2 nm, on the side of the p-type cladding layer 9, of the quantum well layer 8.

$1 \times 10^{17}$ to $1 \times 10^{21}$ cm$^{-3}$ is preferable as the doping amount of Mg. As a method of nonuniformly doping the p-type impurities, the other methods may be used. For example, the p-type impurities may be delta-doped at a concentration of $2 \times 10^{10}$ to $2 \times 10^{14}$ cm$^{-2}$ in a portion having a depth of approximately 1 nm from an interface of the quantum well layer 8b on the side of the n-type cladding layer 7. As the p-type impurities, Be, Ca, Sr, Ba, Zn, Cd, Hg, etc. may be used in addition to Mg.

In this example, the n-type layer of the opposite conduction type 9 having a wider bandgap than that of the MQW light emitting layer 8 is formed on the side of the [0001] direction, that is, on the higher-energy side of the energy band of the quantum well layer 8b, as shown in FIG. 5. Accordingly, electrons are moved in a [000$\bar{1}$] direction, as shown in FIG. 6, so that the electrons and the ionized donor levels are spatially separated from each other. Consequently, a potential gradient in the quantum well layer 8b generated by the piezoelectric effect is decreased, and the energy band gradient is also decreased.

Furthermore, in this example, a lot of Mg, for example, is doped as p-type impurities into a portion, on the side of the [000$\bar{1}$] direction, that is, on the side of the n-type cladding layer 7, of the quantum well layer 8b, as shown in FIG. 5. Accordingly, the holes are moved in the [0001] direction, as shown in FIG. 6, so that the holes and the ionized p-type impurities are spatially separated from each other. Consequently, the potential gradient in the quantum well layer 8b generated by the piezoelectric effect is further decreased, and the energy band gradient is also further decreased. As a result, the electrons and the holes which are injected as current are further prevented from being separated from each other, thereby further preventing luminous efficiency from being reduced and preventing threshold current from being raised.

(3) THIRD EXAMPLE

Figure 8:
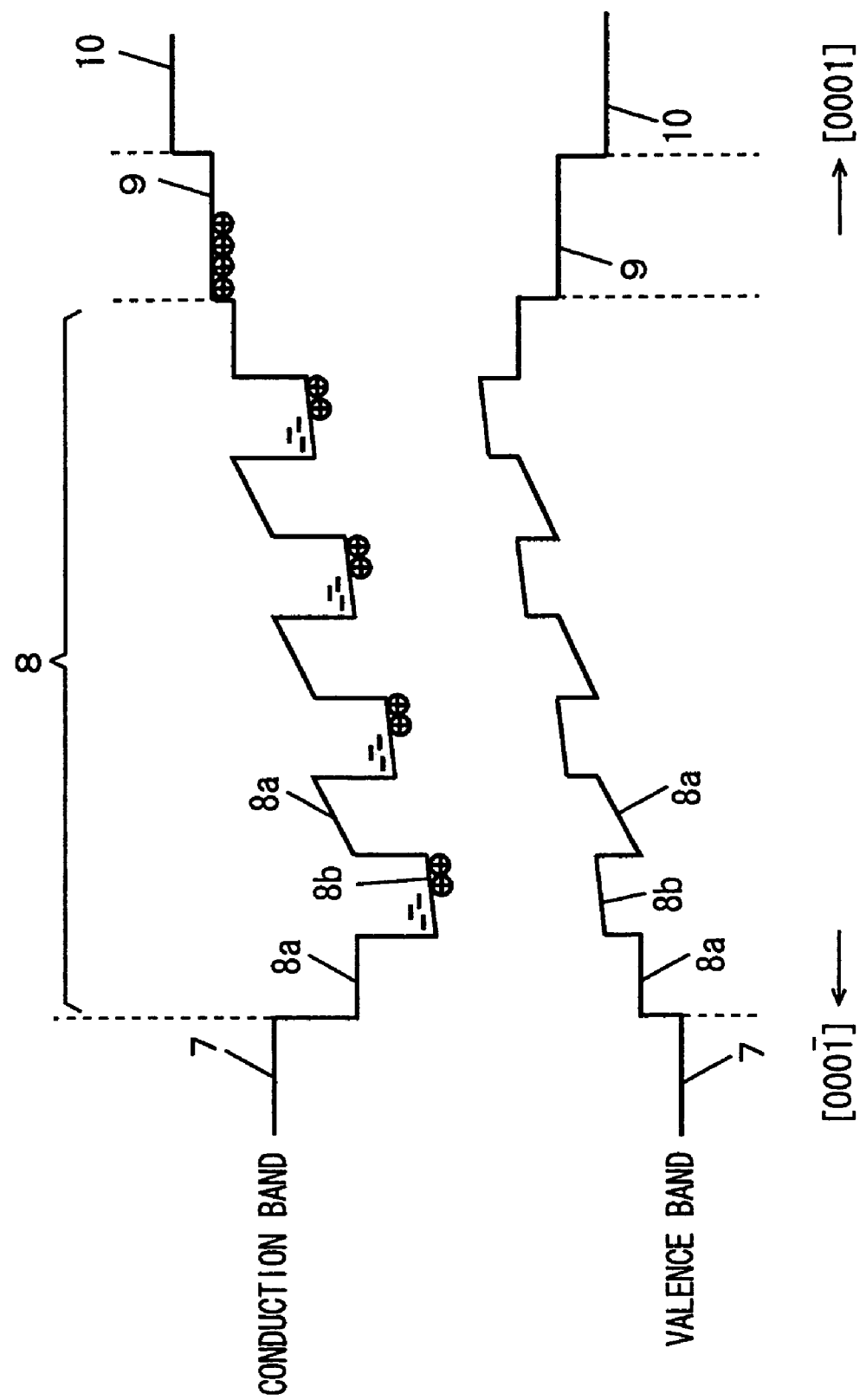
FIG. 8 is a diagram showing an energy band in the MQW light emitting layer in the semiconductor laser device in the third example.

FIGS. 7 and 8 are diagrams each showing an energy band in the MQW light emitting layer 8 in the semiconductor laser device in the third example.

As shown in FIG. 7, an n-type layer of the opposite conduction type 9 composed of GaN having a wider bandgap than that of the MQW light emitting layer 8 and having donor levels formed therein is formed on the side of a [0001] direction, that is, on the higher-energy side of the energy band of the MQW light emitting layer 8. The bandgap of the n-type layer of the opposite conductin type 9 is narrower than the bandgap of the p-type cladding layer 10 composed of p-AlGaN, so that the refractive index of the n-type layer of the opposite conduction type 9 is higher than the refractive index of the p-type cladding layer 10. Consequently, the n-type layer of the opposite conduction type 9 also functions as an optical guide layer.

The layer of the opposite conduction type having a wider bandgap than that of the MQW light emitting layer is composed of a semiconductor having energy at a bottom of its conduction band which is higher than energy in a ground state of electrons in the MQW light emitting layer and having energy at an top of its valence band which is lower than energy in a ground state of holes in the MQW light emitting layer.

Furthermore, a lot of Si, for example, is doped as n-type impurities into a portion, on the side of the [0001] direction, that is, on the side of the p-type cladding layer 10, of the quantum well layer 8b. Specifically, Si is doped into only a portion having a thickness of approximately 2 nm, on the side of the p-type cladding layer 10, of the quantum well layer 8b, and Si is not doped into a portion having a thickness of approximately 2 nm, on the side of the n-type cladding layer 7, of the quantum well layer 8b.

$1 \times 10^{17}$ to $1 \times 10^{21}$ cm$^{-3}$ is preferable as the doping amount of Si. As a method of nonuniformly doping the n-type impurities, the other methods may be used. For example, the n-type impurities may be delta-doped at a concentration of $2 \times 10^{10}$ to $2 \times 10^{14}$ cm$^{-2}$ in a portion having a depth of approximately 1 nm from an interface of the quantum well layer 8b on the side of the p-type cladding layer 10. As the n-type impurities, Ge, Pb, S, Se, Te, etc. may be used in addition to Si.

In this example, the n-type layer of the opposite conduction type 9 having a wider bandgap than that of the MQW light emitting layer 8 is formed on the side of the [0001] direction, that is, on the higher-energy side of the energy band of the quantum well layer 8b, as shown in FIG. 7. Accordingly, electrons are moved in a [000$\bar{1}$] direction, as shown in FIG. 8, so that the electrons and the ionized donor levels are spatially separated from each other. Consequently, a potential gradient in the quantum well layer 8b generated by the piezoelectric effect is decreased, and the energy band gradient is also decreased.

Furthermore, in this example, a lot of Si, for example, is doped as n-type impurities into a portion, on the side of the [0001] direction, that is, on the side of the p-type cladding layer 10, of the quantum well layer 8b, as shown in FIG. 7. Accordingly, the electrons are moved in the [000$\bar{1}$] direction, as shown in FIG. 8, so that the electrons and the ionized n-type impurities are spatially separated from each other. Consequently, the potential gradient in the quantum well layer 8b generated by the piezoelectric effect is further decreased. As a result, the electrons and the holes which are injected as current are further prevented from being separated from each other, thereby further preventing luminous efficiency from being lowered and preventing threshold current from being raised.

(4) FOURTH EXAMPLE

Figure 9:
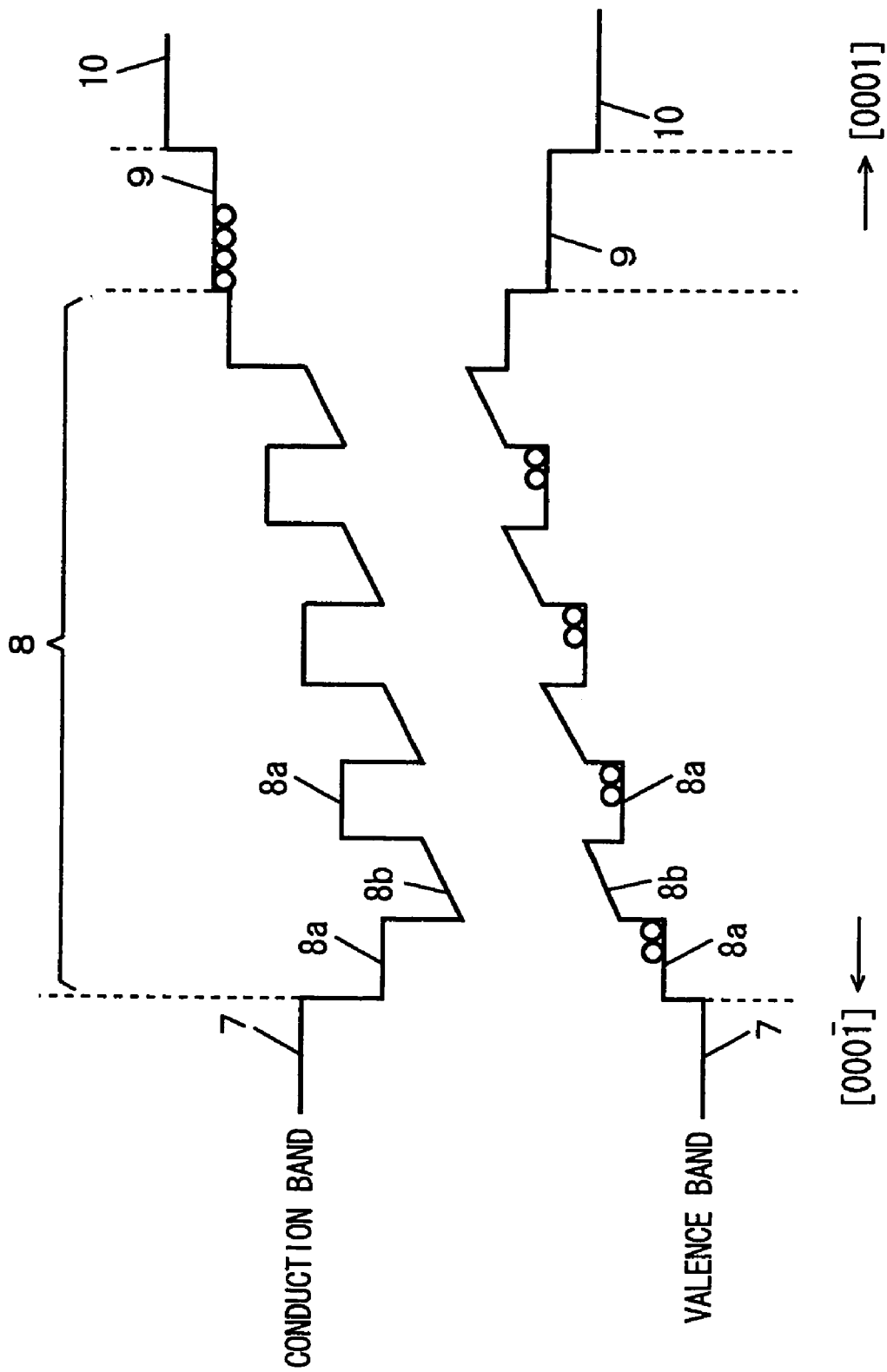
FIG. 9 is a diagram showing an energy band in the MQW light emitting layer in the semiconductor laser device in the fourth example.
Figure 10:
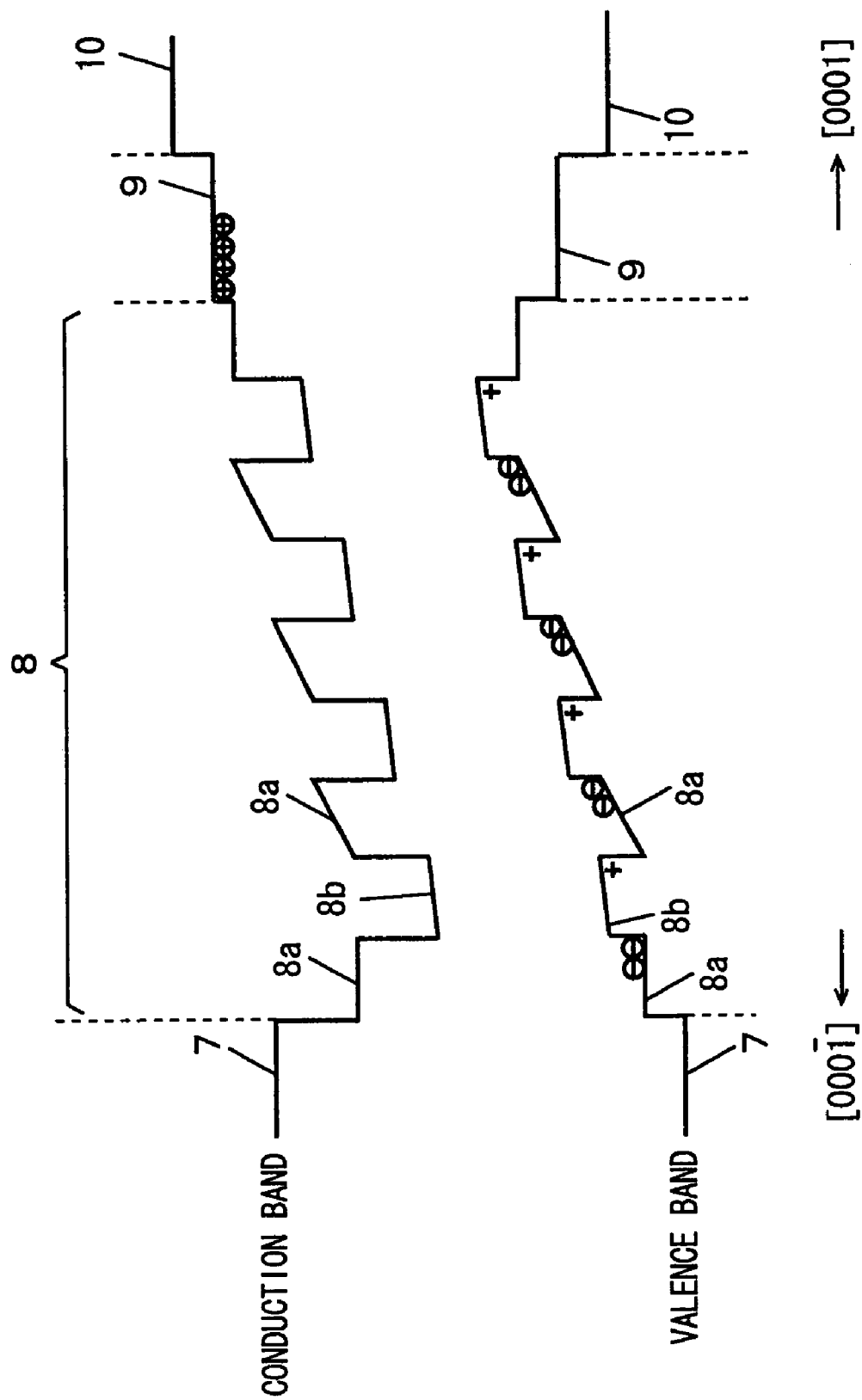
FIG. 10 is a diagram showing an energy band in the MQW light emitting layer in the semiconductor laser device in the fourth example.

FIGS. 9 and 10 are diagrams each showing an energy band in the MQW light emitting layer 8 in the semiconductor laser device in the fourth example.

As shown in FIG. 9, an n-type layer of the opposite conduction type 9 composed of GaN having a wider bandgap than that of the MQW light emitting layer 8 and having donor levels formed therein is formed on the side of a [0001] direction, that is, on the higher-energy side of the energy band of the MQW light emitting layer 8. The bandgap of the n-type layer of the opposite conductin type 9 is narrower than the bandgap of the p-type cladding layer 10 composed of p-AlGaN, so that the refractive index of the n-type layer of the opposite conduction type 9 is higher than the refractive index of the p-type cladding layer 10. Consequently, the n-type layer of the opposite conduction type 9 also functions as an optical guide layer.

The layer of the opposite conduction type having a wider bandgap than that of the MQW light emitting layer is composed of a semiconductor having energy at a bottom of its conduction band which is higher than energy in a ground state of electrons in the MQW emitting layer and having energy at an top of its valence band which is lower than energy in a ground state of holes in the MQW light emitting layer.

Furthermore, a lot of Mg, for example, is doped as p-type impurities into a portion, in contact with an interface of a quantum well layer 8b on the side of a [000$\bar{1}$] direction, that is, on the side of the n-type cladding layer 7, of a barrier layer 8a. Specifically, Mg is doped into only a portion having a thickness of approximately 2 nm, in contact with the interface of the quantum well layer 8b on the side of the n-type cladding layer 7, of the barrier layer 8a, and Mg is not doped into a portion having a thickness of approximately 2 nm, in contact with an interface of the quantum well layer 8b on the side of the p-type cladding layer 10, of the barrier layer 8a.

$1\times10^{17}$ to $1\times10^{21}$ cm$^{-3}$ is preferable as the doping amount of Mg. As a method of nonuniformly doping p-type impurities, the other methods may be used. For example, the p-type impurities may be delta-doped at a concentration of $2\times10^{10}$ to $2\times10^{14}$ cm$^{-2}$ into a portion, having a depth of approximately 1 nm from the interface of the quantum well layer 8b on the side of the n-type cladding layer 7, of the barrier layer 8a. As the p-type impurities, Be, Ca, Sr, Ba, Zn, Cd, Hg, etc. may be used in addition to Mg.

In this example, the n-type layer of the opposite conduction type 9 having a wider bandgap than that of the MQW light emitting layer 8 is formed on the side of the [0001] direction, that is, on the higher-energy side of the energy band of the quantum well layer 8b, as shown in FIG. 9. Accordingly, the electrons are moved in the [000$\bar{1}$] direction, as shown in FIG. 10, so that the electrons and the ionized donor levels are spatially separated from each other. Consequently, a potential gradient in the quantum well layer 8b generated by the piezoelectric effect is decreased, and the energy band gradient is also decreased.

Furthermore, in this example, a lot of Mg, for example, is doped as p-type impurities in the portion, in contact with the interface of the quantum well layer 8b on the side of the [000$\bar{1}$] direction, that is, on the side of the n-type cladding layer 7, of the barrier layer 8a, as shown in FIG. 9. Accordingly, the holes are moved in the [0001] direction, as shown in FIG. 10, so that the holes and ionized p-type impurities are spatially separated from each other. Consequently, the potential gradient in the quantum well layer 8b generated by the piezoelectric effect is further decreased. As a result, the electrons and the holes which are injected as current are further prevented from being separated from each other, thereby further preventing luminous efficiency from being reduced and preventing threshold current from being raised.

(5) FIFTH EXAMPLE

Figure 11:
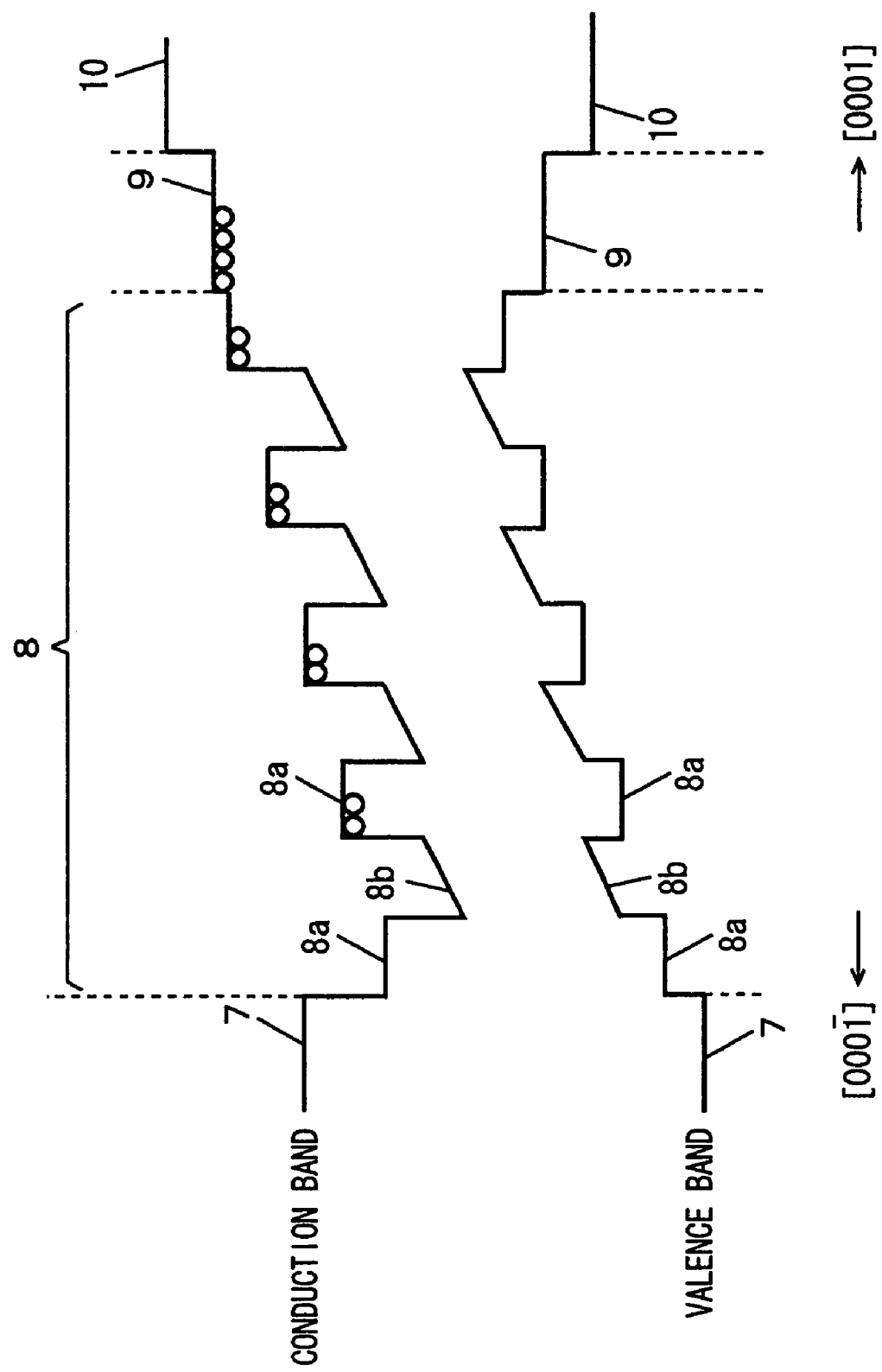
FIG. 11 is a diagram showing an energy band in the MQW light emitting layer in the semiconductor laser device in the fifth example.
Figure 12:
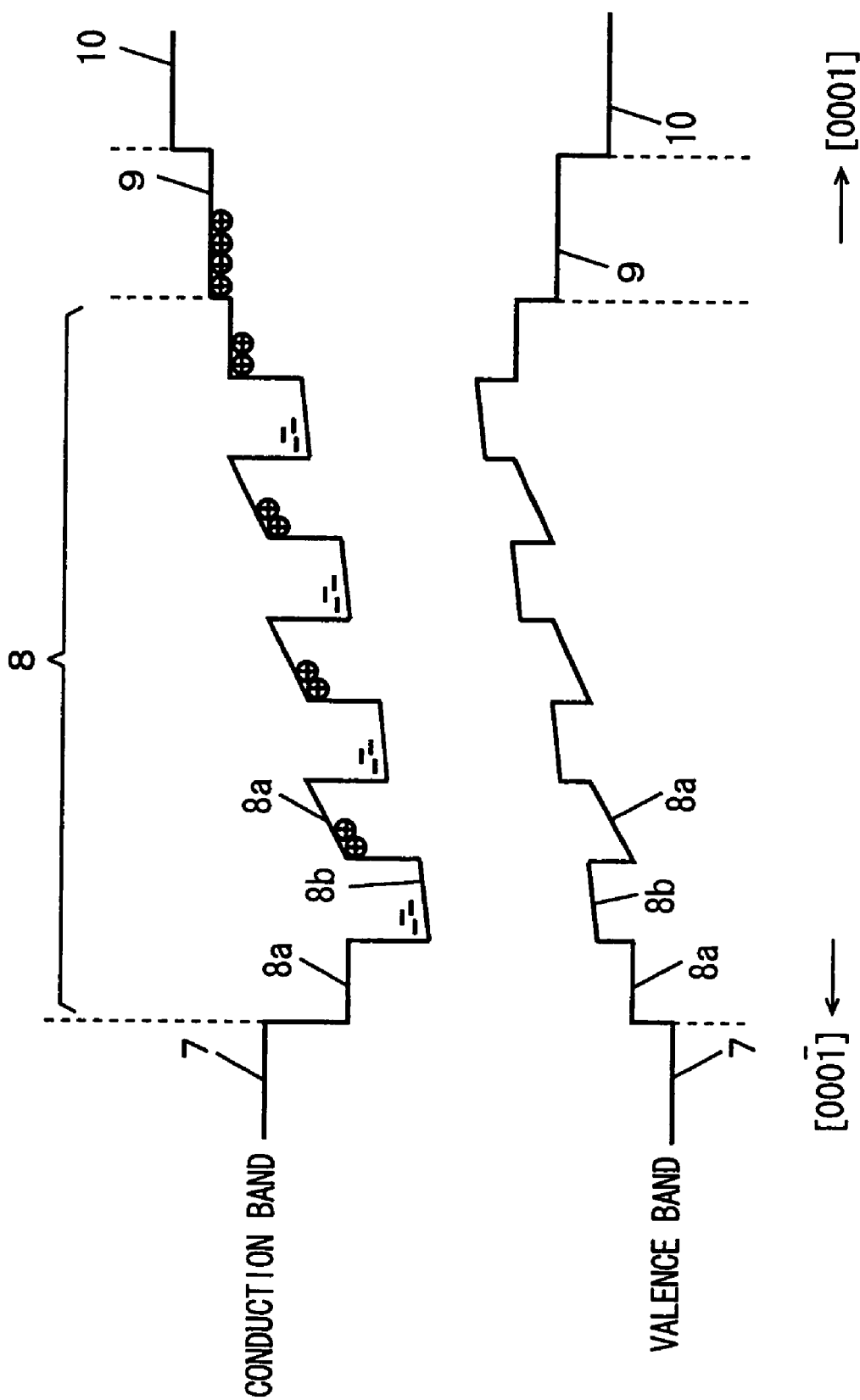
FIG. 12 is a diagram showing an energy band in the MQW light emitting layer in the semiconductor laser device in the fifth example.

FIGS. 11 and 12 are diagrams each showing an energy band in the MQW light emitting layer 8 in the semiconductor laser device in the fifth example.

As shown in FIG. 11, an n-type layer of the opposite conduction type 9 composed of GaN having a wider bandgap than that of the MQW light emitting layer 8 and having donor levels formed therein is formed on the side of a [0001] direction, that is, on the higher-energy side of the energy band of the MQW light emitting layer 8. The bandgap of the n-type layer of the opposite conductin type 9 is narrower than the bandgap of the p-type cladding layer 10 composed of p-AlGaN, so that the refractive index of the n-type layer of the opposite conduction type 9 is higher than the refractive index of the p-type cladding layer 10. Consequently, the n-type layer of the opposite conduction type 9 also functions as an optical guide layer.

The layer of the opposite conduction type having a wider bandgap than that of the MQW light emitting layer is composed of a semiconductor having energy at a bottom of its conduction band which is higher than energy in a ground state of electros in the MQW light emitting layer and having energy at an top of its valence band which is lower than energy in a ground state of holes in the MQW light emitting layer.

Furthermore, a lot of Si, for example, is doped as n-type impurities into a portion, in contact with an interface of a quantum well layer 8b on the side of the [0001] direction, that is, on the side of the p-type cladding layer 10, of a barrier layer 8a. Specifically, Si is doped into only a portion having a thickness of approximately 2 nm, in contact with the interface of the quantum well layer 8b on the side of the p-type cladding layer 10, of the barrier layer 8a, and Si is not doped into a portion having a thickness of approximately 2 nm, in contact with an interface of the quantum well layer 8b on the side of the n-type cladding layer 7, of the barrier layer 8a.

$1\times10^{17}$ to $1\times10^{21}$ cm$^{-3}$ is preferable as the doping amount of Si. As a method of nonuniformly doping the n-type impurities, the other methods may be used. For example, the n-type impurities may be delta-doped at a concentration of $2\times10^{10}$ to $2\times10^{14}$ cm$^{-2}$ into a portion, having a depth of approximately 1 nm from the interface of the quantum well layer 8b on the side of the p-type cladding layer 7, of the barrier layer 8a. As the n-type impurities, Ge, Pb, S, Se, Te, etc. may be used in addition to Si.

In this example, the n-type layer of the opposite conduction type 9 having a wider bandgap than that of the MQW light emitting layer 8 is formed on the side of the [0001] direction, that is, on the higher-energy side of the energy band of the quantum well layer 8b, as shown in FIG. 11. Accordingly, the electrons are moved in the [000$\bar{1}$] direction, as shown in FIG. 12, so that the electrons and the ionized donor levels are spatially separated from each other. Consequently, a potential gradient in the quantum well layer 8b generated by the piezoelectric effect is decreased, and the energy band gradient is also decreased.

Furthermore, a lot of Si, for example is doped as n-type impurities into the portion, in contact with the interface of the quantum well layer 8b on the side of the [0001] direction, that is, on the side of the p-type cladding layer 10, of the barrier layer 8a, as shown in FIG. 11. Accordingly, the electrons are moved in the [000$\bar{1}$] direction, as shown in FIG. 12, so that the electrons and the ionized donor levels are spatially separated from each other. Consequently, the potential gradient in the quantum well layer 8b generated by the piezoelectric effect is further decreased. As a result the electrons and the holes which are injected as current are further prevented from being separated from each other, thereby further preventing luminous efficiency from being reduced and preventing threshold current from being raised.

Although the doping methods in the second to fifth examples may be individually used to obtain an effect, the doping methods in two or more of the examples may be combined with each other. For example, the second and third examples may be combined, the second, third and fourth examples may be combined, and the second, third, fourth and fifth examples may be combined. The cases will be described below.

(6) SIXTH EXAMPLE

Figure 13:
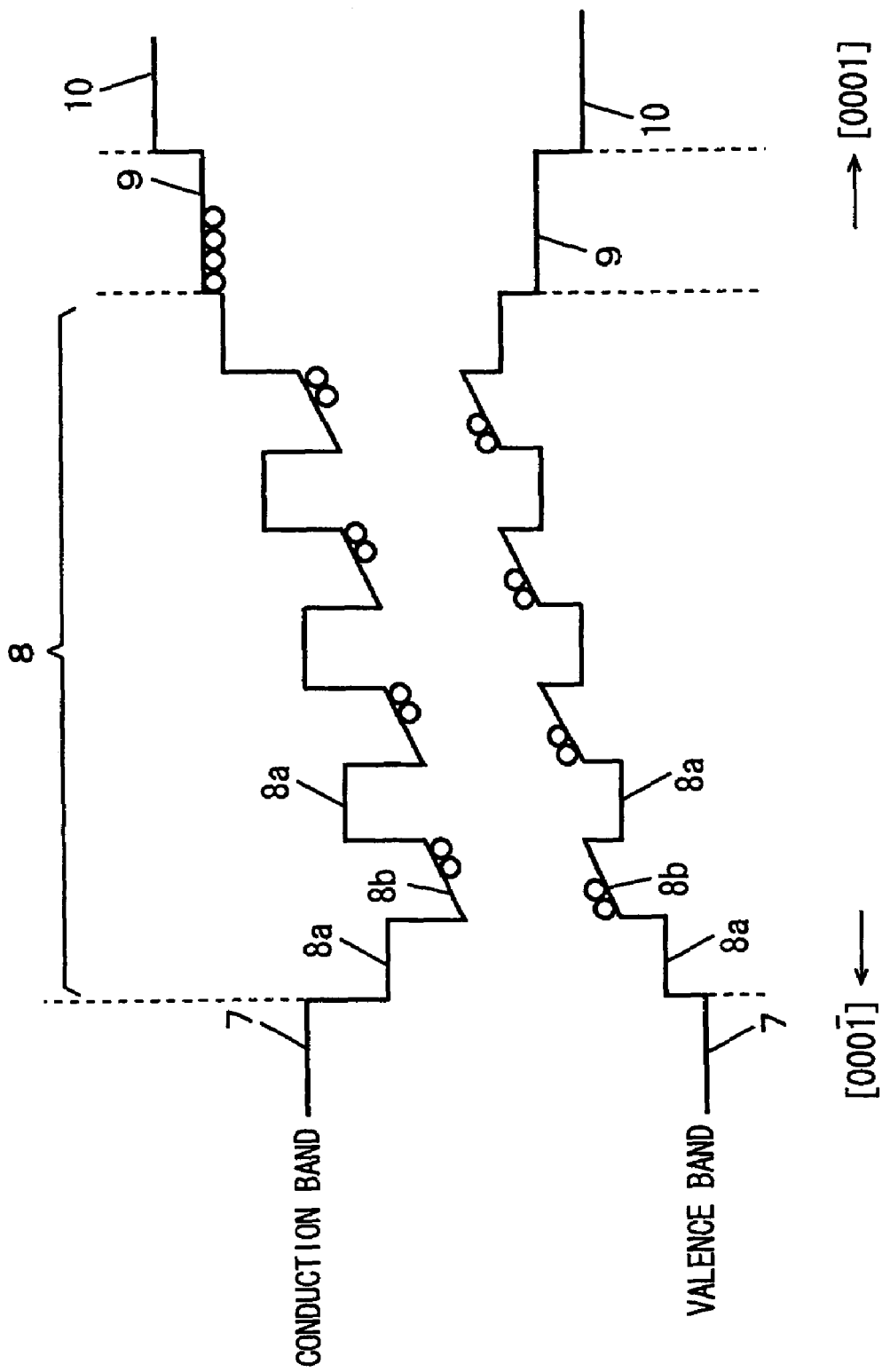
FIG. 13 is a diagram showing an energy band in the MQW light emitting layer in the semiconductor laser device in the sixth example.
Figure 14:
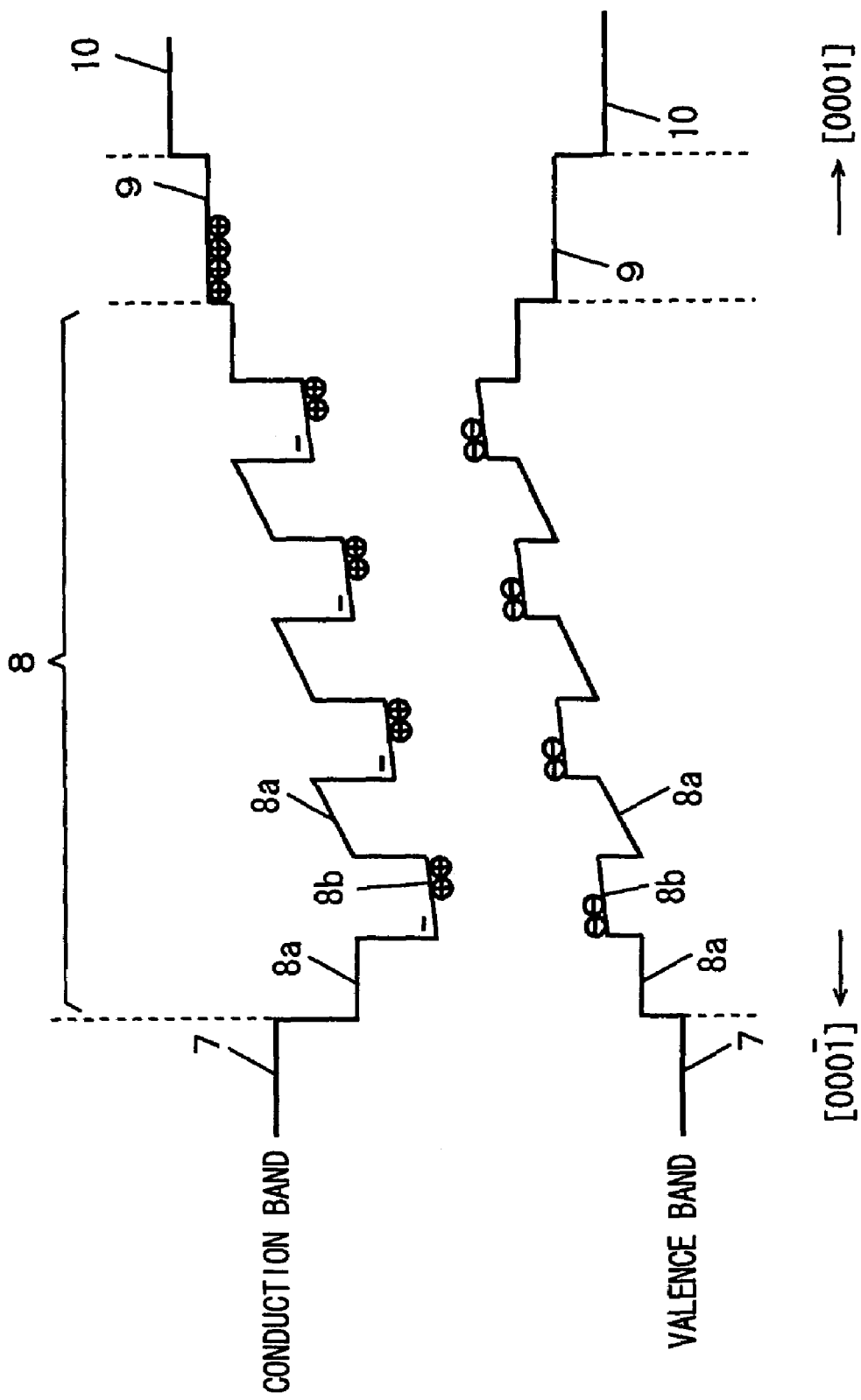
FIG. 14 is a diagram showing an energy band in the MQW light emitting layer in the semiconductor laser device in the sixth example.

FIGS. 13 and 14 are diagrams each showing an energy band in the MQW light emitting layer 8 in the semiconductor laser device in the sixth example.

The sixth example is a combination of the second example and the third example, as shown in FIG. 13. In this example, an n-type layer of the opposite conduction type 9 composed of GaN having a wider bandgap than that of the MQW light emitting layer 8 and having donor levels formed therein is formed on the side of a [0001] direction, that is, on the higher-energy side of the energy band of the MQW light emitting layer 8.

Furthermore, in this example, a lot of Mg is doped as p-type impurities into a portion, on the side of a [000$\bar{1}$] direction, that is, on the side of the n-type cladding layer 7, of a quantum well layer 8b, and a lot of Si is doped as n-type impurities into a portion, on the side of the [0001] direction, that is, on the side of the p-type cladding layer 10, of the quantum well layer 8b. In the example, a case where the respective doping concentrations of Mg which is the p-type impurities and Si which is the n-type impurities are approximately equal to each other is illustrated.

In this example, the n-type layer of the opposite conduction type 9 having a wider bandgap than that of the MQW light emitting layer 8 is formed on the side of the [0001] direction, that is, on the higher-energy side of the energy band of the quantum well layer 8b, as shown in FIG. 13. Accordingly, electrons are moved in the [000$\bar{1}$] direction, as shown in FIG. 14, so that the electrons and the ionized donor levels are spatially separated from each other. Consequently, a potential gradient in the quantum well layer 8b generated by the piezoelectric effect is decreased, and the energy band gradient is also decreased.

Furthermore, in the example, the electrons and holes are compensated for, as shown in FIG. 14, by doping the p-type impurities and the n-type impurities in the quantum well layer 8b, so that few carries by doping are generated. However, the potential gradient generated by the piezoelectric effect is further decreased by the ionized p-type impurities and the ionized n-type impurities. As a result, the electrons and the holes which are injected as current are further prevented from being separated from each other, thereby preventing luminous efficiency from being reduced and preventing threshold current from being raised.

Particularly when both the p-type impurities and the n-type impurities are added to the MQW light emitting layer 8, therefore, the effect of decreasing the potential gradient is great even if the carriers are compensated for by nonuniformly adding the p-type impurities and the n-type impurities. Further, when the respective concentrations of the p-type impurities and the n-type impurities which are added to the MQW light emitting layer 8 are approximately equal to each other, the carriers are further compensated for. However, the effect of decreasing the potential gradient is great.

When the second and fifth examples are combined with each other, for example, the same effect as that in the sixth example is produced even in a case where the third and fourth examples are combined with each other.

(7) SEVENTH EXAMPLE

Figure 15:
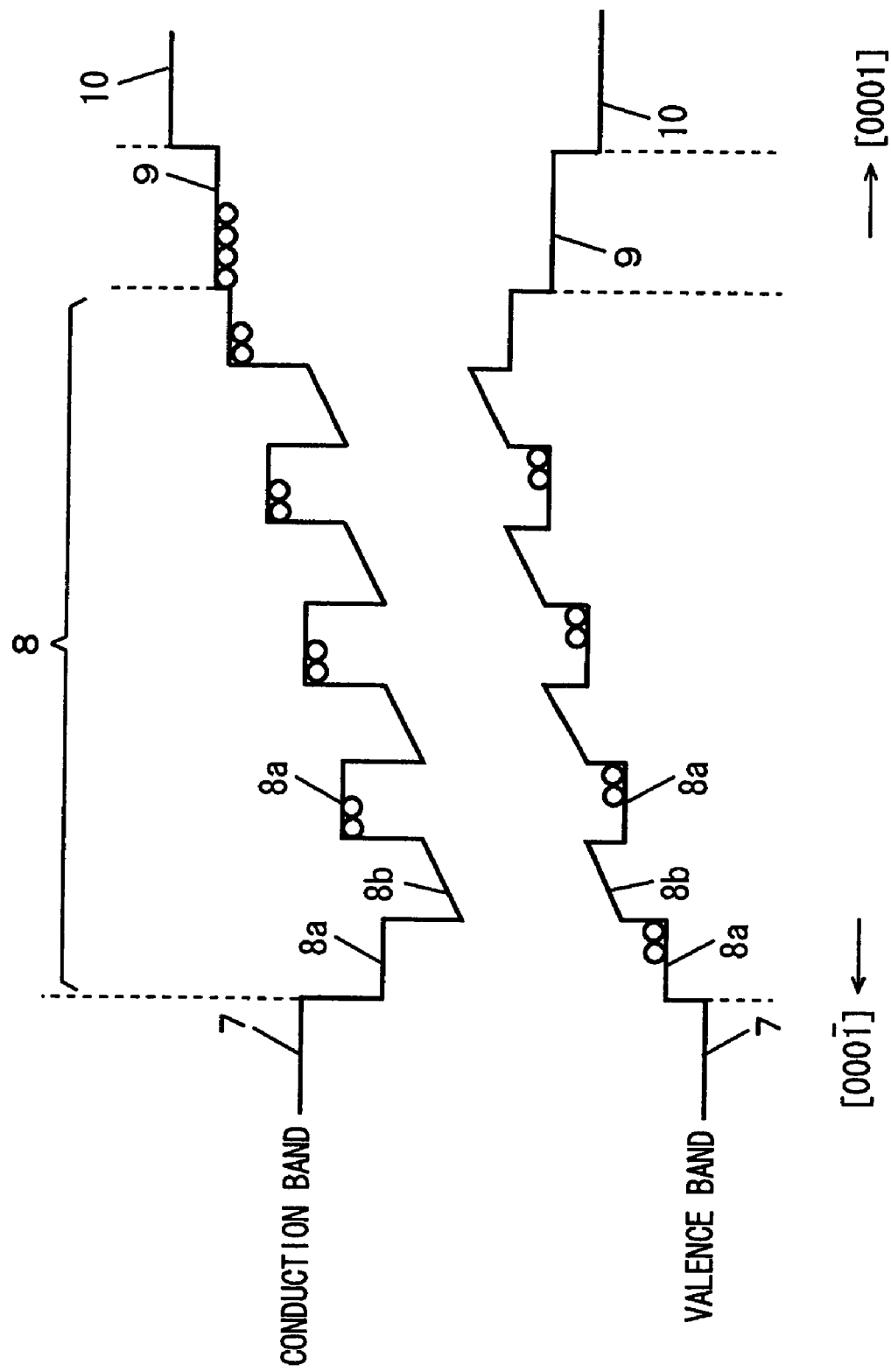
FIG. 15 is a diagram showing an energy band in the MQW light emitting layer in the semiconductor laser device in the seventh example.
Figure 16:
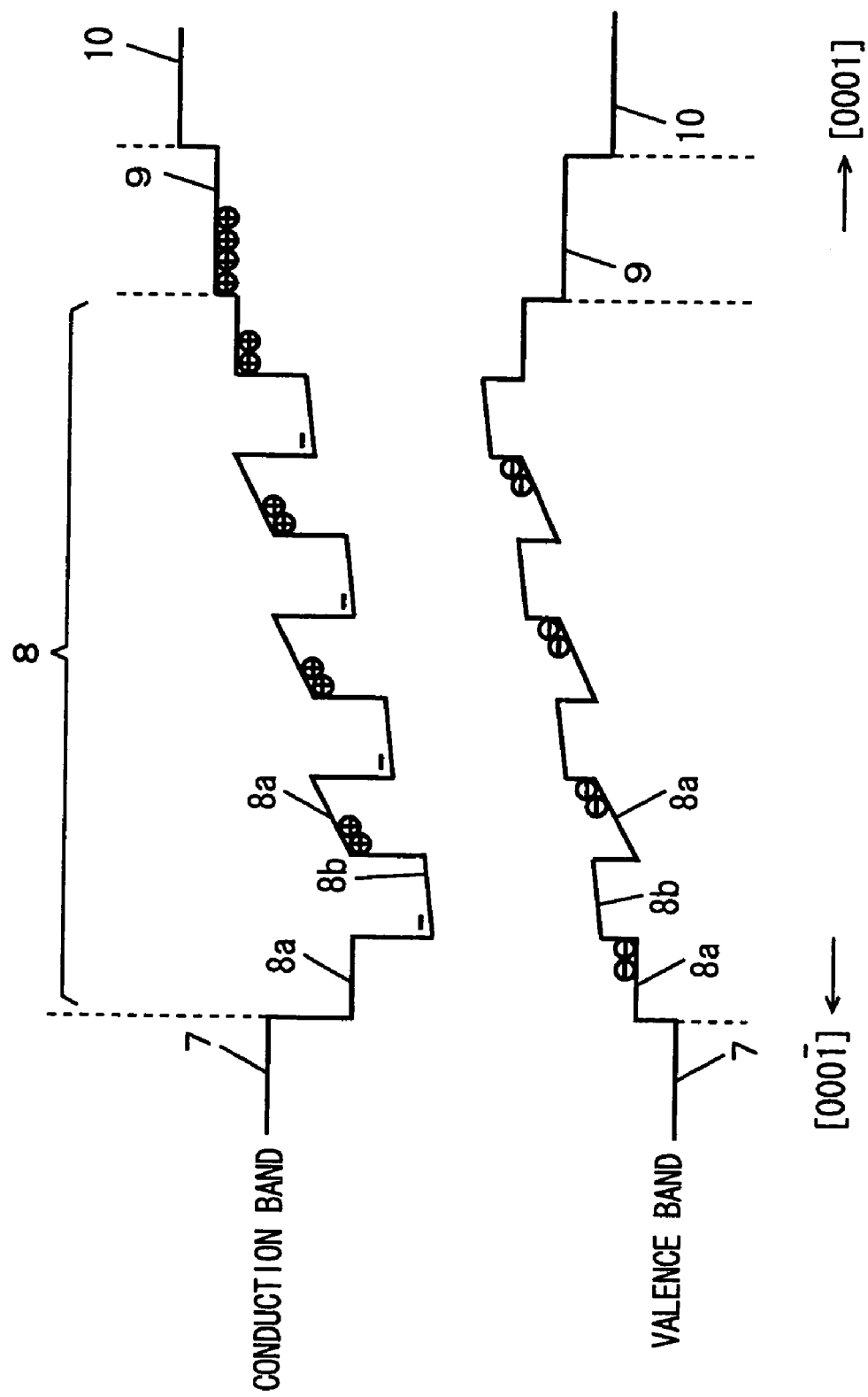
FIG. 16 is a diagram showing an energy band in the MQW light emitting layer in the semiconductor laser device in the seventh example.

FIGS. 15 and 16 are diagrams each showing an energy band in the MQW light emitting layer 8 in the semiconductor laser device in the seventh example.

The seventh example is a combination of the fourth example and the fifth example, as shown in FIG. 15. In this example, an n-type layer of the opposite conduction type 9 composed of GaN having a wider bandgap than that of the MQW light emitting layer 8 and having donor levels formed therein is formed on the side of a [0001] direction, that is, on the higher-energy side of the energy band of the MQW light emitting layer 8.

Furthermore, in this example, a lot of Mg is doped as p-type impurities into a portion, in contact with an interface of a quantum well layer 8b on the side of a [000$\bar{1}$] direction, that is, on the side of the n-type cladding layer 7, of a barrier layer 8a, and a lot of Si is doped as n-type impurities into a portion, in contact with an interface of the quantum well layer 8b on the side of the [0001] direction, that is, on the side of the p-type cladding layer 10, of the barrier layer 8a. In the example, a case where the respective doping concentrations of Mg which is the p-type impurities and Si which is the n-type impurities are approximately equal to each other is illustrated.

In this example, the n-type layer of the opposite conduction type 9 having a wider bandgap than that of the MQW light emitting layer 8 is formed on the side of the [0001] direction, that is, on the higher-energy side of the energy band of the quantum well layer 8b, as shown in FIG. 15. Accordingly, electrons are moved in the [000$\bar{1}$] direction, as shown in FIG. 16, so that the electrons and the ionized donor levels are spatially separated from each other. Consequently, a potential gradient in the quantum well layer 8b generated by the piezoelectric effect is decreased, and the energy band gradient is also decreased.

Furthermore, in the example, the electrons and holes are compensated for, as shown in FIG. 16, by doping the p-type impurities and the n-type impurities in the barrier layer, so that few carries by doping are generated. However, the potential gradient generated by the piezoelectric effect is further decreased by the ionized p-type impurities and the ionized n-type impurities. As a result, the electrons and the holes which are injected as current are further prevented from being separated from each other, thereby preventing luminous efficiency from being reduced and preventing threshold current from being raised.

In the fourth, fifth and seventh examples, the p-type impurities and the n-type impurities are not doped into the quantum well layer 8b. Consequently, no acceptor levels and donor levels exist in the quantum well layer 8b. Accordingly, the effect of reducing the amount of light emission from acceptor levels, donor levels, or an emission center is also obtained. When the MQW light emitting layer 8 in the example is applied to a light emitting diode, therefore, the emission spectrum width can be decreased. As a result, it is possible to improve color purity.

(8) EIGHTH EXAMPLE

Figure 17:
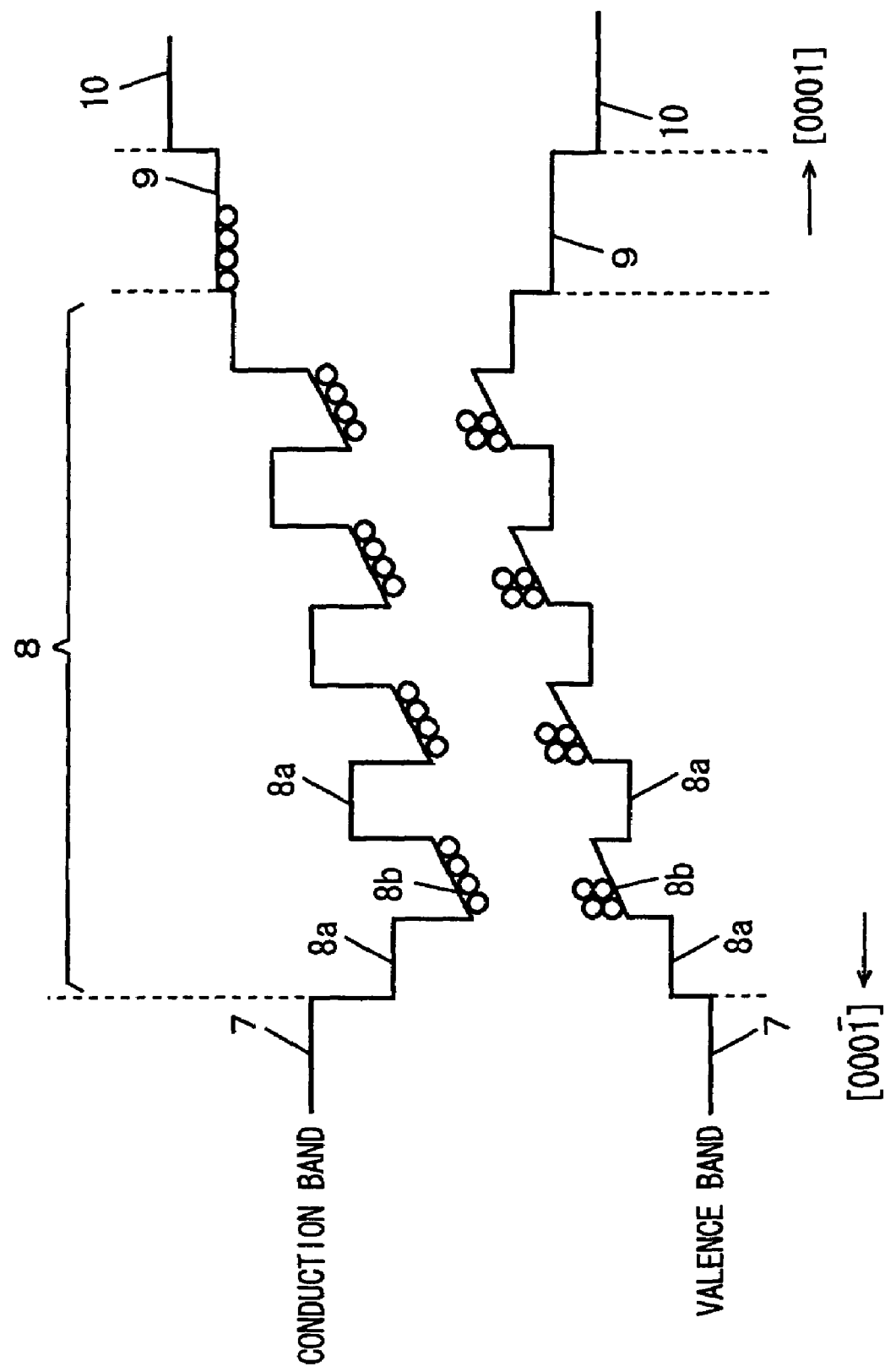
FIG. 17 is a diagram showing an energy band in the MQW light emitting layer in the semiconductor laser device in the eighth example.
Figure 18:
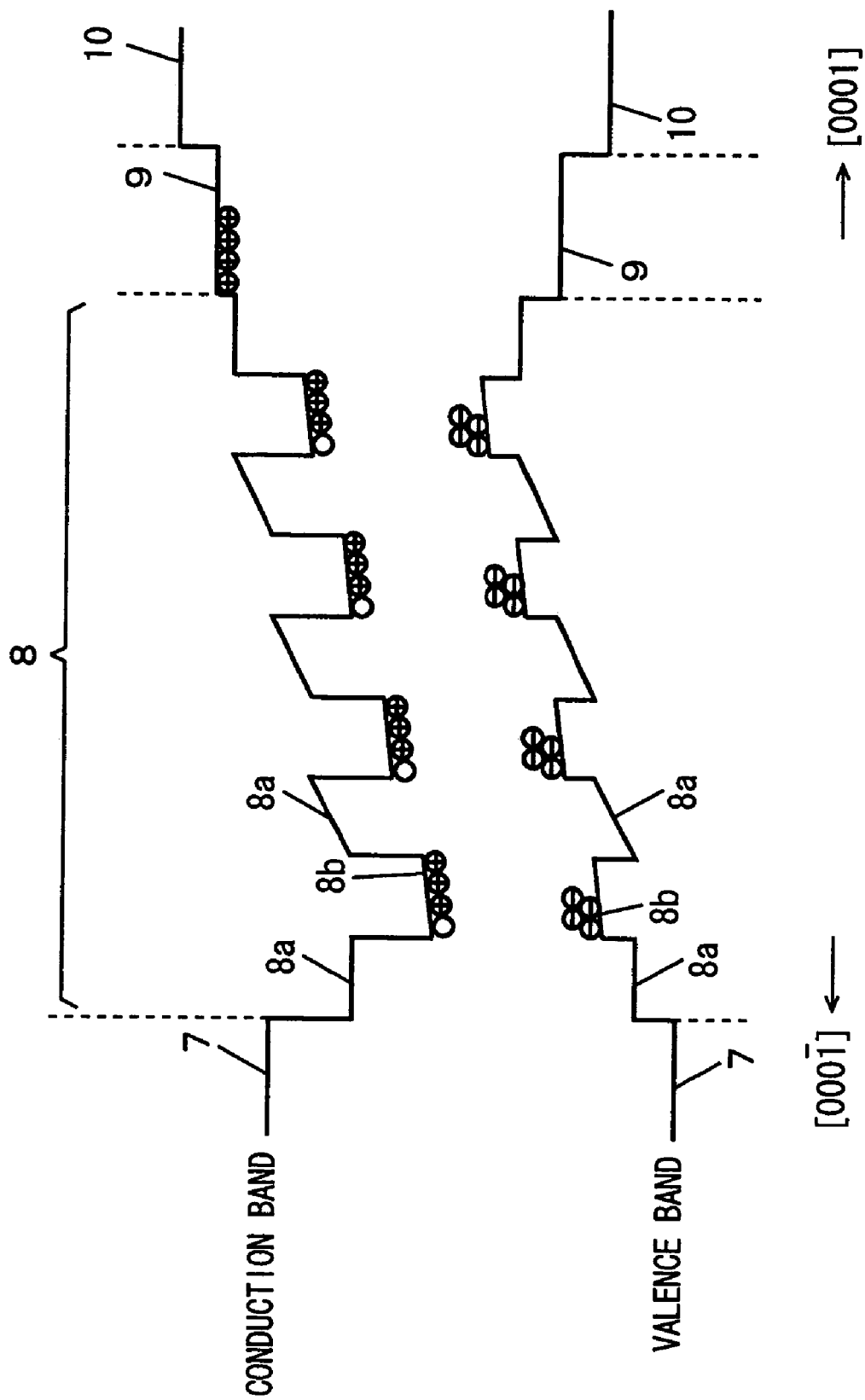
FIG. 18 is a diagram showing an energy band in the MQW light emitting layer in the semiconductor laser device in the eighth example.

FIGS. 17 and 18 are diagrams each showing an energy band in the MQW light emitting layer 8 in the semiconductor laser device in the eighth example.

In the eighth example, an n-type layer of the opposite conduction type 9 composed of GaN having a wider bandgap than that of the MQW light emitting layer 8 and having donor levels formed therein is formed on the side of a [0001] direction, that is, on the higher-energy side of the energy band of the MQW light emitting layer 8, as shown in FIG. 17, as in the second example.

Furthermore, Si, for example, is uniformly doped as n-type impurities into the quantum well layer 8b in the second example having Mg, for example, nonuniformly doped therein as p-type impurities. The doping concentration of Si is preferably $5\times10^{16}$ to $5\times10^{20}$ cm$^{-3}$.

In this example, the n-type layer of the opposite conduction type 9 having a wider bandgap than that of the MQW light emitting layer 8 is formed on the side of the [0001] direction, that is, on the higher-energy side of the energy band of the quantum well layer 8b, as shown in FIG. 17. Accordingly, electrons are moved in a [000$\bar{1}$] direction, as shown in FIG. 18, so that the electrons and the ionized donor levels are spatially separated from each other. Consequently, a potential gradient in the quantum well layer 8b generated by the piezoelectric effect is decreased, and the energy band gradient is also decreased.

Furthermore, a lot of Mg, for example, is doped as p-type impurities into a portion, on the side of the [000$\bar{1}$] direction, that is, on the side of the n-type cladding layer 7, of the quantum well layer 8b, and Si, for example, is uniformly doped as n-type impurities into the quantum well layer 8b, as shown in FIG. 17. Accordingly, the electrons and holes are compensated for, as shown in FIG. 18, so that few carriers by doping are generated. However, a potential gradient occurring due to the piezoelectric effect is further decreased by the ionized p-type impurities and the ionized n-type impurities. As a result, the electrons and the holes which are injected as current are further prevented from being separated from each other, thereby further preventing luminous efficiency from being reduced and preventing threshold current from being raised.

Even in cases such as a case where the n-type impurities are uniformly doped into the quantum well layer 8b in the fourth example and a case where the p-type impurities are uniformly doped into the quantum well layer 8b in the third or fifth example, the same effect as that in the eighth example is produced.

○ A method of fabricating a semiconductor laser device shown in FIG. 1

FIGS. 19 to 23 are schematic sectional views showing a method of fabricating the semiconductor laser device shown in FIG. 1.

Each of nitride based semiconductor layers in the semiconductor laser device shown in FIG. 1 is formed on a sapphire substrate 1 by MOVPE. Examples of material gas include trimethylaluminum (TMAl), trimethylgallium (TMGa), trimethylindium (TMIn), $NH_3$, $SiH_4$, and cyclopentadienyl magnesium ($Cp_2Mg$).

Figure 19:
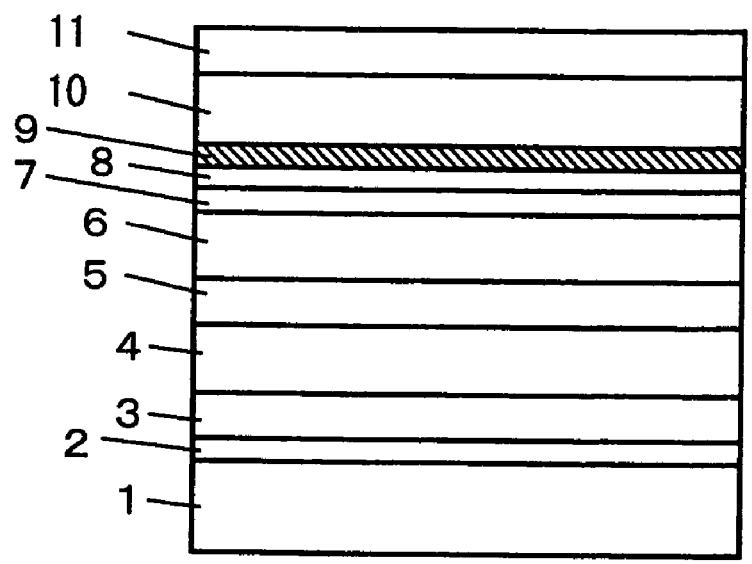
FIG. 19 is a schematic sectional view showing the steps of a method of fabricating the semiconductor laser device shown in FIG. 1.

As shown in FIG. 19, the substrate temperature is kept at 600° C., to form a buffer layer 2 having a thickness of approximately 15 nm on the sapphire substrate 1. The substrate temperature is then kept at 1150° C., to form an undoped GaN layer 3 having a thickness of approximately 0.5 μm and an n-type contact layer 4 composed of Si doped GaN having a thickness of approximately 4 μm. Further, the substrate temperature is kept at 880° C., to form an n-type crack-preventing layer 5 composed of Si doped $Ga_{0.95}In_{0.05}N$ having a thickness of approximately 0.1 μm. The substrate temperature is then kept at 1150° C., to form an n-type cladding layer 6 composed of Si doped $Al_{0.15}Ga_{0.85}N$ having a thickness of approximately 0.45 μm and an n-type cladding layer 7 composed of Si doped GaN having a thickness of approximately 50 nm.

In the first example, the substrate temperature is kept at 880° C., to form a light emitting layer 8 having a single layer structure composed of InGaN having a thickness of 50 nm on the n-type cladding layer 7.

On the other hand, in the second to eighth examples, the substrate temperature is kept at 880° C., to form a light emitting layer 8 composed of GaInN and having an MQW structure by alternately stacking five barrier layers 8a composed of undoped GaN having a thickness of approximately 4 nm and four quantum well layers 8b composed of undoped $Ga_{0.85}In_{0.15}nN$ having a thickness of approximately 4 nm. In this case, p-type impurities or n-type impurities are doped into the light emitting layer 8 having an MQW structure according to the second to eighth examples.

After the light emitting layer 8 having a single layer structure or the light emitting layer 8 having an MQW structure is formed in the above-mentioned manner, the substrate temperature is kept at 880° C., to form an n-type layer of the opposite conduction type 9 composed of n-GaN having a thickness of approximately 40 nm. Thereafter, the substrate temperature is kept at 1150° C., to form a p-type cladding layer 10 composed of Mg doped AlGaN having a thickness of approximately 0.45 μm and a p-type cap layer 11 composed of Mg doped GaN having a thickness of approximately 50 nm. The respective layers from the buffer layer 2 to the p-type cap layer 11 are formed by MOVPE under atmospheric pressure. GaN having Si, for example, doped therein at a substrate temperature of 1150° C. may be formed as the n-type layer of the opposite conduction type 9.

Figure 20:
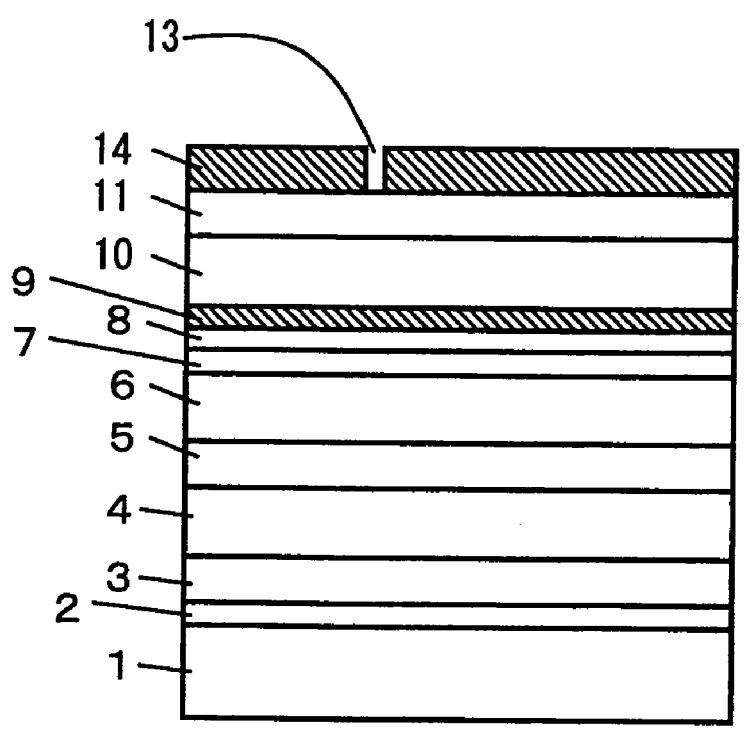
FIG. 20 is a schematic sectional view showing the steps of the method of fabricating the semiconductor laser device shown in FIG. 1.

Thereafter, a current-blocking layer 14 composed of silicon nitride such as $Si_3N_4$ having a thickness of approximately 0.2 μm is formed on the entire surface of the p-type cap layer 11 by ECR (Electron Cyclotron Resonance) plasma CVD (Chemical Vapor Deposition), for example, as shown in FIG. 20. The silicon nitride in a striped region having a width of approximately 2 μm is removed by photolithography and wet etching using BHF (Buffered Hydrofluoric Acid), to expose the p-type cap layer 11. Consequently, a striped current path 13 is formed.

Figure 21:
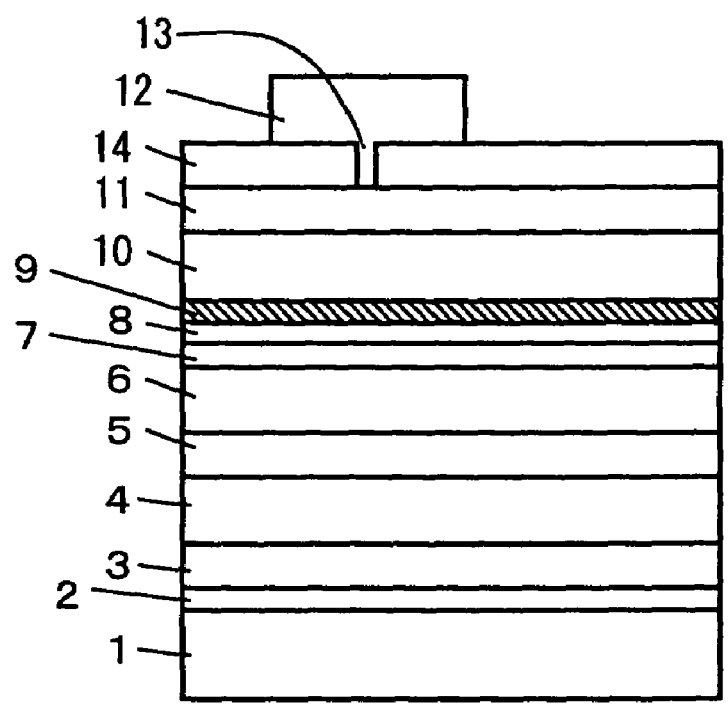
FIG. 21 is a schematic sectional view showing the steps of the method of fabricating the semiconductor laser device shown in FIG. 1.

As shown in FIG. 21, a p-type contact layer 12 composed of Mg doped GaN having a thickness of 3 to 5 μm is then formed on the n-type current-blocking layer 14 and the p-type cap layer 11 in the striped opening by low pressure MOVPE at 76 Torr, for example. In this case, growth conditions are suitably adjusted such that p-GaN is selectively grown in an exposed portion of the p-type cap layer 11. For example, the substrate temperature is raised by approximately 100° C., and the flow rate of $NH_3$ is increased by approximately three times.

Under such conditions, p-GaN is grown in the exposed portion of the p-type cap layer 11, so that a portion corresponding to the current path 13 is formed. On the other hand, p-GaN is not grown on the current-blocking layer 14. When the crystal growth is continued, p-GaN is grown on the current path 13, and the crystal growth is started in the lateral direction from a side surface of the p-GaN grown on the current path 13. Consequently, a p-type contact layer 12 composed of p-GaN is formed on the current-blocking layer 14. For example, the p-type contact layer 12 having a width of approximately 8 μm is formed, centered at the portion corresponding to the current path 13.

As a result, the p-type cap layer 11 and the p-type contact layer 12 are connected to each other by the striped current path 13 having a width of approximately 2 μm. A current-blocking layer 14 composed of $Si_3N_4$ having a thickness of approximately 0.2 μm is formed, except for the current path 13, between the p-type cap layer 11 and the p-type contact layer 12.

Figure 22:
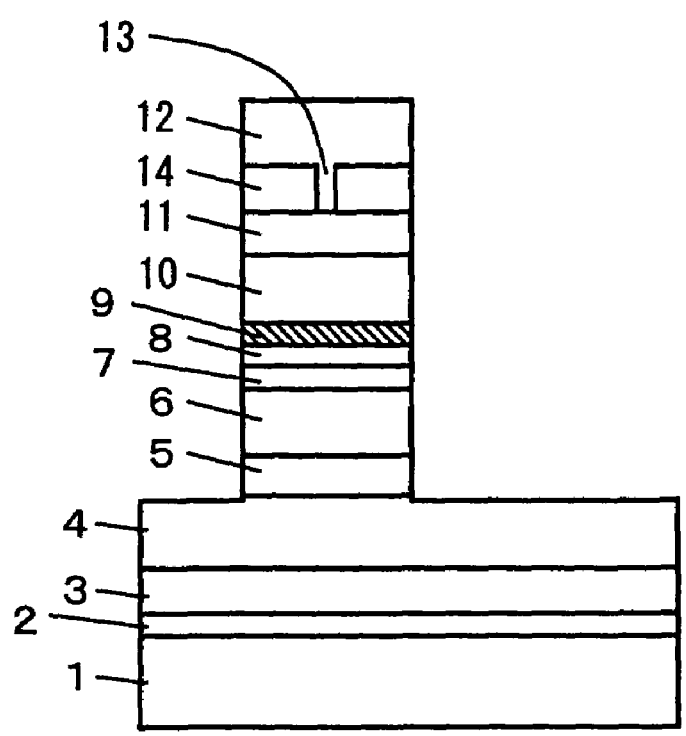
FIG. 22 is a schematic sectional view showing the steps of the method of fabricating the semiconductor laser device shown in FIG. 1.

As shown in FIG. 22, an Ni film having a thickness of 3 to 5 μm is evaporated in the shape of a strip having a width of approximately 10 μm, for example, on a region including the p-type contact layer 12 using a metal mask and EB (Electron Beam) evaporation. A region from the p-type contact layer 12 to the n-type crack-preventing layer 5 is etched in a mesa shape until the n-type contact layer 4 is exposed by reactive ion etching (RIE) using the Ni film as a mask and using $CF_4$, for example, as etching gas. Thereafter, the Ni film used as a mask is removed using a hydrochloric acid or the like.

Figure 23:
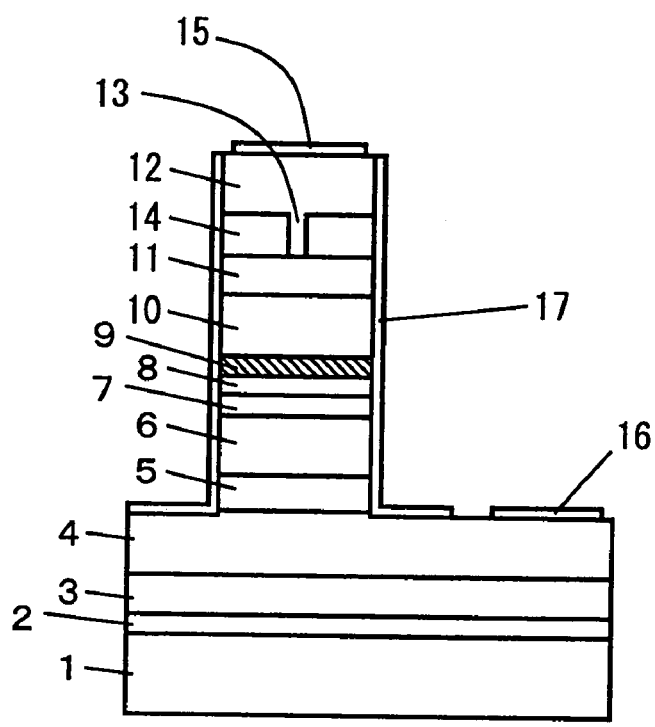
FIG. 23 is a schematic sectional view showing the steps of the method of fabricating the semiconductor laser device shown in FIG. 1.

Furthermore, an insulating film 17 composed of $Si_3N_4$ or the like is formed on a side surface of the region from the p-type contact layer 12 to the n-type crack-preventing layer 5 and an upper surface of the n-type contact layer 4 excluding an electrode forming region by ECR plasma CVD, photolithography, and etching, as shown in FIG. 23. An n-electrode 16 composed of Au/Ti, for example, is formed on the exposed surface of the n-type contact layer 4, and a p-electrode 15 composed of Au/Pd is formed on the p-type contact layer 12.

Finally, a cavity structure having a cavity length of 300 µm is formed in a direction along the striped current path 13 by cleavage, for example. Consequently, a semiconductor laser device having the structure shown in FIG. 1 is fabricated.

A high reflective film and a low reflective film such as a dielectric multi-layer film having $Si_3N_4$, $SiO_2$, $Al_2O_3$, $TiO_2$, etc. stacked thereon may be formed on a cavity surface of the semiconductor laser device.

(9) NINTH EXAMPLE

A semiconductor laser device according to a ninth example has the same structure as that of the semiconductor laser device shown in FIG. 1, and differs therefrom in a method of growing nitride based semiconductor lasers as crystals, as described below.

In the structure of the semiconductor laser device shown in FIG. 1, at least a buffer layer 2 and an undoped GaN layer 3 are grown as crystals on a (0001) surface of a sapphire substrate 1, respectively, at low temperature and at high temperature by MOVPE, after which other layers 4 to 12 and 14 are grown as crystals by a crystal growth method, other than MOVPE, for example, MBE and HVPE (Halide Vapor Phase Epitaxy). A light emitting layer 8 in the example has a single layer structure or an MQW structure, as in the above-mentioned first to eighth examples.

In the example, each of the layers from the undoped GaN layer 3 to the p-type contact layer 12 has a wurtzite structure, and is grown in a [0001] direction of a nitride based semiconductor. Consequently, the same effect as those in the first to eighth examples is obtained.

When the buffer layer 2 is thus grown on the (0001) surface of the sapphire substrate 1 at low temperature by MOVPE, and the nitride based semiconductor layer is subsequently grown as a crystal at high temperature, the nitride based semiconductor layer is grown in the [0001] direction. Thereafter, even if the crystal growth method is changed, the crystal growth direction is not changed, so that the nitride based semiconductor laser continues to be grown in the [0001] direction.

When the n-type layer of the opposite conduction type 9 also functions as an optical guide layer, as in the first to ninth examples, a layer having a wider bandgap than that of the n-type layer of the opposite conduction type 9 may be formed between the light emitting layer 8 and the n-type layer of the opposite conduction type 9. This case will be described below.

(10) TENTH EXAMPLE

Figure 24:
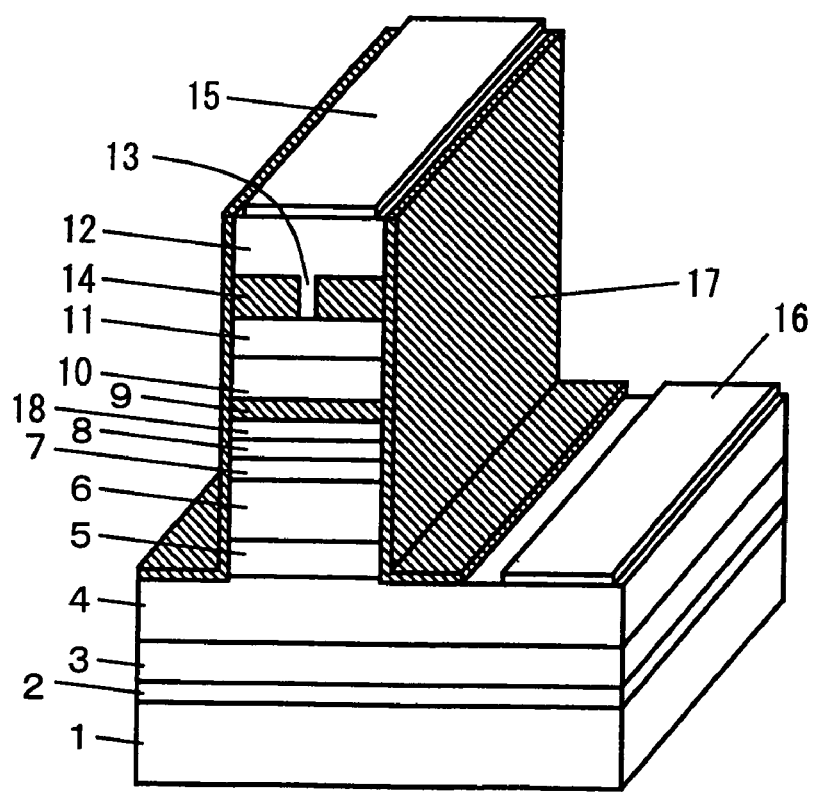
FIG. 24 is a schematic perspective view showing the structure of a semiconductor laser device in a tenth example.

FIG. 24 is a schematic perspective view showing the structure of a semiconductor laser device in a tenth example of the present invention.

The semiconductor laser device in the tenth example has the same structure as the semiconductor laser device shown in FIG. 1 except that a cladding layer 18 composed of AlGaN having a wider bandgap than that of an n-type layer of the opposite conduction type 9 is formed between a light emitting layer 8 and the n-type layer of the opposite conduction type 9. The semiconductor laser device in the example comprises a light emitting layer 8 having a single layer structure composed of InGaN having a thickness of 50 nm, similarly to the semiconductor laser device in the first example.

An example of the cladding layer 18 is $Al_xGa_{1-x}N$ having a thickness of 1 to 100 nm. In this case, it is preferable that $0 \leq X \leq 0.1$. The conductivity type of the cladding layer 18 may have insulating properties, or may be an n-type or a p-type. When the p-type cladding layer 18 is formed, the concentration of acceptor levels formed in the cladding layer 18 must be made lower than the concentration of donor levels formed in the n-type layer of the opposite conduction type 9.

Figure 25:
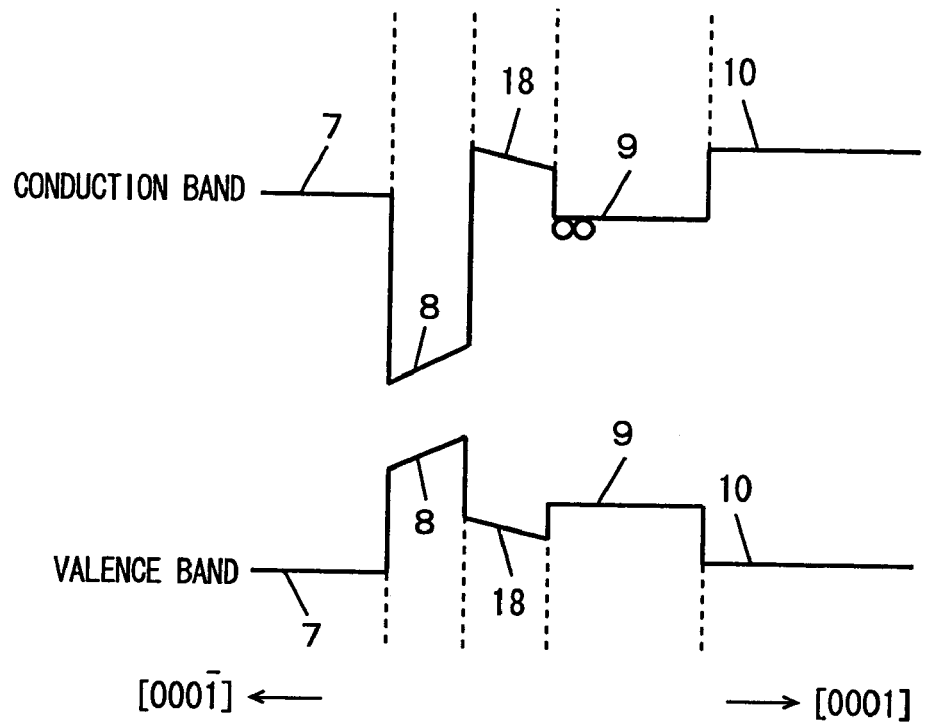
FIG. 25 is a diagram showing an energy band in a light emitting layer in the semiconductor laser device in the tenth example.
Figure 26:
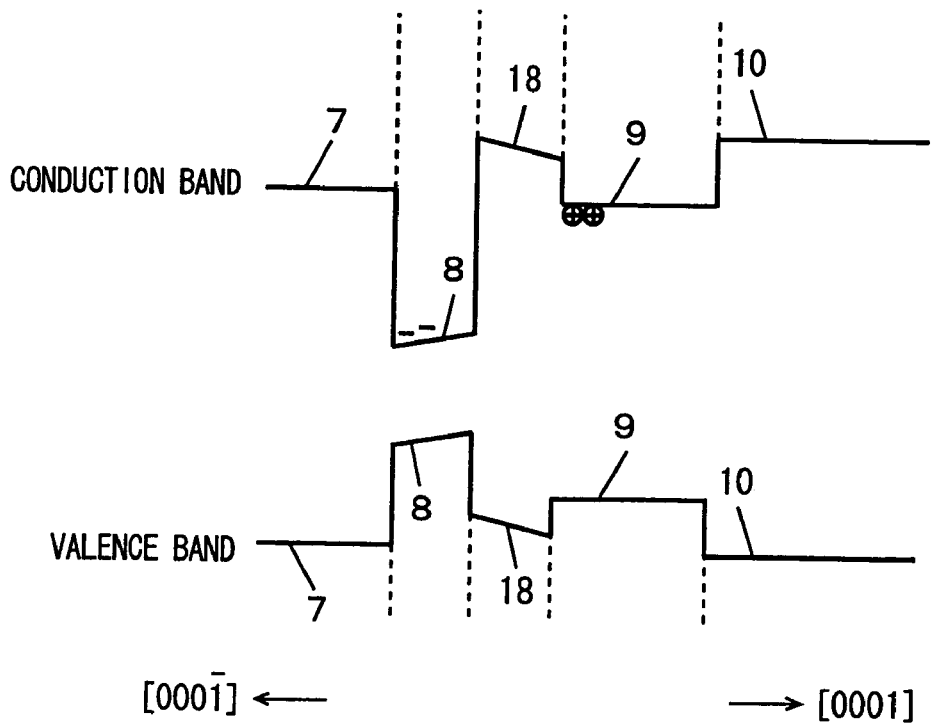
FIG. 26 is a diagram showing an energy band in the light emitting layer in the semiconductor laser device in the tenth example.

FIGS. 25 and 26 are diagrams each showing respective energy bands in an n-type cladding layer 7, the light emitting layer 8, the cladding layer 18, the n-type layer of the opposite conduction type 9, and a p-type cladding layer 10 in the semiconductor laser device shown in FIG. 24.

As shown in FIG. 25, the n-type layer of the opposite conduction type 9 composed of GaN having a wider bandgap than that of the light emitting layer 8 and having donor levels formed therein is formed on the side of a [0001] direction, that is, on the higher-energy side of the energy band of the light emitting layer 8, as in the example 1. The bandgap of the n-type layer of the opposite conductin type 9 is narrower than the bandgap of the p-type cladding layer 10 composed of p-AlGaN. Accordingly, the refractive index of the n-type layer of the opposite conduction type 9 is higher than the refractive index of the p-type cladding layer 10. Consequently, the n-type layer of the opposite conduction type 9 also functions as an optical guide layer.

Furthermore, in this example, the cladding layer 18 composed of AlGaN is formed between the n-type layer of the opposite conduction type 9 and the light emitting layer. The cladding layer 18 has a wider bandgap than that of the n-type layer of the opposite conduction type 9. Consequently, the cladding layer 18 allows a structure in which the optical guide layer (the n-type layer of the opposite conduction type 9) is separated from the light emitting layer 8.

In the example, the n-type layer of the opposite conduction type 9 having a wider bandgap than that of the light emitting layer 8 is formed on the side of the [0001] direction, that is, on the higher-energy side of the energy band of the light emitting layer 8, as shown in FIG. 25. Accordingly, electrons are moved in a [000$\bar{1}$] direction, as shown in FIG. 26, so that the electrons and the ionized donor levels are spatially separated from each other. Consequently, a potential gradient in the light emitting layer 8 which occurs due to a piezoelectric effect is decreased, and the energy band gradient is also decreased. As a result, the electrons and holes which are injected as current are prevented from being separated from each other, thereby preventing luminous efficiency from being reduced and preventing threshold current from being raised.

Although in the example, description was made of a case where the light emitting layer 8 has the single layer structure, a cladding layer having a wider bandgap than that of the n-type layer of the opposite conduction type 9 can be formed between the light emitting layer 8 and the n-type layer of the opposite conduction type 9 even in a case where the light emitting layer 8 has an MQW structure, as in the second to eighth examples. Also in this case, the same effect as those in the second to ninth examples is obtained.

Although in the first to tenth examples, description was made of a case where the n-type layer of the opposite conduction type 9 has a narrower bandgap than that of the p-type cladding layer 10, the bandgap of the n-type layer of the opposite conduction type 9 may be the same as the bandgap of the p-type cladding layer 10. The bandgap of the n-type layer of the opposite conduction type 9 may be wider than the bandgap of the p-type cladding layer 10. Also in this case, the n-type layer of the opposite conduction type 9 does not function as an optical guide layer.

Although in the above-mentioned first to tenth examples, description was made of a case where the n-type layer of the opposite conduction type is formed between the light emitting layer 8 and the p-type semiconductor layer in order to decrease the potential gradient formed in the light emitting layer 8, a p-type layer of the opposite conduction type having a wider bandgap than that of the light emitting layer 8 may be formed between the light emitting layer 8 and the n-type semiconductor layer. Also in this case, it is possible to decrease the potential gradient formed in the light emitting layer 8. This case will be described below.

(11) ELEVENTH EXAMPLE

Figure 27:
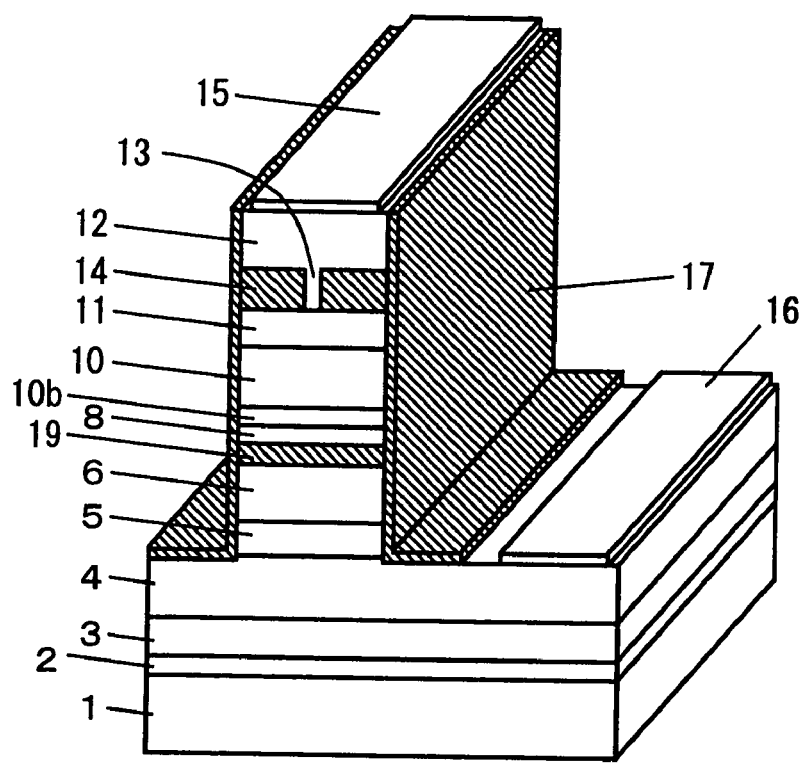
FIG. 27 is schematic perspective view showing the structure of a semiconductor laser device in an eleventh example.

FIG. 27 is a schematic perspective view showing the structure of a semiconductor laser device in an eleventh example of the present invention.

The semiconductor laser device in the eleventh example has the same structure as the semiconductor laser device shown in FIG. 1 in each of the first to eighth examples except for the following. The semiconductor laser device in the example comprises a light emitting layer 8 having a single layer structure composed of InGaN having a thickness of 50 nm, similarly to the semiconductor laser device in the first example.

As shown in FIG. 27, in the semiconductor laser device in the eleventh example, a p-type layer of the opposite conduction type 19 composed of GaN having acceptor levels formed therein is formed on an n-type cladding layer 6 composed of n-AlGaN. It is preferable that the thickness of the p-type layer of the opposite conduction type 19 is approximately 1 to 100 nm, and is approximately 40 nm in the example. Further, the concentration of the acceptor levels formed in the p-type layer of the opposite conduction type 19 is preferably $1 \times 10^{17}$ to $3 \times 10^{18}$ cm$^{-3}$. Mg, for example, is doped at a concentration of approximately $3 \times 10^{18}$ cm$^{-3}$. The light emitting layer 8 is formed on the p-type layer of the opposite conduction type 19, and a p-type cladding layer 10b composed of p-GaN having a thickness of approximately 40 nm is further formed. A p-type cladding layer 10 composed of p-AlGaN is formed on the p-type cladding layer 10b.

Figure 28:
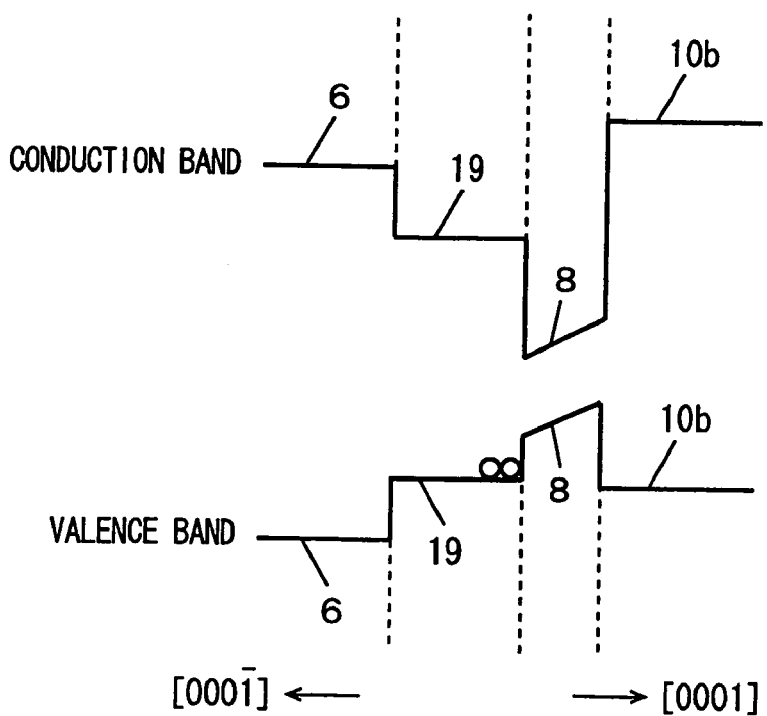
FIG. 28 is a diagram showing an energy band in a light emitting layer in the semiconductor laser device in the eleventh example.
Figure 29:
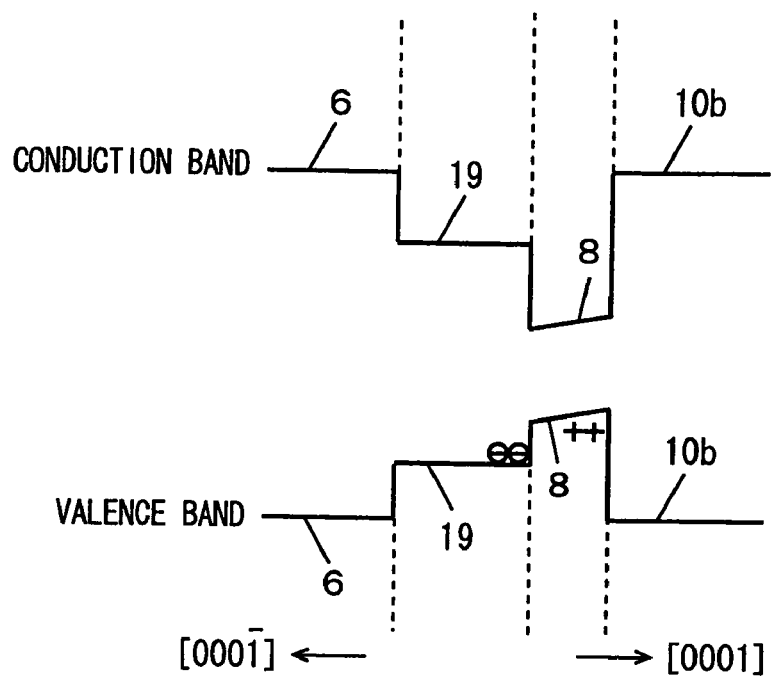
FIG. 29 is a diagram showing an energy band in the light emitting layer in the semiconductor laser device in the eleventh example.

FIGS. 28 and 29 are diagrams each showing respective energy bands in the n-type cladding layer 6, the p-type layer of the opposite conduction type 19, the light emitting layer 8, and the p-type cladding layer 10b in the semiconductor laser device in the eleventh example.

As shown in FIG. 28, a p-type layer of the opposite conduction type 19 having a wider bandgap than that of the light emitting layer 8 is formed on the side of a [000$\bar{1}$] direction, that is, on the lower-energy side of the energy band, of the light emitting layer 8. The bandgap of the p-type layer of the opposite conduction type 19 is narrower than the bandgap of the n-type cladding layer 6. Accordingly, the refractive index of the n-type layer of the opposite conduction type 19 is higher than the refractive index of the n-type cladding layer 6. Consequently, the p-type layer of the opposite conduction type 19 also functions as an optical guide layer.

In this example, the p-type layer of the opposite conduction type 19 having a wider bandgap than that of the light emitting layer 8 is formed on the side of the [000$\bar{1}$] direction, that is, on the lower-energy side of the energy band, of the light emitting layer 8, as shown in FIG. 28. Accordingly, holes are moved in a [0001] direction, as shown in FIG. 29, so that the holes and the ionized acceptor levels are spatially separated from each other. Consequently, a potential gradient in the light emitting layer 8 which occurs due to a piezoelectric effect is decreased, and the energy band gradient is also decreased. As a result, electrons and the holes which are injected as current are prevented from being separated from each other, thereby preventing luminous efficiency from being reduced and preventing threshold current from being raised.

Although in the example, description was made of a case where the light emitting layer 8 has the single layer structure, the light emitting layer 8 may have an MQW structure. Further, p-type impurities and/or n-type impurities may be nonuniformly doped into the light emitting layer 8 having the MQW structure. In this case, the potential gradient in the light emitting layer 8 can be further decreased.

Furthermore, in the example, a cladding layer composed of AlGaN and having a wider bandgap than that of the p-type layer of the opposite conduction type 19 may be formed between the n-type cladding layer 6 and the p-type layer of the opposite conduction type 19. The cladding layer allows a structure in which the p-type layer of the opposite conduction type 19 functioning as an optical guide layer is separated from the light emitting layer 8. An example of the cladding layer having a wider bandgap than that of the p-type layer of the opposite conduction type 19 is $Al_xGa_{1-x}N$ having a thickness of approximately 1 to 100 nm. In this case, it is preferable that $0 \leq X \leq 0.1$. The conductivity type of the cladding layer 18 may have insulating properties, or may be an n-type or a p-type. When the n-type cladding layer is formed, the concentration of donor levels formed in the cladding layer must be lower than the concentration of the acceptor levels formed in the p-type layer of the opposite conduction type 19.

Although in the examples, description was made of a case where the p-type layer of the opposite conduction type 19 has a narrower bandgap than that of the n-type cladding layer 6, the bandgap of the p-type layer of the opposite conduction type 19 may be the same as the bandgap of the n-type cladding layer 6. The bandgap of the p-type layer of the opposite conduction type 19 may be wider than the bandgap of the n-type cladding layer 6. In this case, the p-type layer of the opposite conduction type 19 does not function as an optical guide layer.

In the above-mentioned first to eleventh examples, description was made of a case where the semiconductor laser device has an n-type layer of the opposite conduction type or a p-type layer of the opposite conduction type, the n-type layer of the opposite conduction type and the p-type layer of the opposite conduction type may be simultaneously formed. For example, the first example and the eleventh example may be combined with each other. In this case, the effect of preventing luminous efficiency from being reduced is further heightened.

Although in the above-mentioned first to eleventh examples, description was made of a case where the n-type layer of the opposite conduction type 9 and the p-type layer of the opposite conduction type 19 are composed of GaN, a material composing the n-type layer of the opposite conduction type and the p-type layer of the opposite conduction type is not limited to the same. The n-type layer of the opposite conduction type and the p-type layer of the opposite conduction type may be composed of InGaN, AlGaInN, AlGaN, etc. having a wider bandgap than that of the light emitting layer 8. Even in a case where the n-type layer of the opposite conduction type and the p-type layer of the opposite conduction type which are composed of such a material are formed, it is preferable that the thickness of each of the n-type layer of the opposite conduction type and the p-type layer of the opposite conduction type is approximately 1 to 100 nm, and the concentration of the acceptor levels or the donor levels is approximately $1 \times 10^{17}$ to $3 \times 10^{18}$ cm$^{-3}$ For example, in the first to tenth examples, an n-InGaN layer, an n-AlGaInN layer, or an n-AlGaN layer having a bandgap which is larger than that of the light emitting layer 8 and is the same as or wider than that of the p-type cladding layer 10 composed of p-AlGaN may be formed as the n-type layer of the opposite conduction type.

Alternatively, an n-InGaN layer, an n-AlGaInN layer, or an n-AlGaN layer having a bandgap which is wider than that of the light emitting layer 8 and is narrower than that of the p-type cladding layer 10 composed of p-AlGaN may be formed as the n-type layer of the opposite conduction type. In this case, the refractive index of the n-type layer of the opposite conduction type is larger than the refractive index of the p-type cladding layer 10. Accordingly, the n-type layer of the opposite conduction type also functions as an optical guide layer.

On the other hand, in the eleventh example, a p-InGaN layer, a p-AlGaInN layer, or a p-AlGaN layer having a bandgap which is wider than that of the light emitting layer 8 and is the same as or wider that of the n-type cladding layer 6 composed of n-AlGaN may be formed as the p-type layer of the opposite conduction type.

Alternatively, a p-InGaN layer, a p-AlGaInN layer, or a p-AlGaN layer having a bandgap which is wider than that of the light emitting layer 8 and is narrower than that of the n-type cladding layer 6 composed of n-AlGaN may be formed as the p-type layer of the opposite conduction type. In this case, the refractive index of the p-type layer of the opposite conduction type is higher than the refractive index of the n-type cladding layer 6. Accordingly, the p-type layer of the opposite conduction type also functions as an optical guide layer.

In the above-mentioned first to eleventh examples, the sapphire substrate 1 is used as a substrate, substrates composed of spinel, SiC, Si, GaAs, GaP, InP, GaN, etc., may be used, provided that the nitride based semiconductor layer has a wurtzite structure.

In the above-mentioned first to eleventh examples, description was made of the light emitting layer 8 having a wurtzite structure having a compressive strain in its in-plane direction as well as a strain extending in a direction perpendicular to its interface. In the case of a light emitting device having a light emitting layer 8 having a wurtzite structure having a strain extending in its in-plane direction as well as a compressive strain in a direction perpendicular to its interface, and having an n-type layer on the side of a [0001] direction and a p-type layer on the side of a [000$\bar{1}$] direction, however, the position where an n-type layer of the opposite conduction type or a p-type layer of the opposite conduction type is formed may be reverse to that in the first to eleventh examples with respect to a (0001) plane at the center of the light emitting layer. Further, in a case where at least one of n-type impurities and p-type impurities are nonuniformly added to the light emitting layer having an MQW structure, the position where the p-type impurities or the n-type impurities are distributed by doping may be reverse to that in the second to eighth examples with respect to a (0001) plane at the center of a quantum well layer.

Furthermore, the same effect is obtained if the semiconductor has a wurtzite structure or a Hexagonal structure, including a II–VI group compound semiconductor, represented by ZnSe having a wurtzite structure. However, in the case of the II–VI group compound semiconductor and a I–VII group compound semiconductor represented by CuCl, the potential gradient is reversed.

Additionally, the principal-plane direction of the light emitting layer is not limited to a (0001) plane, provided that the direction perpendicular to the interface of the light emitting layer is the direction in which the potential gradient is generated by a strain. If the principal-plane direction of the strained light emitting layer is any plane direction other than a direction of a plane including a [0001] axis, a potential gradient occurs by the strain in the direction perpendicular to the light emitting layer due to symmetry of a crystal having a wurtzite structure. That is, if the principal-plane direction of the strained light emitting layer is any plane direction other than a principal-plane direction represented by a general formula (HKL0), a piezoelectric effect exists. H, K, and L are arbitrary numbers satisfying H+K+L=0 and excluding H=K=L=0. The above-mentioned (HKL0) plane is a (1$\bar{1}$00) plane and a (11$\bar{2}$0) plane, for example. Particularly in the strained light emitting layer having a (0001) plane as its principal plane, a piezoelectric effect for generating a potential gradient in the direction perpendicular to the interface of the light emitting layer is the greatest. However, there is a specific plane direction in which the piezoelectric effect does not accidentally exist by piezoelectric stress coefficients depending on the material. The principal-plane direction of the light emitting layer in which a strain generates a potential gradient will be described later.

(B) Second Embodiment

A light emitting device according to a second embodiment has a light emitting layer having a zinc-blende structure having a (111) plane as its principal plane. The light emitting layer has a strain in a direction perpendicular to its plane (a direction perpendicular to its interface). A piezoelectric effect in the light emitting layer generates a potential gradient.

The light emitting layer having the strain may have a single layer structure. Alternatively, it may have an SQW structure with one quantum well layer interposed between two barrier layers, or may have an MQW structure obtained by alternately stacking two or more well layers and three or more barrier layers. In the light emitting layer having the quantum well structure such as the SQW structure or the MQW structure, the well layer has a strain, and the piezoelectric effect generates a potential gradient in the well layer.

The light emitting layer is arranged so as to be interposed between a p-type layer and an n-type layer. A p-electrode is formed in the p-type layer, and holes are injected into the p-type layer from the p-electrode. An n-electrode is formed in the n-type layer, and electrons are injected into the n-type layer from the n-electrode.

In a III–V group compound semiconductor, when a light emitting layer has a strain extending in its in-plane direction (a direction parallel to its interface) and has a compressive strain in a direction perpendicular to the interface of the light emitting layer, a potential is high on the side of a [111] direction, while being low on the side of a [$\bar{1}\bar{1}\bar{1}$] direction in a potential gradient in the light emitting layer generated by a piezoelectric effect. In a light emitting device having such strains in its light emitting layer, and having a p-type layer on the side of the [1̄1̄1̄] direction and an n-type layer on the side of the [111] direction, a potential in the light emitting layer is lower on the side of the n-type layer than that on the side of the p-type layer. When the light emitting layer has the quantum well structure, the potential In the quantum well layer is lower on the side of the n-type layer than that on the side of the p-type layer. In order to decrease the potential gradient generated by the piezoelectric effect, an n-type layer of the opposite conduction type having a wider bandgap than that of the light emitting layer is formed between the p-type layer and the light emitting layer. Alternatively, a p-type layer of the opposite conduction type having a wider bandgap than that of the light emitting layer is formed between the n-type layer and the light emitting layer. In both a case where the light emitting layer has the single layer structure and a case where it has the quantum well structure, the same effect is also obtained by such a method.

Furthermore, when the light emitting layer has the quantum well structure, acceptor levels or donor levels are nonuniformly formed in the quantum well layer, thereby making it possible to further decrease the potential gradient in the light emitting layer generated by the piezoelectric effect. In this case, a lot of acceptor levels are formed in a portion, on the side of the [111] direction, of the quantum well layer, or are formed in a portion, in contact with an interface of the quantum well layer on the side of the [111] direction, of the barrier layer. Alternatively, a lot of donor levels are formed in a portion, on the side of the [1̄1̄1̄] direction, of the quantum well layer, or are formed in a portion, in contact with an interface of the quantum well layer on the side of the [1̄1̄1̄] direction, of the barrier layer.

Conversely, in the III–V group compound semiconductor, when the light emitting layer has a compressive strain in its in-plane direction (a direction parallel to its interface) and has a strain extending in a direction perpendicular to the interface of the light emitting layer, a potential is high on the side of the [1̄1̄1̄] direction, while being low on the side of the [111] direction in the potential gradient in the light emitting layer generated by the piezoelectric effect. In a light emitting device having such strains in its light emitting layer, and having a p-type layer on the side of the [111] direction and an n-type layer on the side of the [1̄1̄1̄] direction, the potential in the light emitting layer is lower on the side of the n-type layer than that on the side of the p-type layer. When the light emitting layer has the quantum well layer, the potential in the quantum well structure is lower on the side of the n-type layer than that on the side of the p-type layer. In order to decrease the potential gradient which occurs due to the piezoelectric effect, an n-type layer of the opposite conduction type having a wider bandgap than that of the light emitting layer is formed between the p-type layer and the light emitting layer. Alternatively, a p-type layer of the opposite conduction type having a wider bandgap than that of the light emitting layer is formed between the n-type layer and the light emitting layer. In both a case where the light emitting layer has the single layer structure and a case where it has the quantum well structure, the same effect is also obtained by such a method.

Furthermore, when the light emitting layer has the quantum well structure, acceptor levels or donor levels are nonuniformly formed in the quantum well layer, thereby making it possible to further decrease the potential gradient in the light emitting layer generated by the piezoelectric effect. In this case, a lot of acceptor levels are formed in a portion, on the side of the [1̄1̄1̄] direction, of the quantum well layer, or are formed in a portion, in contact with an interface of the quantum well layer on the side of the [1̄1̄1̄] direction, of the barrier layer. Alternatively, a lot of donor levels are formed in a portion, on the side of the [111] direction, of the quantum well layer, or are formed in a portion, in contact with an interface of the quantum well layer on the side of the [111] direction, of the barrier layer.

On the other hand, in a II–VI group compound semiconductor and a I–VII group compound semiconductor, when a light emitting layer has a strain extending in its in-plane direction (a direction parallel to its interface) and has a compressive strain in a direction perpendicular to the interface of the light emitting layer, a potential is high on the side of a [1̄1̄1̄] direction, while being low on the side of a [111] direction in a potential gradient in the light emitting layer generated by a piezoelectric effect. In a light emitting device having such strains, and having a p-type layer on the side of the [111] direction and an n-type layer on the side of the [1̄1̄1̄] direction, an n-type layer of the opposite conduction type having a wider bandgap than that of the light emitting layer is formed between the p-type layer and the light emitting layer in order to decrease the potential gradient generated by the piezoelectric effect. Alternatively, a p-type layer of the opposite conduction type having a wider bandgap than that of the light emitting layer is formed between the n-type layer and the light emitting layer. In both a case where the light emitting layer has the single layer structure and a case where it has the quantum well structure, the same effect is also obtained by such a method.

Furthermore, when the light emitting layer has the quantum well structure, acceptor levels or donor levels are nonuniformly formed in the quantum well layer, thereby making it possible to further decrease the potential gradient in the light emitting layer generated by the piezoelectric effect. In this case, a lot of acceptor levels are formed in a portion, on the side of the [1̄1̄1̄] direction, of the quantum well layer, or are formed in a portion, in contact with an interface of the quantum well layer on the side of the [1̄1̄1̄] direction, of the barrier layer. Alternatively, a lot of donor levels are formed in a portion, on the side of the [111] direction, of the quantum well layer, or are formed in a portion, in contact with an interface of the quantum well layer on the side of the [111] direction, of the barrier layer.

Conversely, in the II–VI group compound semiconductor and the I–VII group compound semiconductor, when the light emitting layer has a compressive strain in its in-plane direction (a direction parallel to its interface) and has a strain extending in a direction perpendicular to the interface of the light emitting layer, a potential is high on the side of the [111] direction, while being low on the side of the [1̄1̄1̄] direction in the potential gradient in the light emitting layer generated by the piezoelectric effect. In a light emitting device having such strains in its light emitting layer, and having a p-type layer on the side of the [1̄1̄1̄] direction and an n-type layer on the side of the [111] direction, the potential in the light emitting layer is lower on the side of the n-type layer than that on the side of the p-type layer. When the light emitting layer has the quantum well structure, the potential in the quantum well layer is lower on the side of the n-type layer than that on the side of the p-type layer. In order to decrease the potential gradient generated by the piezoelectric effect, an n-type layer of the opposite conduction type having a wider bandgap than that of the light emitting layer is formed between the p-type layer and the light emitting layer. Alternatively, a p-type layer of the opposite conduction type having a wider bandgap than that of the light emitting layer is formed between the n-type layer and the light emitting layer. In both a case where the light emitting layer has the single layer structure and a case where it has the quantum well structure, the same effect is also obtained by such a method.

Furthermore, when the light emitting layer has a quantum well structure, acceptor levels or donor levels are nonuniformly formed in the quantum well layer, thereby making it possible to further decrease the potential gradient in the light emitting layer generated by the piezoelectric effect. In this case, a lot of acceptor levels are formed in a portion, on the side of the [111] direction, of the quantum well layer, or are formed in a portion, in contact with an interface of the quantum well layer on the side of the [111] direction, of the barrier layer. Alternatively, a lot of donor levels are formed in a portion, on the side of the [$\overline{1}\overline{1}\overline{1}$] direction, of the quantum well layer, or are formed in a portion, in contact with an interface of the quantum well layer on the side of the [$\overline{1}\overline{1}\overline{1}$] direction, of the barrier layer.

The principal-plane direction of the light emitting layer is not limited to a principal-plane direction equivalent to a (111) plane, provided that the direction perpendicular to the interface of the light emitting layer is the direction in which the potential gradient is generated by a strain. If the principal-plane direction of the strained light emitting layer is any plane direction other than a direction of a plane including a [100] axis and a principal-plane direction equivalent thereto, a potential gradient occurs in the direction perpendicular to the interface of the light emitting layer by the strain. That is, if the principal-plane direction of the strained light emitting layer is any plane direction other than a principal-plane direction represented by a general formula (OMN) and a principal-plane direction equivalent thereto, a piezoelectric effect exists. M and N are arbitrary numbers excluding M=N=0. The above-mentioned (OMN) plane is a (001) plane and a (011) plane, for example. Particularly in the strained light emitting layer having a (111) plane as its principal plane, a piezoelectric effect for generating a potential gradient in the direction perpendicular to the interface of the light emitting layer is the greatest. The principal-plane direction of the light emitting layer in which a strain generates a potential gradient will be described later.

(12) TWELFTH EXAMPLE

Figure 30:
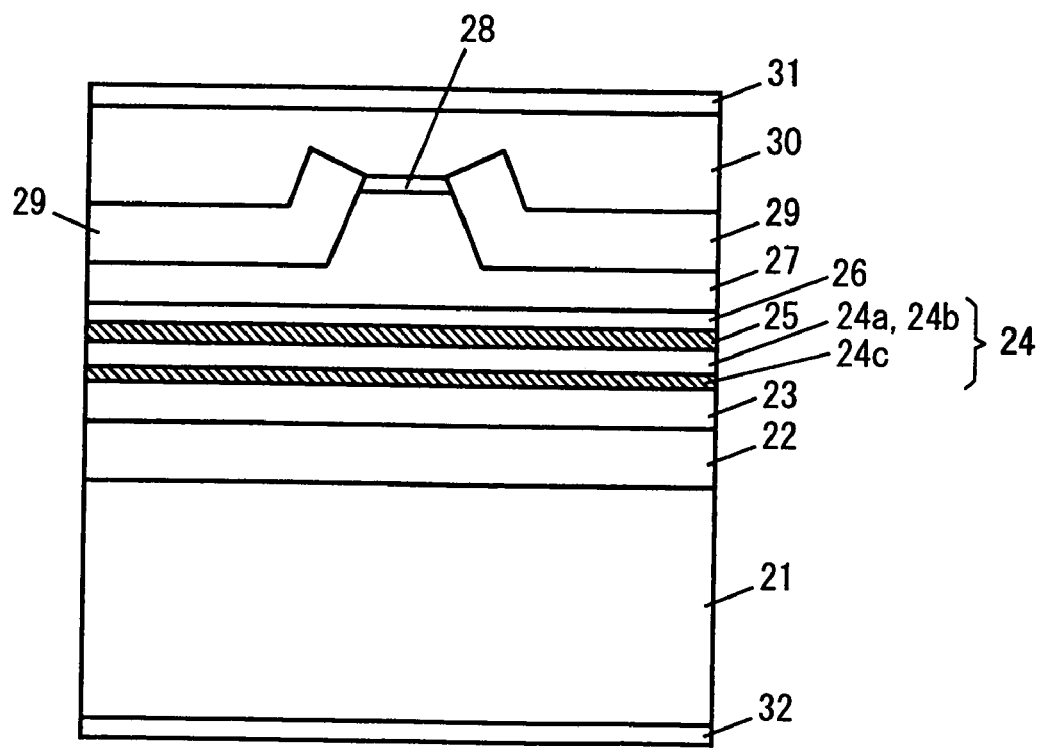
FIG. 30 is a schematic sectional view showing the structure of an AlGaInP based semiconductor laser device having a buried ridge structure in a twelfth example of the present invention.
Figure 31:
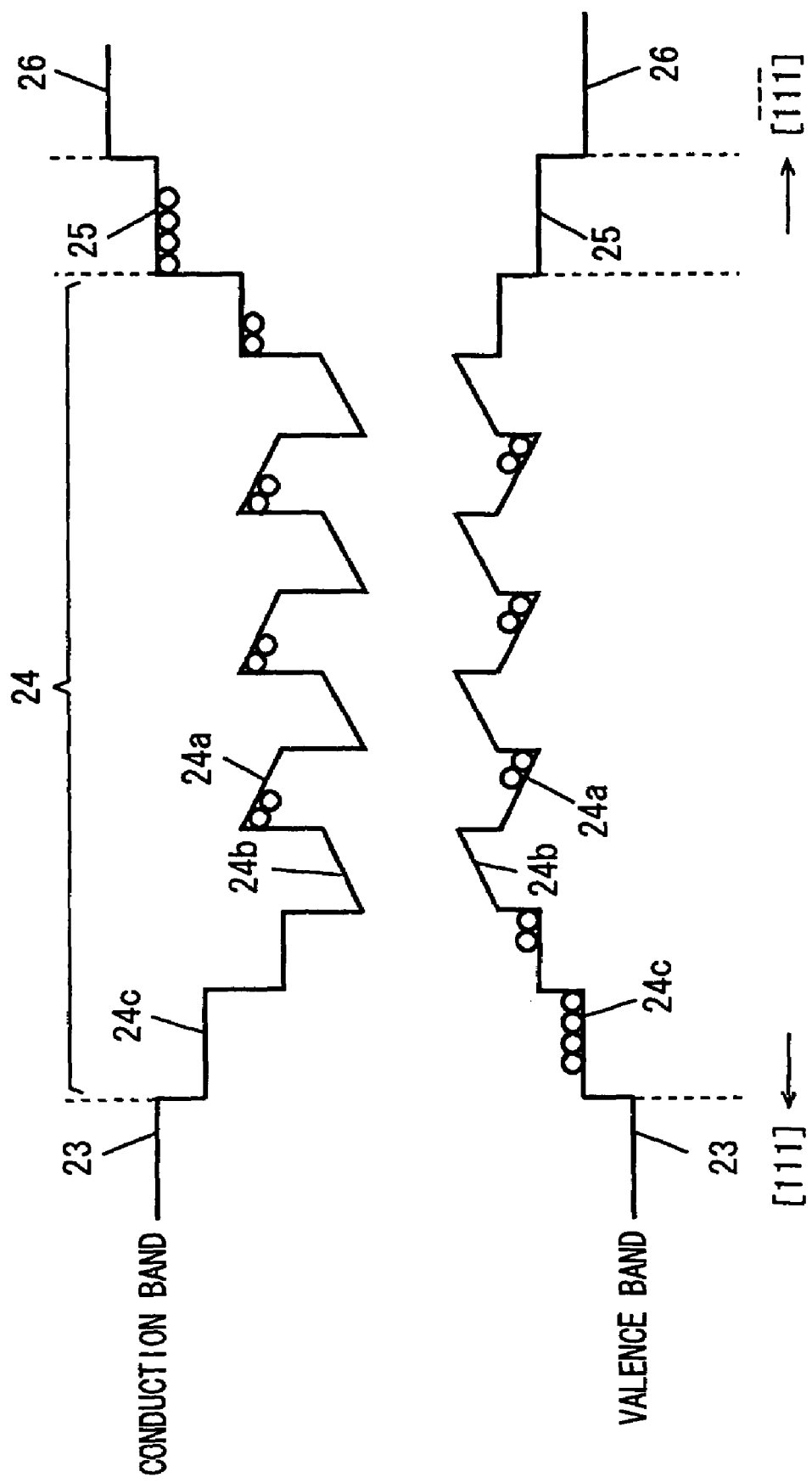
FIG. 31 is a diagram showing an energy band in an MQW light emitting layer in the semiconductor laser device in the twelfth example.
Figure 32:
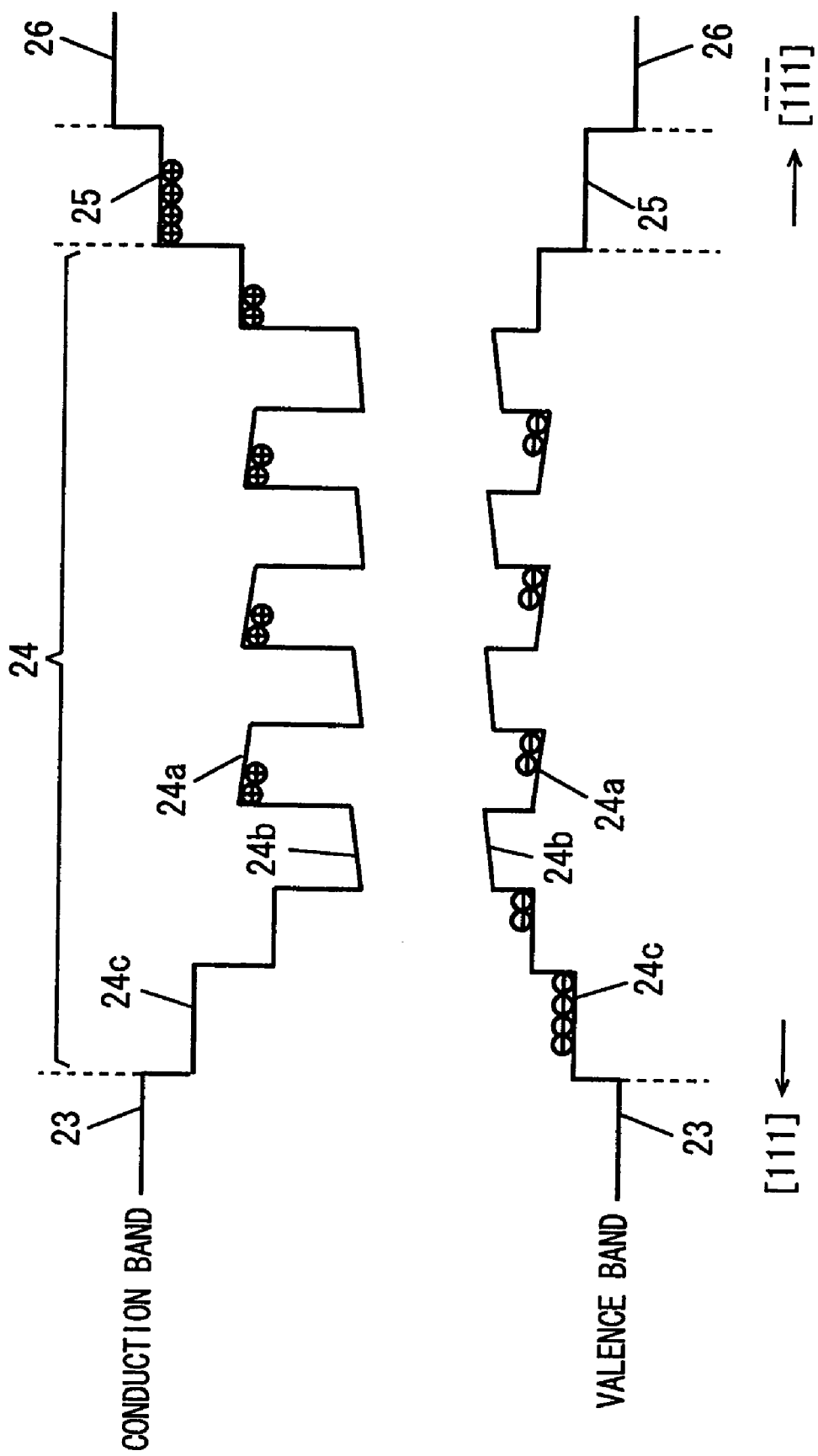
FIG. 32 is a diagram showing an energy band in the MQW light emitting layer in the semiconductor laser device in the twelfth example.

FIG. 30 is a cross-sectional view showing the structure of an AlGaInP based semiconductor laser device having a buried ridge structure in a twelfth example of the present invention. The semiconductor laser device in the twelfth example has an MQW light emitting layer having a multiple quantum well (MQW) structure. FIGS. 31 and 32 are diagrams each showing an energy band in the MQW light emitting layer in the semiconductor laser device in the twelfth example.

In FIG. 30, an n-GaAs substrate 21 has a (111)B surface. An n-type buffer layer 22 composed of n-Ga$_{0.51}$In$_{0.49}$P, an n-type cladding layer 23 composed of n-(Al$_{0.7}$Ga$_{0.3}$)$_{0.51}$In$_{0.49}$P, and an MQW light emitting layer 24 are formed in this order on the n-GaAs substrate 21.

The MQW light emitting layer 24 is constructed by alternately stacking five compressive strain barrier layers 24a composed of (Al$_{0.5}$Ga$_{0.5}$)$_{0.45}$In$_{0.55}$P and four tensile strain well layers 24b composed of Ga$_{0.6}$In$_{0.4}$P on an optical guide layer 24c composed of p-(Al$_{0.5}$Ga$_{0.5}$)$_{0.51}$In$_{0.49}$P, as shown in FIG. 31. In the present embodiment, the optical guide layer 24c corresponds to a p-type layer of the opposite conduction type.

An optical guide layer 25 composed of n-(Al$_{1.57}$Ga$_{0.43}$)$_{0.51}$In$_{0.49}$P is formed on the MQW light emitting layer 24. In the present embodiment, the optical guide layer 25 corresponds to an n-type layer of the opposite conduction type. A multiple quantum barrier (MQB) layer 26 is formed on the optical guide layer 25. The MQB layer 26 is constructed by alternately stacking ten well layers composed of Ga$_{0.51}$In$_{0.49}$P and ten barrier layers composed of (Al$_{0.7}$Ga$_{0.3}$)$_{0.51}$In$_{0.49}$P. The MQB layer 26 is provided in order to improve temperature characteristics.

A p-type cladding layer 27 composed of p-(Al$_{0.7}$Ga$_{0.3}$)$_{0.51}$In$_{0.49}$P is formed on the MQB layer 26. An upper region of the p-type cladding layer 27 is formed into a striped ridge portion by mesa etching or the like. The width of the ridge portion is 5 μm. A p-type contact layer 28 composed of p-Ga$_{0.51}$In$_{0.49}$P is formed on the ridge portion of the p-type cladding layer 27.

An n-type current-blocking layer 29 composed of n-GaAs is formed on both sides of the p-type cladding layer 27, and a p-type cap layer 30 composed of p-GaAs is formed on the p-type contact layer 28 and the n-type current-blocking layer 29. An n-electrode 32 is formed on a lower surface of the n-GaAs substrate 21, and a p-electrode 31 is formed on an upper surface of the p-type cap layer 30.

Table 1 shows a material for each of the layers in the semiconductor laser device shown in FIG. 30 and the thickness thereof.

TABLE 1

| | | Material | Thickness |
|---|---|---|---|
| n-type buffer layer 22 | | n-Ga$_{0.51}$In$_{0.49}$P | 0.3 μm |
| n-type cladding layer 23 | | n-(Al$_{0.7}$Ga$_{0.3}$)$_{0.51}$In$_{0.49}$P | 0.8 μm |
| MQW active layer 24 | optical guide layer 24c | p-(Al$_{0.5}$Ga$_{0.5}$)$_{0.51}$In$_{0.49}$P | 50 nm |
| | barrier layer 24a | (Al$_{0.5}$Ga$_{0.5}$)$_{0.45}$In$_{0.55}$P | Each 4 nm |
| | well layer 24b | Ga$_{0.6}$In$_{0.4}$P | Each 10 nm |
| optical guide layer 25 | | n-(Al$_{0.57}$Ga$_{0.43}$)$_{0.51}$In$_{0.49}$P | 30 nm |
| multiple quantum barrier layer 26 | well layer | Ga$_{0.51}$In$_{0.49}$P | Each 1.1 nm |
| | barrier layer | (Al$_{0.7}$Ga$_{0.3}$)$_{0.51}$In$_{0.49}$P | Each 1.7 nm |
| p-type cladding layer 27 | | p-(Al$_{0.7}$Ga$_{0.3}$)$_{0.51}$In$_{0.49}$P | 0.8 μm |
| p-type contact layer 28 | | p-Ga$_{0.51}$In$_{0.49}$P | 0.1 μm |
| n-type current-blocking layer 29 | | n-GaAs | 0.8 μm |
| p-type cap layer 30 | | p-GaAs | 3 μm |

In the semiconductor laser device, each of the layers 22 to 30 on the n-GaAs substrate 21 is formed by MOVPE or the like.

The lattice constant of the compressive strain barrier layer 24a is set to a value larger than the lattice constant of the n-GaAs substrate 21. Consequently, the compressive strain barrier layer 24a has a compressive strain with respect to the n-GaAs substrate 21. The lattice constant of the tensile strain well layer 24b is set to a value smaller than the lattice constant of the n-GaAs substrate 21. Consequently, the tensile strain well layer 24b has a tensile strain with respect to the n-GaAs substrate 21.

As shown in FIG. 31, in this example, a p-type optical guide layer 24c having a bandgap which is narrower than that of the n-type cladding layer 23 and is larger than those of the compressive strain barrier layer 24a and the tensile strain well layer 24b is formed as a p-type layer of the opposite conduction type. Further, an n-type optical guide layer 25 having a bandgap which is wider than those of the compressive strain barrier layer 24a and the tensile strain well layer 24b and is narrower than that of the MQB layer 26 is formed as an n-type layer of the opposite conduction type.

Furthermore, a lot of Se, for example, is doped as n-type impurities into a portion, in contact with an interface of the tensile strain well layer 24b on the side of a $[\bar{1}\bar{1}\bar{1}]$ direction, that is, on the side of the optical guide layer 25, of the compressive strain barrier layer 24a, and a lot of Zn, for example, is doped as p-type impurities into a portion, in contact with an interface of the tensile strain well layer 24b on the side of a [111] direction, that is, on the side of the optical guide layer 24c, of the compressive strain barrier layer 24a. Accordingly, the compressive strain barrier layer 24a has a delta-doping structure. In this example, description is made of a case where the respective doping concentrations of the n-type impurities and the p-type impurities are approximately equal to each other.

In this example, the well layer 24b and the barrier layer 24a respectively have a tensile strain and a compressive strain in an in-plane direction of a quantum well in the MQW light emitting layer 24. Accordingly, a potential gradient reverse to that in the well layer 24b occurs in the barrier layer 24a. Therefore, in the energy band in the MQW light emitting layer 24, the energy band in the barrier layer 24a is higher on the side of the [111] direction than that on the side of the $[\bar{1}\bar{1}\bar{1}]$ direction, and the energy band in the well layer 24b is higher on the side of the $[\bar{1}\bar{1}\bar{1}]$ direction than that on the side of the [111] direction.

In the present embodiment, electrons and holes are compensated for, as shown in FIG. 32, so that few carriers by doping are generated. However, the potential gradient in the tensile strain well layer 24b is decreased by ionized p-type impurities and ionized n-type impurities. As a result, the electrons and the holes which are injected as current are prevented from being separated from each other, thereby preventing luminous efficiency from being reduced and preventing threshold current from being raised.

(13) THIRTEENTH EXAMPLE

Figure 33:
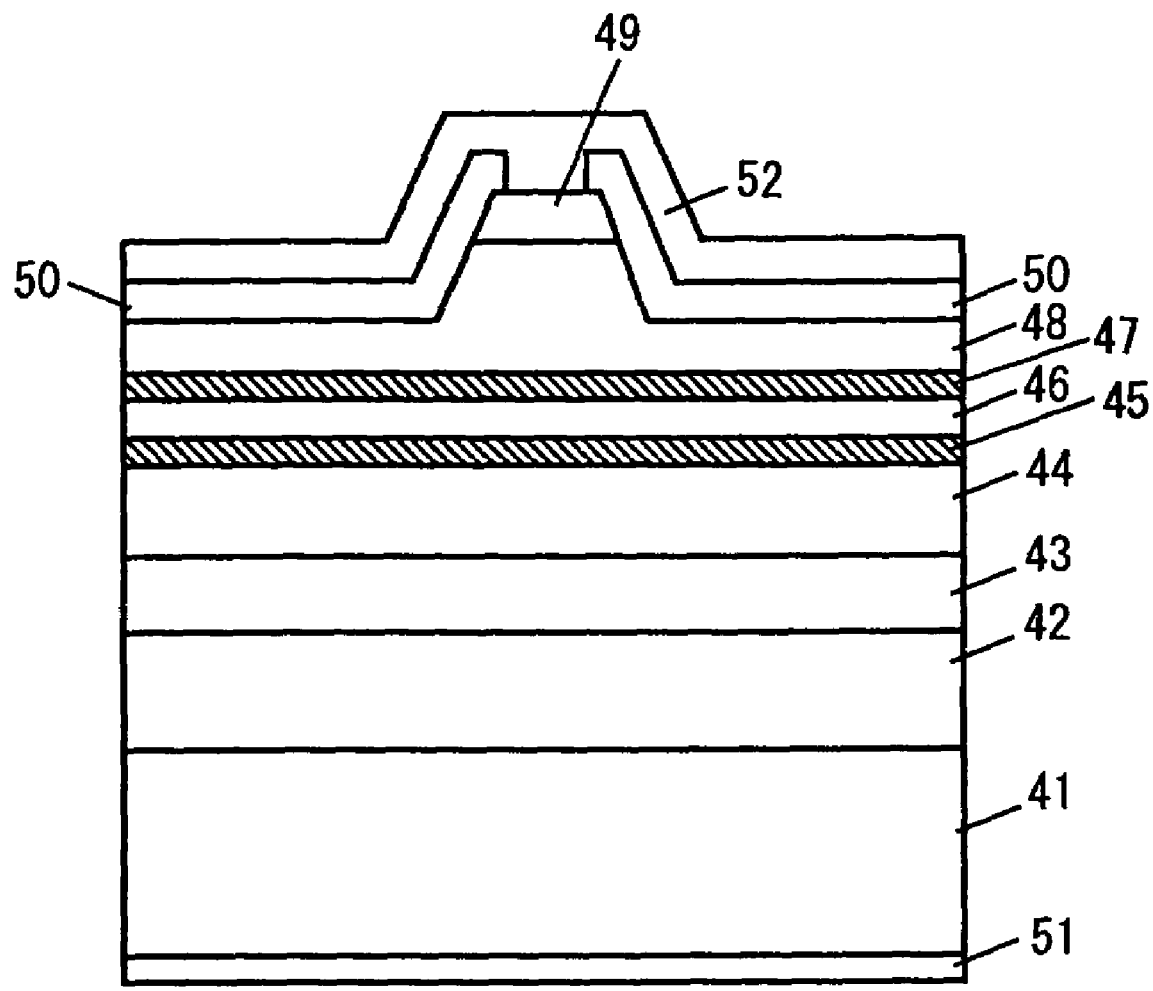
FIG. 33 is a schematic sectional view showing the structure of a ZnSe based semiconductor laser device in a thirteenth example of the present invention.
Figure 34:
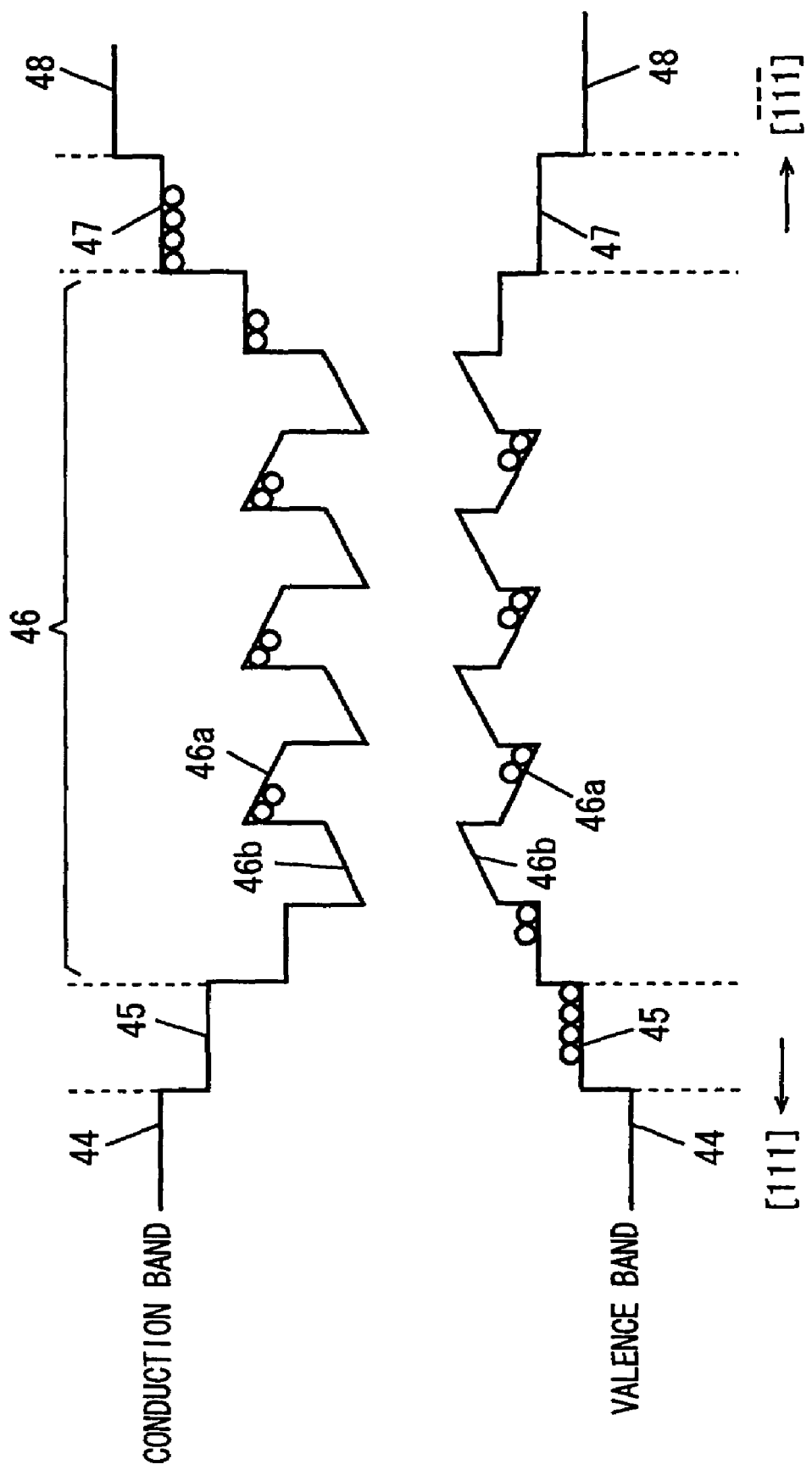
FIG. 34 is a diagram showing an energy band in an MQW light emitting layer in the semiconductor laser device in the thirteenth example.
Figure 35:
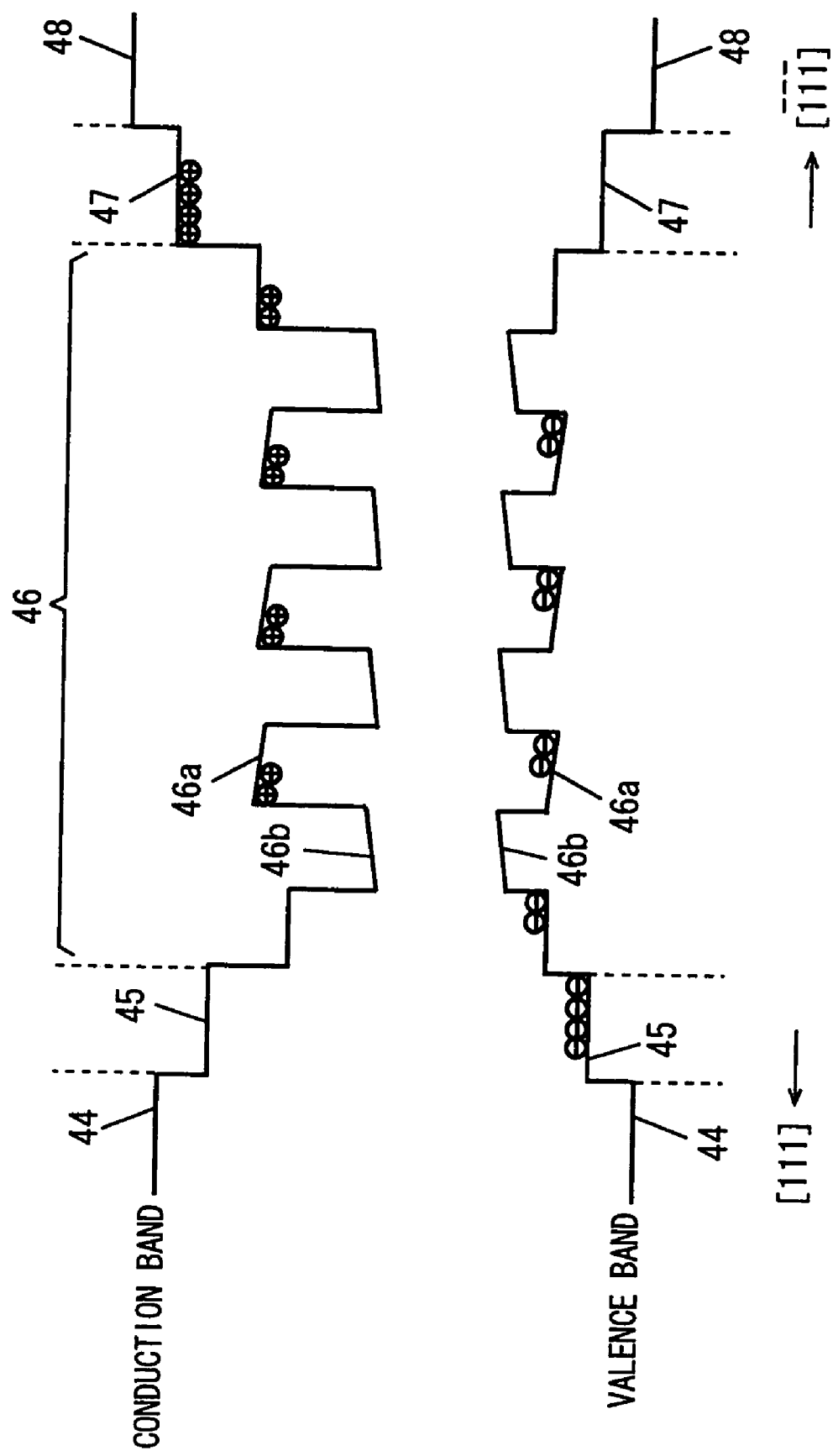
FIG. 35 is a diagram showing an energy band in the MQW light emitting layer in the semiconductor laser device in the thirteenth example.

FIG. 33 is a cross-sectional view showing the structure of a ZnSe based semiconductor laser device in a thirteenth example of the present invention. The semiconductor laser device in the thirteenth example has an MQW light emitting layer having an MQW structure. FIGS. 34 and 35 are diagrams each showing an energy band in the MQW light emitting layer in the semiconductor laser device in the thirteenth example.

In FIG. 33, an n-type first buffer layer 42 composed of n-GaAs, an n-type second buffer layer 43 composed of n-ZnSe, an n-type cladding layer 44 composed of n-$Zn_{0.9}Mg_{0.1}S_{0.15}Se_{0.85}$, a p-type layer of the opposite conduction type 45 composed of p-$ZnS_{0.15}Se_{0.85}$, and an MQW light emitting layer 46 are formed in this order on a (111)B surface of an n-GaAs substrate 41.

The MQW light emitting layer 46 is constructed by alternately stacking five tensile strain barrier layers 46a composed of $ZnS_{0.1}Se_{0.9}$ and four compressive strain well layers 46b composed of $Zn_{0.7}Cd_{0.3}Se$, as shown in FIG. 34.

An n-type layer of the opposite conduction type 47 composed of n-$ZnS_{0.15}Se_{0.85}$ and a p-type cladding layer 48 composed of p-$Zn_{0.9}Mg_{0.1}S_{0.15}Se_{0.85}$ are formed on the MQW light emitting layer 46. An upper region of the p-type cladding layer 48 is a striped ridge portion.

A p-type contact layer 49 composed of p-ZnSe is formed on the ridge portion of the p-type cladding layer 48, and an $SiO_2$ film 50 is formed on both sides of the ridge portion of the p-type cladding layer 48 and the p-type contact layer 49. An n-electrode 51 is formed on a lower surface of the n-GaAs substrate 41, and a p-electrode 52 is formed on the p-type contact layer 49 and the $SiO_2$ layer 50.

Table 2 shows a material for each of the layers in the semiconductor laser device shown in FIG. 33 and the thickness thereof.

TABLE 2

| | | Material | Thickness |
|---|---|---|---|
| n-type first buffer layer 42 | | n-GaAs | 1 μm |
| n-type second buffer layer 43 | | n-ZnSe | 1 μm |
| n-type cladding layer 44 | | n-$Zn_{0.9}Mg_{0.1}S_{0.15}Se_{0.85}$ | 1 μm |
| p-type layer of the opposite conduction type 45 | | p-$ZnS_{0.15}Se_{0.85}$ | 30 nm |
| MQW active layer 46 | tensile strain barrier layer 46a | $ZnS_{0.1}Se_{0.9}$ | Each 5 nm |
| | compressive strain well layer 46b | $Zn_{0.7}Cd_{0.3}Se$ | Each 5 nm |
| n-type layer of the opposite conduction type 47 | | n-$Zn_{0.15}Se_{0.85}$ | 30 nm |
| p-type cladding layer 48 | | p-$Zn_{0.9}Mg_{0.1}S_{0.15}Se_{0.85}$ | 1 μm |
| p-type contact layer 49 | | p-ZnSe | 0.5 μm |
| $SiO_2$ layer 50 | | $SiO_2$ | 0.5 μm |

As shown in FIG. 34, in this example, a p-type layer of the opposite conduction type 45 having a bandgap which is narrower than that of the n-type cladding layer 44 and is wider than those of the tensile strain barrier layer 46a and the compressive strain well layer 46b is formed, and an n-type layer of the opposite conduction type 47 having a bandgap which is narrower than that of the p-type cladding layer 48 and is wider than those of the tensile strain barrier layer 46a and the compressive strain well layer 46b is formed. Furthermore, a lot of Cl, for example, is doped as n-type impurities into a portion, in contact with an interface of the compressive strain well layer 46b on the side of a $[\bar{1}\bar{1}\bar{1}]$ direction, that is, on the side of the p-cladding 48, of the tensile strain barrier layer 46a, and a lot of nitrogen, for example, is doped as p-type impurities into a portion, in contact with an interface of the compressive strain well layer 46b on the side of a [111] direction, that is, on the side of the n-type cladding layer 44, of the tensile strain barrier layer 46a. Accordingly, the tensile strain barrier layer 46a has a delta-doping structure. In the present embodiment, description is made of a case where the respective doping concentrations of the n-type impurities and the p-type impurities are approximately equal to each other.

In the present embodiment, the well layer 46b and the barrier layer 46a respectively have a compressive strain and a tensile strain in an in-plane direction of a quantum well in the MQW light emitting layer 46. Accordingly, a potential gradient reverse to that in the well layer 46b occurs in the barrier layer 46a. Therefore, in the energy band in the MQW light emitting layer 46, the energy band in the barrier layer 46a is higher on the side of the [111] direction than that on the side of the [$\overline{1}\overline{1}\overline{1}$] direction, and the energy band in the well layer 46b is higher on the side of the [$\overline{1}\overline{1}\overline{1}$] direction than that on the side of the [111] direction.

In the present embodiment, electrons and holes are compensated for, as shown in FIG. 35, so that few carriers by doping are generated. However, the potential gradient in the compressive strain well layer 46b is decreased by the ionized p-type impurities and the ionized n-type impurities. As a result, the electrons and the holes which are injected as current are prevented from being separated from each other, thereby preventing luminous efficiency from being reduced and preventing threshold current from being raised.

(C) Third Embodiment

A light emitting device according to a third embodiment has an MQW light emitting layer having a quantum wire structure.

(14) FOURTEENTH EXAMPLE

Figure 36:
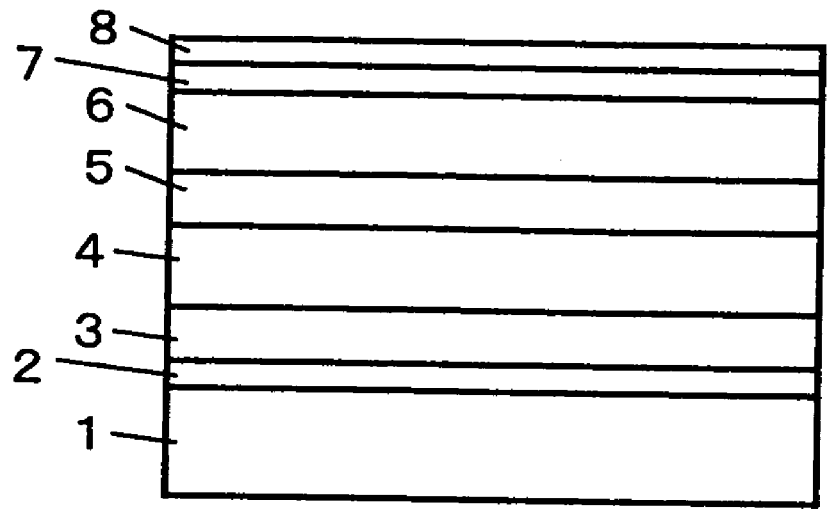
FIG. 36 is a schematic sectional view showing a method of fabricating a semiconductor laser device in a fourteenth example.
Figure 37:
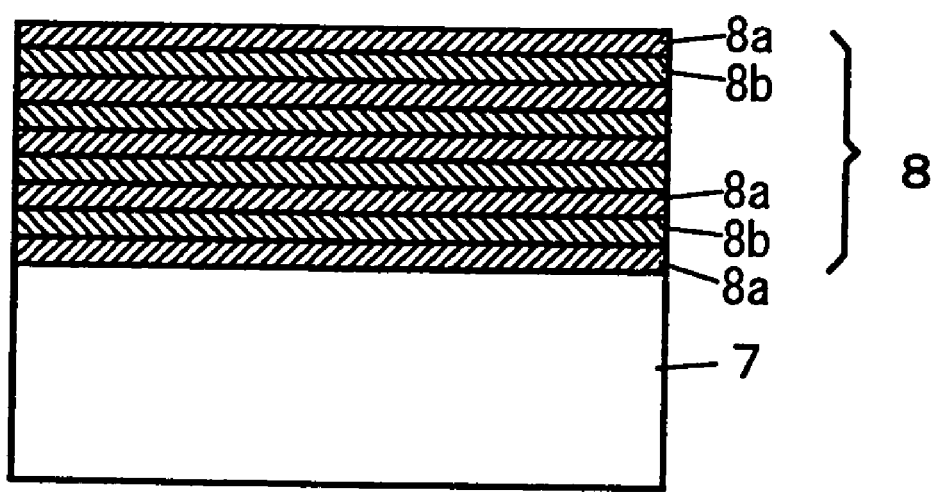
FIG. 37 is an enlarged sectional view of an MQW light emitting layer in the semiconductor laser device in the fourteenth example.
Figure 39:
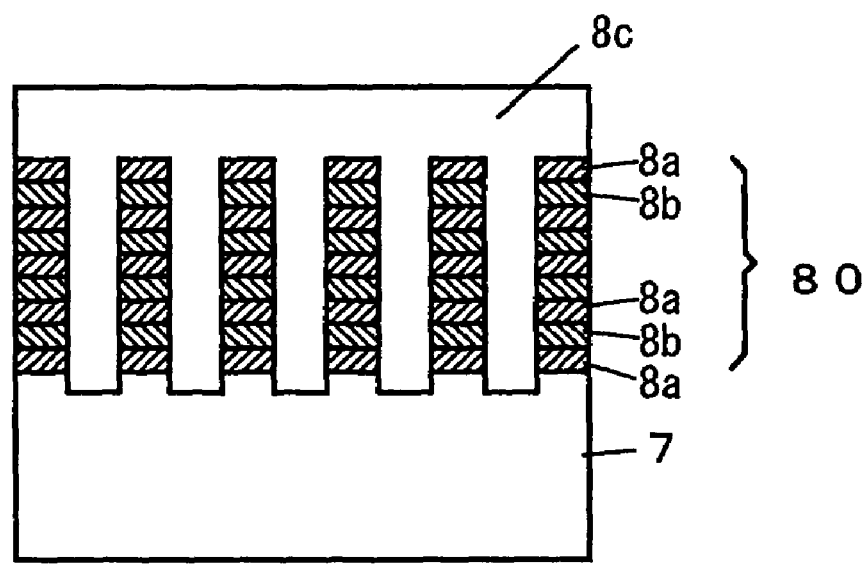
FIG. 39 is an enlarged sectional view of the MQW light emitting layer having the quantum wire structure in the semiconductor laser device in the fourteenth example.
Figure 40:
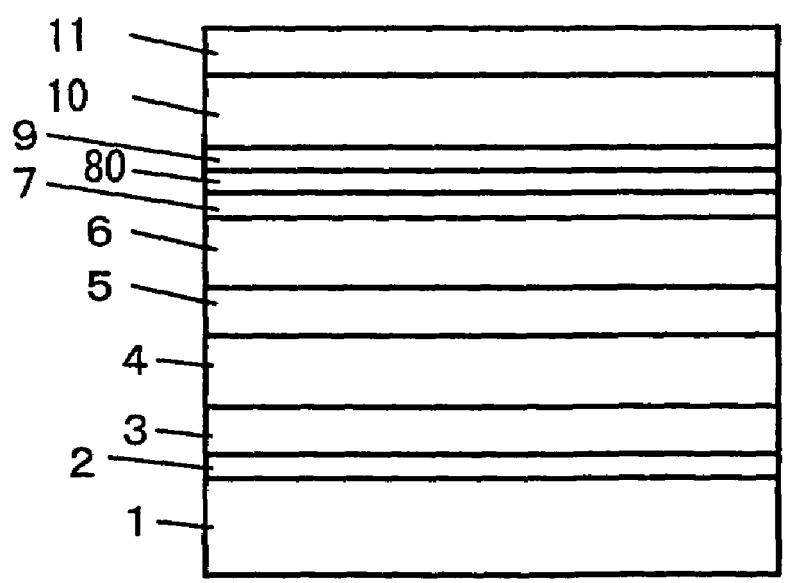
FIG. 40 is a schematic sectional view showing a method of fabricating the semiconductor laser device in the fourteenth example.

FIGS. 36 to 40 illustrate a method of fabricating a semiconductor laser deice in a fourteenth example, where FIG. 36 is a schematic sectional view showing the steps of the method, FIG. 37 is an enlarged sectional view of an MQW light emitting layer, FIGS. 38(a) and 38(b) are respectively an enlarged sectional view and a schematic plan view of the MQW light emitting layer having quantum wires formed therein, FIG. 39 is an enlarged sectional view of an MQW light emitting layer having a quantum wire structure, and FIG. 40 is a schematic sectional view showing the steps of the method.

As shown in FIG. 36, a buffer layer 2, an undoped GaN layer 3, an n-type contact layer 4, an n-type crack-preventing layer 5, an n-type cladding layer 6, an n-type cladding layer 7, and an MQW light emitting layer 8 are grown on a (0001) surface of a sapphire substrate 1 by MOVPE, as in the steps shown in FIG. 19.

As shown in FIG. 37, the MQW light emitting layer 8 is constructed by alternately stacking a plurality of barrier layers 8a and a plurality of quantum well layers 8b. A method of doping impurities into the MQW light emitting layer 8 is the same as those in the second to eighth examples.

As shown in FIG. 38, a part of the MQW light emitting layer 8 is etched in a line shape until it reaches the n-type cladding layer 7 by a focusing ion beam (FIB) or the like, to process the MQW light emitting layer 8 in a line shape. The width of the remaining part of the MQW light emitting layer 8 is approximately 5 nm, for example, and the width of the part etched by the FIB is approximately 20 nm, for example.

Thereafter, an undoped GaN layer 8c is buried in the etched part of the MQW light emitting layer 8, as shown in FIG. 39. Consequently, an MQW light emitting layer 80 having a quantum wire structure is formed.

Furthermore, as shown in FIG. 40, an n-type layer of the opposite conduction type 9, a p-type cladding layer 10, and a p-type cap layer 11 are grown in this order by MOVPE, as in the steps shown in FIG. 19, on the MQW light emitting layer 80. The subsequent steps are the same as the steps shown in FIGS. 20 to 23.

In the semiconductor laser device in this example, a potential gradient is generated in a crystal growth direction on the substrate in the MQW light emitting layer 80 having a quantum wire structure. Therefore, an n-type layer of the opposite conduction type 9 is formed between the MQW light emitting layer 80 and the p-type cladding layer 10, and impurities are nonuniformly doped in the crystal growth direction on the substrate, as in the second to eighth examples. Consequently, a potential gradient generated in the MQW light emitting layer 80 having a quantum wire structure is decreased. As a result, electrons and holes which are injected as current are prevented from being separated from each other, thereby preventing luminous efficiency from being reduced and preventing threshold current from being raised.

In the light emitting layer 80 having a quantum wire structure, the direction in which the potential gradient generated is not limited to the crystal growth direction on the substrate. The potential gradient may, in some cases, be generated in an in-plane direction of the substrate by the principal-plane direction of the substrate, the direction of quantum wires, the shape of the quantum wires, or the line. In such a case, doping may be made nonuniform in the in-plane direction of the substrate by a method such as ion implantation.

Although in the first to fourteenth examples, description was made of a case where the present invention is applied to the semiconductor laser device, the present invention is also applicable to other light emitting devices such as a light emitting diode.

In the first to third embodiments, the same effect is produced if a method of forming acceptor levels or donor levels by lattice defects such as vacancy may be used in addition to the method of doping impurities as a method of forming acceptor levels or donor levels.

○ The principal-plane direction of a light emitting layer in which a strain generates a potential gradient.

A polarization in a direction perpendicular to an interface of a light emitting layer can be calculated in accordance with a document, for example, "PIEZOELECTRICITY Vol. 1 (New Revised Edition)" by W.G. CADY Dover Publications, Inc. New York 1964.

Figure 41:
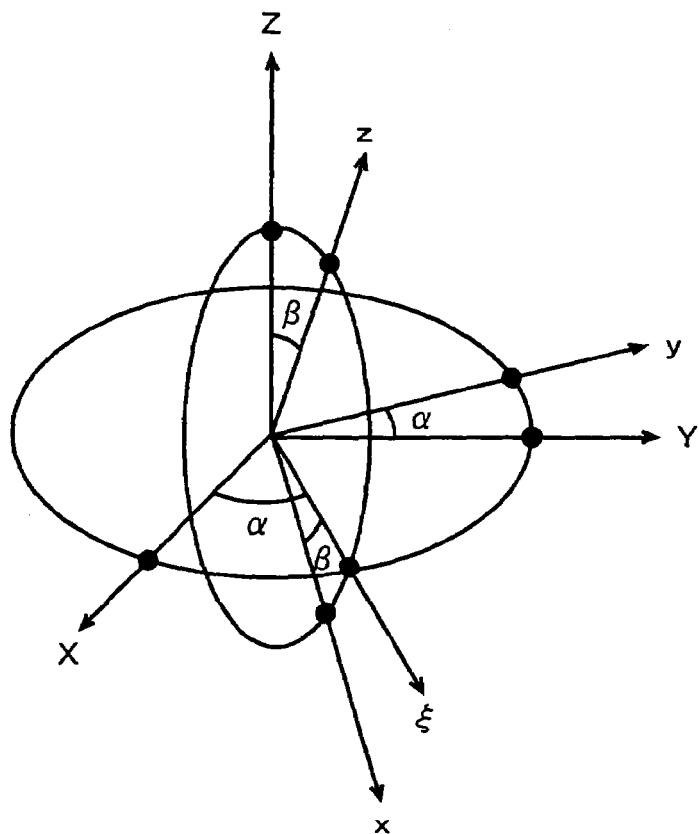
FIG. 41 is a diagram for explaining a principal-plane direction of a quantum well layer where a potential gradient is generated by a strain.
Figure 42:
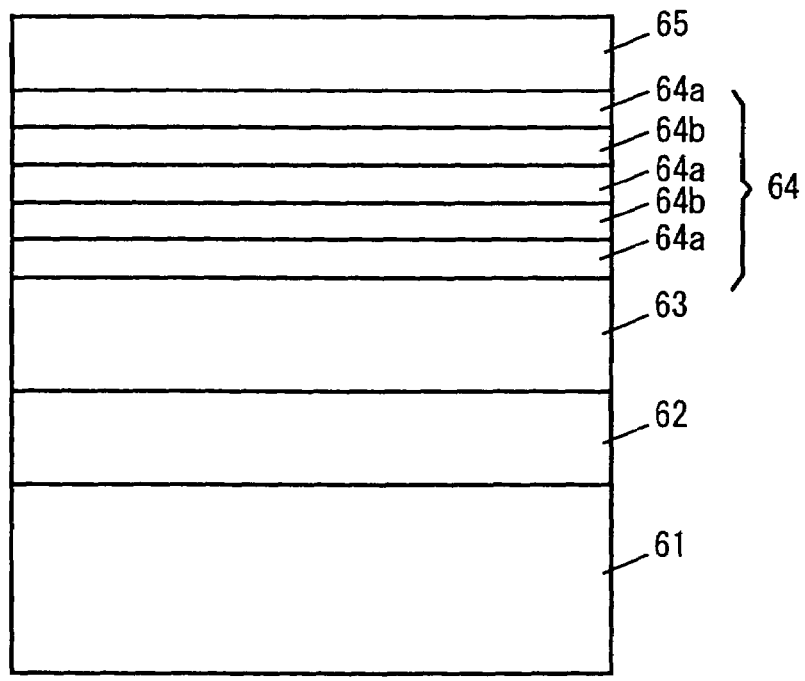
FIG. 42 is a schematic sectional view showing the structure of a conventional GaN based semiconductor light emitting device.
Figure 43:
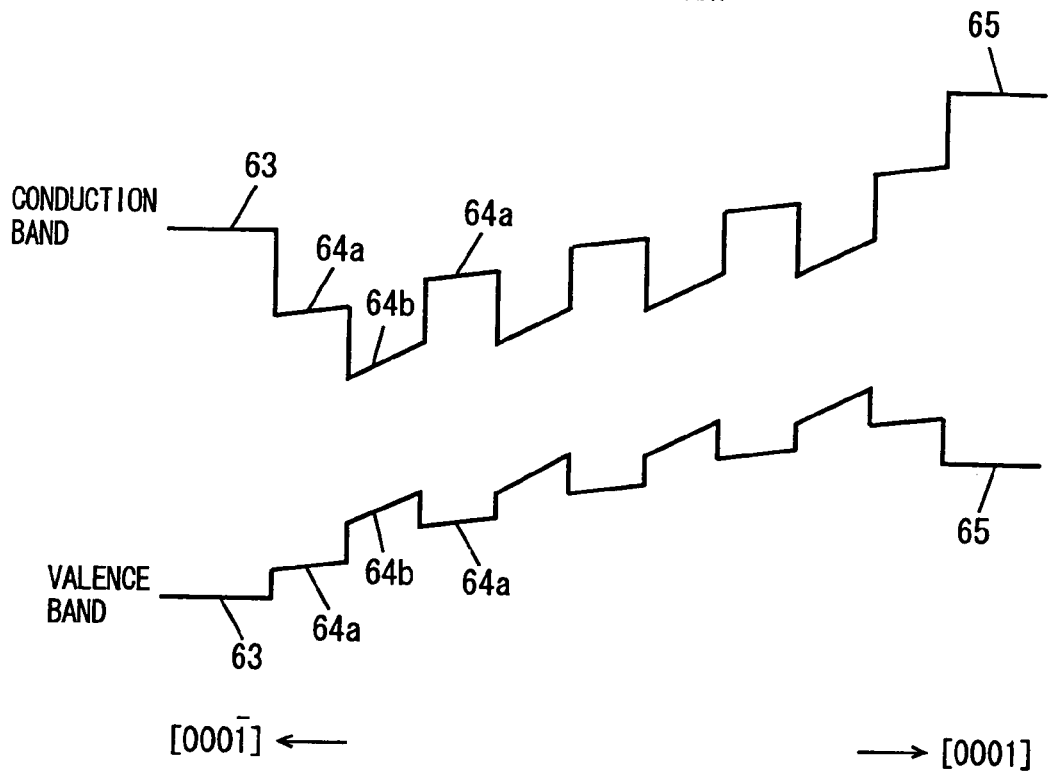
FIG. 43 is a diagram showing an energy band in an MQW light emitting layer in the conventional semiconductor light emitting device.
Figure 44:
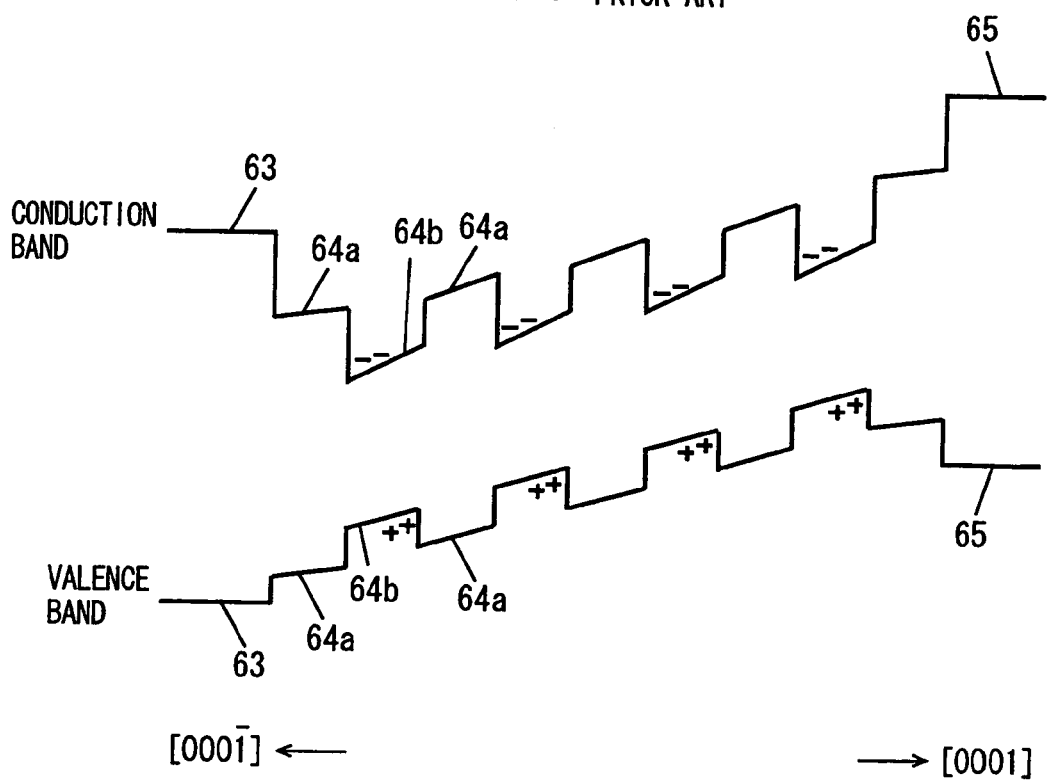
FIG. 44 is a diagram showing an energy band in the MQW light emitting layer in the conventional semiconductor laser device.

In FIG. 41, the Z-axis shall be a direction perpendicular to an interface. The XYZ coordinate system is rotated through an angle α with the Z-axis used as an axis of rotation. As coordinate axes after the rotation, the X-axis is shifted to an ξ-axis, and the Y-axis is shifted to a y-axis.

The ξ yZ coordinate system is rotated through an angle β with the y axis used as an axis of rotation. As coordinate axes after the rotation, the ξ-axis is shifted to an x-axis, and the Z-axis is shifted to a z-axis.

In a crystal having a wurtzite structure, the X-axis is taken as a [$2\overline{1}\overline{1}0$] axis, the Y-axis is taken as a [$01\overline{1}0$] axis, and the Z-axis is taken as a [0001] axis. Further, in a crystal having a zinc-blende structure, the X-axis is taken as a [100] axis, the Y-axis is taken as a [010] axis, and the Z-axis is taken as a [001] axis.

Let $P_z$ be a polarization along the z-axis, let $\epsilon_{xx}$, $\epsilon_{yy}$, $\epsilon_{yz}$, $\epsilon_{xz}$ and $\epsilon_{xy}$ be strain tensors, and let $e_{31}$, $e_{33}$, $e_{15}$, and $e_{14}$ be piezoelectric stress coefficients.

In the normal single layer structure and the normal quantum well structure as in the first to thirteenth examples, the potential gradient is proportional to the polarization $P_z$ along the z-axis, $\epsilon_{xx}=\epsilon_{yy}$, $\epsilon_{yz}=\epsilon_{xx}=\epsilon_{xy}=0$, and the signs of $\epsilon_{xx}$ and $\epsilon_{zz}$ differ from each other.

In the crystal having a wurtzite structure, the polarization $P_z$ along the z-axis is expressed by the following equation:

$$P_z = \epsilon_{xx} \cos\beta(e_{31}\cos^2\beta + e_{33}\sin^2\beta - e_{15}\sin^2\beta) + \epsilon_{yy}e_{-}\cos\beta + \epsilon_{zz}\cos\beta(e_{31}\sin^2\beta + e_{33}\cos^2\beta + e_{15}\sin^2\beta) + \epsilon_{xz}\sin\beta(2e_{31}\cos^2\beta - 2e_{33}\cos^2\beta + e_{15}\sin^2\beta) \quad (1)$$

The polarization $P_z$ along the z-axis is unrelated to $\alpha$. When the angle $\beta$ is 90°, for example, in the crystal having a wurtzite structure from the foregoing equation (1), the polarization $P_z$ along the z-axis is zero. That is, when the z-axis shown in FIG. 36 is on an XY plane, a strain in a direction perpendicular to an interface generates no potential gradient. Consequently, no potential gradient occurs in the direction perpendicular to the interface in a principal-plane direction expressed by a general formula (HKL0) (H, K, and L are arbitrary numbers satisfying H+K+L=0 and excluding H=K=L=0), while a potential gradient is generated in the direction perpendicular to the interface in the other plane directions.

However, there is a specific principal-plane direction in which the piezoelectric effect does not accidentally exist by piezoelectric stress coefficients depending on the material. For example, $e_{31}$=−0.262 C/m$^2$, $e_{33}$=0.385 C/m$^2$, $e_{15}$=−0.183 C/m$^2$ are reported in CdS having a wurtzite structure, while $e_{31}$=−0.160 C/m$^2$, $e_{33=0.347}$ C/m$^2$, and $e_{15}$=−0.138 C/m$^2$ are reported in CdSe having a wurtzite structure. Consequently, there is a principal-plane direction in which piezoelectric effect does not exist because the polarization $P_z$ is zero in the vicinity of $\beta$=50°.

Furthermore, in a crystal having a zinc-blende structure, the polarization $P_z$ along the z-axis is expressed by the following equation:

$$P_z = \epsilon_{xx} e_{14} \sin \alpha \cos \alpha \cos \beta (\cos^2 \beta - \sin^2 \beta) - \epsilon_{yy} e_{14} \sin \alpha \cos \alpha \cos \beta + 3\epsilon_{zz} e_{14} \sin \alpha \cos \alpha \sin^2 \beta \cos \beta + 2\epsilon_{yz} e_{14} (\cos^2 \alpha - \sin^2 \alpha) \sin \beta \cos \beta + 2\epsilon_{xz} e_{14} \sin \alpha \cos \alpha \sin \beta (2 \cos^2 \beta - \sin^2 \beta) + 2\epsilon_{xy} e_{14} (\cos^2 \alpha - \sin^2 \alpha) - (\cos^2 \beta - \sin^2 \beta) \quad (2)$$

In a case where the angle $\alpha$ is 0° or 90° or a case where the angle $\beta$ is 0° or 90°, for example, in the crystal having a zinc-blende structure from the foregoing equation (2), the polarization $P_Z$ along the z-axis is zero. Consequently, no potential gradient is generated in the direction perpendicular to the interface in a principal-plane direction expressed by a general formula (0MN) (M and N are arbitrary numbers excluding M=N=0) and a principal-plane direction equivalent thereto, while a potential gradient is generated in the direction perpendicular to the interface in the other principal-plane directions.

The piezoelectric stress coefficients are described in LANDOLT-BORNSTEIN Numeral Data and Functional Relationships in Science and Technology New Series Group III; Crystal and Solid State Physics Vol. 17, Edited by O. Madelung, springer-Verlag Berlin-Heidelberg 1982.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting device comprising:
   a first n-type layer;
   a first p-type layer;
   a light emitting layer arranged so as to be interposed between said first n-type layer and said first p-type layer and having a strain generating a piezoelectric effect; and
   a second n-type layer provided between at least said light emitting layer and said first p-type layer and having a wider bandgap than that of said light emitting layer, wherein
   a material composing said light emitting layer includes GaInN having a wurtzite structure, and
   a principal plane of said light emitting layer is approximately perpendicular to a <0001> direction.

2. The light emitting device according to claim 1, wherein said first p-type layer comprises a first cladding layer, and the bandgap of said second n-type layer is narrower than that of said first cladding layer.

3. The light emitting device according to claim 1, wherein said strain generating a piezoelectric effect includes a strain for compressing said light emitting layer in an in-plane direction of said light emitting layer.

4. The light emitting device according to claim 1, wherein said light emitting layer has a quantum well structure comprising one or more well layers having a strain generating a piezoelectric effect and two or more barrier layers arranged so as to interpose said well layer therebetween.

5. The light emitting device according to claim 4, wherein acceptor levels and/or donor levels are nonuniformly formed in the light emitting layer having said quantum well structure in order to decrease a potential gradient generated by the piezoelectric effect in the direction of confinement in said quantum well structure.

6. The light emitting device according to claim 5, wherein both the acceptor levels and the donor levels are formed in the light emitting layer having said quantum well structure.

7. The light emitting device according to claim 6, wherein the concentration of said acceptor levels and the concentration of said donor levels are approximately equal to each other.

8. The light emitting device according to claim 1, wherein said second n-type layer is an optical guide layer.

9. The light emitting device according to claim 1, wherein said light emitting layer is in contact with said second n-type layer.

10. The light emitting device according to claim 4, wherein a barrier layer on the side of said first p-type layer is in contact with said second n-type layer.

* * * * *

UNITED STATES PATENT AND TRADEMARK OFFICE
CERTIFICATE OF CORRECTION

PATENT NO.        : 7,244,964 B2
APPLICATION NO.   : 10/923830
DATED             : July 17, 2007
INVENTOR(S)       : Masayuki Hata It is certified that error appears in the above-identified patent and that said Letters Patent is hereby corrected as shown below:

Title Page,
Item (73) Assignee
Change "Sanyo Electric Company, Ltd., Moriguchi-shi (JP)" to be --Sanyo Electric Co., Ltd., Moriguchi-shi (JP)--

Signed and Sealed this

Twenty-eighth Day of July, 2009

JOHN DOLL
*Acting Director of the United States Patent and Trademark Office*